US 8,654,115 B2

(12) United States Patent
Watanabe

(10) Patent No.: US 8,654,115 B2
(45) Date of Patent: Feb. 18, 2014

(54) SCAN SIGNAL LINE DRIVER CIRCUIT, DISPLAY DEVICE, AND METHOD OF DRIVING SCAN SIGNAL LINES

(75) Inventor: Takuya Watanabe, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/488,843

(22) Filed: Jun. 5, 2012

(65) Prior Publication Data
US 2012/0268441 A1    Oct. 25, 2012

Related U.S. Application Data

(62) Division of application No. 12/451,627, filed as application No. PCT/JP2008/057936 on Apr. 24, 2008.

(30) Foreign Application Priority Data

May 30, 2007   (JP) .................................. 2007-144189
Dec. 5, 2007   (JP) .................................. 2007-315189

(51) Int. Cl.
    *G06F 3/038*      (2013.01)
    *G09G 3/36*      (2006.01)

(52) U.S. Cl.
    USPC ............... 345/213; 345/208; 345/87; 345/94; 345/100

(58) Field of Classification Search
    USPC ............................................ 345/87–104, 208
    See application file for complete search history.

(56) References Cited

U.S. PATENT DOCUMENTS

| 5,248,963 | A | 9/1993 | Yasui et al. |
| 6,831,624 | B1 * | 12/2004 | Harrold ........................... 345/98 |
| 2004/0027323 | A1 | 2/2004 | Tanaka et al. |
| 2006/0071888 | A1 | 4/2006 | Lee et al. |
| 2006/0087478 | A1 | 4/2006 | Eom |

(Continued)

FOREIGN PATENT DOCUMENTS

| JP | 8-202320 | 8/1996 |
| JP | 8-320674 | 12/1996 |

(Continued)

OTHER PUBLICATIONS

Office Action for corresponding U.S. Appl. No. 12/451,627 dated Sep. 19, 2012.

(Continued)

*Primary Examiner* — Kenneth Bukowski
(74) *Attorney, Agent, or Firm* — Harness, Dickey & Pierce, P.L.C.

(57) ABSTRACT

A gate driver includes: a scan signal output circuit for performing alternately scanning whereby either odd-numbered scan signal lines or even-numbered scan signal lines are sequentially driven and scanning whereby the remaining scan signal lines are sequentially driven; a rise counter circuit for sensing the rise count for a clock signal in a HIGH level period of an externally supplied start signal; a scan sequence setup circuit for setting up a scan sequence to be followed by the scan signal output circuit according to the rise count; and a start signal generating circuit for generating a start signal to be supplied to a next scan signal line driver circuit. Hence, the resultant scan signal line driver circuit and method thereof is capable of producing high quality images at low cost while restricting power consumption and heat generation by a data signal line driver circuit.

6 Claims, 52 Drawing Sheets

(56) References Cited

U.S. PATENT DOCUMENTS

| | | |
|---|---|---|
| 2006/0152459 A1 | 7/2006 | Shin |
| 2007/0052658 A1 | 3/2007 | Kim |
| 2007/0063952 A1 | 3/2007 | Oku et al. |
| 2008/0068360 A1 | 3/2008 | Fukuo |

FOREIGN PATENT DOCUMENTS

| | | |
|---|---|---|
| JP | 11-352938 | 12/1999 |
| JP | 2003-099008 | 4/2003 |
| JP | 2004-004857 | 1/2004 |
| JP | 2004-252325 | 9/2004 |
| KR | 10-0155915 | 12/1998 |

OTHER PUBLICATIONS

Office Action for corresponding U.S. Appl. No. 12/451,627 dated Mar. 14, 2013.
Notice of Allowance for corresponding U.S. Appl. No. 12/451,627 dated Jul. 19, 2013.
International Search Report, Jun. 3, 2008.

* cited by examiner

FIG. 15 and in particular to driving methods by which a
SCAN SIGNAL LINE DRIVER CIRCUIT, DISPLAY DEVICE, AND METHOD OF DRIVING SCAN SIGNAL LINES This application is a divisional of application Ser. No. 12/451,627 filed Nov. 23, 2009, which is the National Stage Application of PCT International Application No. PCT/JP2008/057936 filed on Apr. 24, 2008, which claims priority under 35 U.S.C. §119 to Japanese Application Nos. 2007-144189 filed May 30, 2007 and 2007-315189 filed Dec. 5, 2007. The entire contents of all of these applications are incorporated herein by reference.

TECHNICAL FIELD

The present invention relates in general to scan signal line driver circuits, display devices, and methods of driving scan signal lines and in particular to driving methods by which a dot inversion screen is achieved using interlaced driving (interlaced scanning).

BACKGROUND ART

Active matrix liquid crystal panels have been in popular use for some time. An active matrix liquid crystal panel contains two transparent substrates sandwiching a liquid crystal layer. One of the transparent substrates is provided thereon with data signal lines (hereinafter, "data lines") and scan signal lines crossing the data lines. Pixel electrodes, one for each intersection, are arranged to form a matrix. Each pixel electrode is connected to the data line running through the associated intersection via a TFT (thin film transistor) as a switching element. The gate terminal of the TFT is connected to the scan signal line running through that intersection. The other transparent substrate is provided thereon with an opposite electrode (common electrode) which is common to all the pixel electrodes.

The liquid crystal display device incorporating a liquid crystal panel configured as above includes gate drivers and source drivers as driver circuits to produce an image display on the liquid crystal panel. A gate driver, also termed a scan signal line driver circuit, is a driver circuit applying a scan signal to the scan signal lines to sequentially select the scan signal lines. A source driver, also termed a data signal line driver circuit or a video signal line driver circuit, is a driver circuit applying, to the data lines, a data signal by which data is written to pixel forming sections in the liquid crystal panel.

In this configuration, a common voltage Vcom is applied to the common electrode disposed opposite the pixel electrodes. Furthermore, a voltage corresponding to the pixel value assigned to each pixel electrode is applied between the pixel electrode and the opposite electrode. The liquid crystal layer changes its transmittance depending on the voltage applied, producing an image display on the crystal panel. In this process, the liquid crystal panel is A.C.-driven to prevent degradation of the liquid crystal material constituting the liquid crystal layer, In other words, the source driver outputs the data signal so that the (+)/(−) polarity of the voltage applied between the pixel electrode and the opposite electrode is inverted, for example, every frame.

Generally, in the active matrix liquid crystal panel, the transmittance of the liquid crystal layer is not completely symmetric with (+)/(−) data voltage even if the polarity of the data signal output of the source driver (applied voltage relative to the electric potential of the opposite electrode) is symmetric because of irregularities in the characteristics of the switching elements (e.g., TFTs) in individual pixels. This can be a cause for flickering of the display produced by the liquid crystal panel which is driven by inverting the (+)/(−) polarity of the voltage applied to the liquid crystal from one frame to the next (frame inversion drive scheme).

A driving scheme whereby the (+)/(−) polarity of the applied voltage is inverted for each horizontal scan signal line as well as for each frame is known to offer a solution to the flickering. Another known driving scheme inverts the (+)/(−) polarity of the voltage applied across the liquid crystal layer constituting the pixels for each scan signal line and data line as well as for each frame (dot inversion driving scheme).

FIG. 33 depicts a source driver output (image data) waveform when the display panel is being driven by a dot inversion driving scheme. In FIG. 33, a positive data signal Vpdata which is higher than the common voltage Vcom applied to the common electrode and a negative data signal Vndata which is lower than the common voltage Vcom are output alternately from one line to the next.

Meanwhile, the source driver is provided with numerous output buffers each connected to a data line to drive the load, i.e., the data line and the liquid crystal cell. When the source driver outputs the positive data signal Vpdata, the load charges through a current under a high potential voltage VDD; when the source driver outputs the negative data signal Vndata, the load discharges through a current under a low potential voltage VSS. The charge and discharge currents pass through the internal resistors of the output buffers in the source driver, increasing heat generation.

The heat generation inside the source driver occurs primarily in the output buffer sections. To lower the heat generation in the source driver, the heat generation in the output buffer sections, especially, at the output sections of the output buffers, should be reduced to a minimum. However, if the data signal voltage is flipped from the positive data voltage Vpdata to the negative data voltage Vndata and vice versa as illustrated in FIG. 33, the heat generation by the internal resistors in the output buffers increases with the difference between the positive data voltage Vpdata and the negative data voltage Vndata. In addition, the increased charge/discharge events result in increased power consumption.

Interlaced scanning (interlaced driving) methods have been proposed (for example, patent literature 1) as a prevention of the increase in power consumption. According to the interlaced scanning disclosed in patent literature 1, the scan signal lines for all the odd-numbered rows (or all the even-numbered rows) are first scanned, and those for the remaining even-numbered rows (or the remaining odd-numbered rows) are subsequently scanned.

FIG. 34 depicts a source driver output waveform for interlaced scanning. The polarity inverts when the scanning switches from the odd-numbered lines to the even-numbered lines because of the sequential scanning of the rows of pixels to which voltage of the same polarity is applied.

FIG. 35 depicts a source driver output waveform for interlaced driving when scanning is completed for one frame, that is, when scanning is completed for both the odd-numbered rows and the even-numbered rows. The source driver output waveform is similar to the one shown in FIG. 33 which was obtained by a dot inversion driving scheme. As can be appreciated from this, interlaced driving provides a means of inverting the polarity for each scan line and at the same time restricting polarity inversions, which in turn reduces charge/discharge events and restrains increase in power consumption.

Interlaced driving across the full screen of the liquid crystal panel as in patent literature 1 leads to flickering. To address this problem, driving methods have been proposed whereby the display section is divided into a plurality of regions in the column direction and interlaced scanning is carried out for each region (for example, patent literature 2).

FIG. 36 depicts a scan sequence disclosed in patent literature 2. The display section has eight lines of pixel electrodes and divides into regions 1 and 2. Interlaced driving is carried out for each region sequentially from two odd-numbered lines to two even-numbered lines. Data signals of different polarities are applied during the selection periods of regions 1 and 2. This restricts flickering.

The configuration of patent literature 2, however, entails problematic fine horizontal stripes, failing to deliver high quality images. As can be appreciated in FIG. 36, the fourth and fifth lines that are adjacent across the interface between regions 1 and 2 are contiguously scanned. Therefore, the potential difference between the data signal and the common voltage decreases due to the effect of coupling capacitance between the pixel electrodes as described in patent literature 3, making the fourth and fifth lines appear less intense than the other lines as illustrated in FIG. 37. The less intense, adjacent lines cause horizontal stripes to appear, degrading image quality.

Accordingly, patent literature 3 proposes an interlaced driving method whereby gate drivers are scanned in a reverse sequence. The following will describe the configuration disclosed in patent literature 3 in reference to FIGS. 38 to 40.

FIG. 38 depicts a configuration of a liquid crystal panel 101 and gate drivers 102 on which the driving method of patent literature 3 is implemented. The liquid crystal panel 101 includes 36 scan signal lines 1 to 36 and connects to two gate drivers 102.

FIG. 39 is a schematic illustration of the gate driver 102. The gate driver 102 has 18 output terminals O1 to O18 for scan signal outputs. The gate driver 102 also has four terminals SP1, SP2, CLK, and OS. The terminal CLK is an input terminal for an operating clock. The terminal SP1 is an input terminal for a start signal SP. As a HIGH pulse is received at the terminal SP1, the gate driver 102 outputs a scan signal in synchronism with the operating clock CLK received at the terminal CLK. The terminal SP2 is an output terminal for the start signal SP. The terminal SP2 of a gate driver 102 is cascaded to the terminal SP1 of the succeeding-stage gate driver 102 as illustrated in FIG. 38.

The terminal OS is a function switching terminal for the gate driver 102. When the input signal at the terminal OS is HIGH, the scan signal is output first from odd-numbered output terminals (O1, O3, O5, . . . , and O17) and subsequently from even-numbered output terminals (O2, O4, O6, . . . , and O18). When the input signal at the terminal OS is LOW, the scan signal is output first from even-numbered output terminals (O2, O4, O6, . . . , and O18) and subsequently from odd-numbered output terminals (O1, O3, O5, . . . , and O17).

The liquid crystal panel 101 connects to two gate drivers 102 as illustrated in FIG. 38. For convenience, the gate driver 102 in the preceding stage will be referred to as the gate driver 102a, and the one in the succeeding stage as the gate driver 102b. The output terminals O1 to O18 of the gate driver 102a are connected respectively to the scan signal lines 1 to 18 of the liquid crystal panel 101. The output terminals O1 to O18 of the gate driver 102b are connected to respectively to the scan signal lines 19 to 36 of the liquid crystal panel 101. The terminal SP1 of the gate driver 102a receives the incoming start signal SP from a controller (not shown). The terminal SP2 of the gate driver 102a is connected to the terminal SP1 of the gate driver 102b. The controller (not shown) supplies the operating clock CLK at the terminals CLK of the gate drivers 102a and 102b. The input at the terminal OS of the gate driver 102a is fixed to HIGH, whilst the input at the terminal OS of the gate driver 102a is fixed to LOW.

FIG. 40 depicts scan signal outputs (driving waveforms) from the gate drivers 102a and 102b.

As the start signal SP is supplied at the terminal SP1 of the gate driver 102a, the gate driver 102a detects a HIGH input at the terminal SP1 and starts driving the scan signal lines on a rise of the operating clock CLK being supplied at the terminal CLK. Since the input at the terminal OS of the gate driver 102a is HIGH, the output terminal O1 first goes HIGH. On a next rise of the operating clock CLK, the output terminal O1 goes LOW, and at the same time the output terminal O3 goes HIGH. In this manner, the odd-numbered output terminals O1, O3, . . . , and O17 sequentially output a HIGH pulse.

Next, the output terminal O2 goes HIGH. On a next rise of the operating clock CLK, the output terminal O2 goes LOW, and at the same time the output terminal O4 goes HIGH. In this manner, the even-numbered output terminals O2, O4, . . . , and O18 sequentially output a HIGH pulse. In addition, when the output terminal O18 goes HIGH, the terminal SP2 goes HIGH.

The terminal SP2 of the gate driver 102a is connected to the terminal SP1 of the gate driver 102b. Therefore, when the terminal SP2 of the gate driver 102a goes HIGH, the terminal SP1 of the gate driver 102b goes HIGH. Accordingly, the gate driver 102b starts driving the scan signal lines on a next rise of the operating clock CLK.

Since the input at the output terminal OS of the gate driver 102b is LOW, the output terminal O2 first goes HIGH unlike the operation of the gate driver 102a. On a next rise of the operating clock CLK, the output terminal O2 goes LOW, and at the same time the output terminal O4 goes HIGH. In this manner, the even-numbered output terminals O2, O4, . . . , and O18 sequentially output a HIGH pulse.

Next, the output terminal O1 goes HIGH. On a next rise of the operating clock CLK, the output terminal O1 goes LOW, and at the same time the output terminal O3 goes HIGH. In this manner, the odd-numbered output terminals O1, O3, . . . , and O17 output a HIGH pulse. Simultaneously, the terminal SP2 also goes HIGH.

Hence, the configuration can implement the driving method whereby the gate driver 102a carries out interlaced driving on the scan signal lines 1 to 18 of the liquid crystal panel 101 shown in FIG. 38 by first scanning the odd-numbered lines and subsequently scanning the even-numbered lines, and the gate driver 102b carries out interlaced driving on the scan signal lines 19 to 36 by first scanning the even-numbered lines and subsequently scanning the odd-numbered lines. By following the reverse interlaced driving scan sequences in the gate drivers 102a and 102b in this manner, the image quality degradation which occurs in the configuration disclosed in patent literatures 1 and 2 can be prevented as described in patent literature 3.

Another problem is that if the power supply for the liquid crystal panel is turned off when the pixel capacitance of a TFT is holding electric charge, the charge may be held and produce an afterimage on the display screen for an extended period of time, degrading display quality. Patent literature 4, as an example, proposes a solution to the problem whereby the afterimage is erased in a short period of time by holding the outputs of scan signal line driver circuits simultaneously at an active level for a predetermined period of time when the power supply is turned off.

CITATION LIST

Patent Literature 1
Japanese Patent Application Publication, Tokukaihei, No. 8-320674 (Publication Date: Dec. 3, 1996)
Patent Literature 2
Japanese Patent Application Publication, Tokukaihei, No. 11-352938 (Publication Date: Dec. 24, 1999)
Patent Literature 3
Japanese Patent Application Publication, Tokukai, No. 2004-4857 (Publication Date: Jan. 8, 2004)
Patent Literature 4
Japanese Patent Publication, No. 2655328 (Registration Date: May 30, 1997)

SUMMARY OF INVENTION

However, the configuration of patent literature 3 requires the switching terminals OS to set up an interlaced driving scan sequence. The requirement results in increased wiring and cost.

Specifically, the substrate carrying the devices must include more wiring to accommodate an increased number of gate driver terminals. The substrate also needs control circuits for the input signals, which adds to the substrate size. In addition, the configuration shown in FIG. 38 includes two gate drivers so that the input signal at the switching terminals OS is 1 bit; if three or four gate drivers are cascaded, the input signal needs to be 2 bits, and each gate driver needs to have two switching terminals OS. The increase in the number of gate drivers thus leads to increase of other wiring, resulting in further additional cost.

The wiring may not necessarily increased if the setup terminal of the driver chip is switched on the gate driver package. This scheme, however, involves laborious mounting because the gate drivers need to be mounted on the liquid crystal panel in a different package. The scheme also requires additional cost to manufacture the gate drivers because different types of packages must be prepared.

In patent literature 4, the scan signal line driver circuit has a function of simultaneously driving all the scan signal lines. Also, to inform the scan signal line driver circuit of when to drive all the scan signal lines, an erase signal is generated and supplied to the scan signal line driver circuit immediately upon detection of turnoff of the power supply. The scan signal line driver circuit needs to be provided with a terminal at which the timing-informing erase signal is supplied as above. Results are increased inputs on the scan signal line driver circuit and increased wiring for transmission of the erase signal.

The present invention, conceived in view of these problems, has an objective of providing scan signal line driver circuits, as well as a method of driving a display device, capable of producing high quality images at low cost while restricting power consumption and heat generation in data signal line driver circuits.

The present invention has another objective of providing scan signal line driver circuits, as well as a method of driving a display device, capable of erasing the afterimage in a short period of time when the power supply is turned off, so as to maintain display quality at low cost.

A scan signal line driver circuit in accordance with the present invention, to address the problems, is characterized in that it is a scan signal line driver circuit cascaded to another scan signal line driver circuit, the scan signal line driver circuit driving scan signal lines of a display screen according to an externally supplied start signal and an externally supplied clock signal, the scan signal line driver circuit including: a scan signal output circuit for performing alternately scanning whereby either odd-numbered scan signal lines or even-numbered scan signal lines are sequentially driven and scanning whereby the remaining scan signal lines are sequentially driven; a clock pulse counter circuit for sensing, as a first count, either a rise count or a fall count for the clock signal in a HIGH level period of the externally supplied start signal; a scan sequence setup circuit for setting up a scan sequence to be followed by the scan signal output circuit according to the first count; and a start signal generating circuit for generating a start signal to be supplied to a next scan signal line driver circuit, wherein: a second count which is either the rise count or the fall count for the clock signal in a HIGH level period of the start signal generated by the start signal generating circuit differs from the first count; and when the next scan signal line driver circuit takes over driving of scan signal lines, a scan signal line driven immediately before the takeover is not adjacent to a scan signal line driven immediately after the takeover.

According to the configuration, the next scan signal line driver circuit starts scanning by the start signal generating circuit generating and outputting a start signal to the next scan signal line driver circuit. Therefore, the cascaded scan signal line driver circuits start driving the scan signal lines in the order of the cascading. The scan signal output circuit performs interlaced driving by alternately implementing the scanning whereby either the odd-numbered scan signal lines or the even-numbered scan signal lines are sequentially driven and the scanning whereby the remaining scan signal lines are sequentially driven. Hence, polarity inversions are reduced, and power consumption and heat generation by the data signal line driver circuit is restricted. In addition, when the next scan signal line driver circuit takes over driving of scan signal lines, the scan signal line driven immediately before the takeover is not adjacent to the scan signal line driven immediately after the takeover. Therefore, no fine horizontal stripes occur, and high quality images are produced.

The clock pulse counter circuit senses, as the first count, either the rise count or the fall count for the clock signal in a HIGH level period of the externally supplied start signal. The scan sequence setup circuit sets up a scan sequence for the scan signal output circuits according to the first count. In addition, the second count, or either the rise count or the fall count for the clock signal in a HIGH level period of the start signal, differs from the first count. Therefore, the scan sequence for a scan signal line driver circuit can be made different from the scan sequence for the next scan signal line driver circuit. There is no need to provide a switching terminal for switching operation as in conventional scan signal line driver circuits. The scan signal line driver circuit in accordance with the present invention thus requires less wiring, etc. and can be manufactured at limited cost.

Furthermore, the scan signal line driver circuit performs more than operation according to the first count. Therefore, the scan signal line driver circuits can perform different operations when the scan signal line driver circuits are cascaded. Since the scan signal line driver circuits incorporate the same circuit configuration, high volume production of the integrated circuits further reduces cost.

As detailed above, by adjusting either the rise count or the fall count for the clock signal in a HIGH level period of the externally supplied start signal, the scan sequence corresponding to either the rise count or the fall count, and either the rise count or the fall count for the clock signal in a HIGH level period of the start signal output to the succeeding stage, the interlaced driving is performed in such a manner that no adjacent operation signal lines are successively driven. The configuration is beneficial in that it achieves a scan signal line driver circuit capable of producing high quality images at low cost while restricting the power consumption and heat generation by the data signal line driver circuit.

In the scan signal line driver circuit in accordance with the present invention, the first count may be either the rise count or the fall count for the clock signal in a LOW level period of the externally supplied start signal; and the second count may be either the rise count or the fall count for the clock signal in a LOW level period of the start signal generated by the start signal generating circuit.

According to the configuration, the clock pulse counter circuit senses either the rise count or the fall count for the clock signal in a LOW level period of the externally supplied start signal. In other words, the scanning by the scan signal line driver circuit is triggered by a HIGH-to-LOW change of the start signal.

In the scan signal line driver circuit in accordance with the present invention, preferably, the scan signal output circuit performs interlaced scanning whereby either odd-numbered scan signal lines or even-numbered scan signal lines connected to the scan signal line driver circuit are all sequentially driven and subsequently the remaining scan signal lines are all sequentially driven; and the scan sequence setup circuit sets up, according to the first count, whether the scan signal output circuit first drives the odd-numbered scan signal lines or the even-numbered scan signal lines.

According to the configuration, the scan sequence setup circuit sets up, according to the first count, a scan sequence according to which either the odd-numbered scan signal lines or the even-numbered scan signal lines are first scanned. As described above, by setting up the second count so that the scan sequence determined according to the first count differs from the scan sequence determined according to the second count, different scan sequences can be set up for a scan signal line driver circuit and the next scan signal line driver circuit.

Accordingly, the scan sequence for a scan signal line driver circuit can be made different from the scan sequence for the next scan signal line driver circuit without having to provide the scan signal line driver circuit with a switching terminal for switching operation. High quality images are hence produced at low cost.

In the scan signal line driver circuit in accordance with the present invention, preferably, the scan sequence setup circuit sets up, according to whether the first count is an odd number or an even number, whether the scan signal output circuit first drives the odd-numbered scan signal lines or the even-numbered scan signal lines; if the first count is an odd number, the second count is an even number; and if the first count is an even number, the second count is an odd number.

According to the configuration, the scan sequence setup circuit sets up so that either the odd-numbered scan signal lines or the even-numbered scan signal lines are first scanned if the first count is an odd number and the other scan signal lines are first scanned if the first count is an even number. If the first count is an odd number, the second count is an even number; if the first count is an even number, the second count is an odd number. Therefore, the scan sequence according to which either the odd-numbered scan signal lines or the even-numbered scan signal lines are first scanned can be made different for a scan signal line driver circuit and for the next scan signal line driver circuit. Accordingly, high quality images are produced at low cost.

In the scan signal line driver circuit in accordance with the present invention, preferably, N=M+1 where M is the first count, and N is the second count.

According to the configuration, the first count is greater than the second count by 1. If the first count is an even number, the second count is an even number; if the first count is an even number, the second count is an odd number. Therefore, the scan sequence according to which either the odd-numbered scan signal lines or the even-numbered scan signal lines are first scanned can be made different for a scan signal line driver circuit and for the next scan signal line driver circuit. High quality images are hence produced at low cost.

In the scan signal line driver circuit in accordance with the present invention, preferably, letting Mmax be a maximum of the first count detectable by the clock pulse counter circuit, if the first count is equal to Mmax, the start signal generating circuit outputs no start signal to the next scan signal line driver circuit.

According to the configuration, even if the start signal generating circuit has output, to the next scan signal line driver circuit, a start signal in either a HIGH level period or a LOW level period of which the clock signal either rises or falls Mmax+1 times, the clock pulse counter circuit cannot sense the count Mmax+1, and desired operation cannot be performed. Therefore, even if a scan signal line driver circuit has been connected by error to a succeeding stage of the scan signal line driver circuit to which a start signal with the first count of Mmax is input, the next scan signal line driver circuit can be prevented from performing undesirable operation.

In the scan signal line driver circuit in accordance with the present invention, preferably, letting Mmax be a maximum of the first count detectable by the clock pulse counter circuit, if the clock pulse counter circuit senses the rise count for the clock signal, a scan sequence setup period which lasts from a first rise of the clock signal in a HIGH level period of the externally supplied start signal to a start of scanning is equal to a clock cycle of the clock signal times Mmax; and if the clock pulse counter circuit senses the fall count for the clock signal, a scan sequence setup period which lasts from a first fall of the clock signal in a HIGH level period of the externally supplied start signal to a start of scanning is equal to a clock cycle of the clock signal times Mmax.

In the scan signal line driver circuit in accordance with the present invention, preferably, letting Mmax be a maximum of the first count detectable by the clock pulse counter circuit, if the clock pulse counter circuit senses the rise count for the clock signal, a scan sequence setup period which lasts from a first rise of the clock signal in a LOW level period of the externally supplied start signal to a start of scanning is equal to a clock cycle of the clock signal times Mmax; and if the clock pulse counter circuit senses the fall count for the clock signal, a scan sequence setup period which lasts from a first fall of the clock signal in a LOW level period of the externally supplied start signal to a start of scanning is equal to a clock cycle of the clock signal times Mmax.

According to the configuration, if a start signal with the first count of Mmax has been input, scanning can be started on a rise or fall, of the clock signal, which follows the Mmax-th rise or fall in a HIGH level period or a LOW level period. Therefore, the start-signal-acquiring period can be made minimum.

In the scan signal line driver circuit in accordance with the present invention, preferably, the start signal generating circuit outputs the start signal to the next scan signal line driver circuit earlier than a termination of scanning by the scan signal line driver circuit containing the start signal generating circuit by as much as the scan sequence setup period.

According to the configuration, simultaneously with the termination of the scanning by a scan signal line driver circuit, the next scan signal line driver circuit starts scanning. Driving according to the data signal is therefore easier.

Preferably, the scan signal line driver circuit in accordance with the present invention further includes a delay circuit for driving some of scan signal lines connected thereto and subsequently temporarily discontinuing the driving, wherein: if a scan signal line driven immediately before the discontinuation is odd-numbered, the next or a previous scan signal line driver circuit drives the odd-numbered scan signal lines from the discontinuation to a restart of the discontinued driving, and a scan signal line driven first after the restart of the driving is even-numbered; and if a scan signal line driven immediately before the discontinuation is even-numbered, the next or a previous scan signal line driver circuit drives the even-numbered scan signal lines from the discontinuation to a restart of the discontinued driving, and a scan signal line driven first after the restart of the driving is odd-numbered.

According to the configuration, while the scan signal line driver circuit is temporarily discontinuing the driving, the next or previous scan signal line driver circuit performs driving. Then, the scan signal line driver circuit discontinuing the driving restarts the driving. If the scan signal line driven immediately before the discontinuation is odd-numbered (even-numbered), the next or previous scan signal line driver circuit drives the odd-numbered scan signal lines (the even-numbered scan signal lines) from the discontinuation to the restart of the driving. Therefore, interlaced driving is continued when the next or previous scan signal line driver circuit takes over scanning. In other words, the plural scan signal line driver circuits can perform interlaced driving. Therefore, the number of screen divisions for the interlaced driving can be made different from the number of scan signal line driver circuits mounted. For example, image quality is improved by setting the number of screen divisions greater than the number of scan signal line driver circuits, Power consumption is restricted by setting the number of screen divisions less than the number of scan signal line driver circuits.

A display device in accordance with the present invention includes the scan signal line driver circuit.

According to the configuration, the resultant display device produces high quality images at low cost while restricting power consumption and heat generation by the data signal line driver circuit.

A method of driving a display device in accordance with the present invention is characterized in that it is a method of driving a display device including cascaded scan signal line driver circuits, the method including: the rise counting step of sensing, as a first count, either a rise count or a fall count for a clock signal supplied to one of the scan signal line driver circuits in a HIGH level period of a start signal supplied to that scan signal line driver circuit; the scan signal line driving step of performing alternately scanning whereby either odd-numbered scan signal lines or even-numbered scan signal lines of a display screen are sequentially driven and scanning whereby the remaining scan signal lines are sequentially driven; the scan sequence setup step of, prior to the scan signal line driving step, setting up a scan sequence to be followed in the scan signal line driving step according to the first count; and the start signal supply step of supplying a start signal to a next one of the scan signal line driver circuits, wherein: a second count which is either the rise count or the fall count for the clock signal in a HIGH level period of the start signal supplied in the start signal supply step differs from the first count; and when the next one of the scan signal line driver circuits takes over driving of scan signal lines, a scan signal line driven immediately before the takeover is not adjacent to a scan signal line driven immediately after the takeover.

According to the configuration, in the start signal generating step, the next scan signal line driver circuit starts scanning by receiving a generated start signal. Therefore, the cascaded scan signal line driver circuits start driving the scan signal lines in the order of the cascading. The scan signal line driving step performs interlaced driving by alternately implementing the scanning whereby either the odd-numbered scan signal lines or the even-numbered scan signal lines are sequentially driven and the scanning whereby the remaining scan signal lines are sequentially driven. Hence, polarity inversions are reduced, and power consumption and heat generation by the data signal line driver circuit is restricted. In addition, when the next scan signal line driver circuit takes over driving of scan signal lines, the scan signal line driven immediately before the takeover is not adjacent to the scan signal line driven immediately after the takeover. Therefore, no fine horizontal stripes occur, and high quality images are produced.

The scan sequence setup step sets up a scan sequence of the scan signal lines for the scan signal line driving step according to the first count which is either the rise count or the fall count for the clock signal in a HIGH level period of the start signal supplied to the scan signal line driver circuit. In addition, the second count, or either the rise count or the fall count for the clock signal in a HIGH level period of the start signal, differs from the first count. Therefore, the scan sequence for a scan signal line driver circuit can be made different from the scan sequence for the next scan signal line driver circuit. There is no need to provide a switching terminal for switching operation in the scan signal line driver circuit as in conventional configurations. The method of driving a display device in accordance with the present invention thus requires less wiring, etc., and the scan signal line driver circuit can be manufactured at limited cost.

As detailed above, by adjusting either the rise count or the fall count for the clock signal in a HIGH level period of the externally supplied start signal, the scan sequence corresponding to either the rise count or the fall count, and either the rise count or the fall count for the clock signal in a HIGH level period of the start signal output to the succeeding stage, the interlaced driving is performed in such a manner that no adjacent operation signal lines are successively driven. The configuration is beneficial in that it achieves a method of driving a display device capable of producing high quality images at low cost while restricting the power consumption and heat generation by the data signal line driver circuit.

In the method of driving in accordance with the present invention, the first count may be either the rise count or the fall count for the clock signal supplied to the scan signal line driver circuit in a LOW level period of the start signal supplied to the scan signal line driver circuit; and the second count may be either the rise count or the fall count for the clock signal in a LOW level period of the start signal supplied in the start signal supply step.

According to the configuration, the clock pulse counter circuit senses either the rise count or the fall count for the clock signal in a LOW level period of the externally supplied start signal. In other words, the scanning by the scan signal line driver circuit is triggered by a HIGH-to-LOW change of the start signal.

In the method of driving in accordance with the present invention, preferably, the scan signal line driving step performs interlaced scanning whereby either odd-numbered scan signal lines or even-numbered scan signal lines connected to the operation signal line driver circuit are sequentially driven and subsequently the remaining scan signal lines are sequentially driven; and the scan sequence setup step decides, according to the rise count M, a scan sequence according to which either the odd-numbered scan signal lines or the even-numbered scan signal lines are first driven.

According to the configuration, a scan sequence according to which either the odd-numbered scan signal lines or the even-numbered scan signal lines are first scanned is set up according to the first count. By setting up the second count so that the scan sequence determined according to the first count differs from the scan sequence determined according to the second count, different scan sequences can be set up for a scan signal line driver circuit and the next scan signal line driver circuit.

Accordingly, the scan sequence for a scan signal line driver circuit can be made different from the scan sequence for the next scan signal line driver circuit without having to provide the scan signal line driver circuit with a switching terminal for switching operation. High quality images are hence produced at low cost.

In the method of driving in accordance with the present invention, preferably, the scan sequence is decided according to whether the first count is an odd number or an even number; if the first count is an odd number, the second count is an even number; and if the first count is an even number, the second count is an odd number.

According to the configuration, if the first count is an odd number, the second count is an even number; and if the first count is an even number, the second count is an odd number. Therefore, the scan sequence according to which either the odd-numbered scan signal lines or the even-numbered scan signal lines are first scanned can be made different for a scan signal line driver circuit and for the next scan signal line driver circuit. Accordingly, high quality images are produced at low cost.

In the method of driving in accordance with the present invention, preferably, N=M+1 where M is the first count, and N is the second count.

According to the configuration, the first count is greater than the second count by 1. If the first count is an even number, the second count is an even number; if the first count is an even number, the second count is an odd number. Therefore, the scan sequence according to which either the odd-numbered scan signal lines or the even-numbered scan signal lines are first scanned can be made different for a scan signal line driver circuit and for the next scan signal line driver circuit. High quality images are hence produced at low cost.

In the method of driving in accordance with the present invention, in the display screen, the number of scan units in which the odd-numbered scan signal lines and the even-numbered scan signal lines are scanned once may be greater than the number of the scan signal line driver circuits.

According to the configuration, the number of screen divisions for the interlaced driving is greater than the number of scan signal line driver circuits. Images are thus produced with less flickering than in a configuration where the number of screen divisions is equal to the number of scan signal line driver circuits. In addition, fewer scan signal line driver circuits are required; the display device can be assembled at limited cost.

In method of driving scan signal lines in accordance with the present invention, in the display screen, the number of scan units in which the odd-numbered scan signal lines and the even-numbered scan signal lines are scanned once may be less than the number of the scan signal line driver circuits.

According to the configuration, the number of screen divisions for the interlaced driving is less than the number of scan signal line driver circuits. Hence, fewer polarity inversions of the data signal are required than in a configuration where the number of screen divisions is equal to the number of scan signal line driver circuits. Therefore, the heat generation and power consumption by the data signal line driver circuit is restricted.

Another scan signal line driver circuit in accordance with the present invention, to address the problems, is characterized in that it is a scan signal line driver circuit driving scan signal lines of a display screen according to an externally supplied start signal and an externally supplied clock signal, the scan signal line driver circuit including: a clock pulse counter circuit for sensing, as a first count, either a rise count or a fall count for the clock signal in a HIGH level period of the externally supplied start signal; and a drive mode selecting circuit for selecting, according to the first count, either a first drive mode in which the scan signal lines are driven in a predetermined sequence or a second drive mode in which the scan signal lines are all simultaneously driven for a predetermined period of time.

According to the configuration, if the drive mode selecting circuit has selected the second drive mode, the scan signal lines are all driven simultaneously. Therefore, the electric charge accumulated in the pixel capacitance in the liquid crystal panel is removed quickly. Therefore, by designing specifications for the start signal produced upon turning off the power supply so as to obtain such a first count that the drive mode selecting circuit can select the second drive mode, the afterimage produced when the power supply is turned off can be quickly erased. Furthermore, the drive mode selecting circuit selects either the first drive mode or the second drive mode according to the first count sensed by the clock pulse counter circuit. There is no need to provide the scan signal line driver circuit with a terminal and wiring to deliver a signal communicating the timing when all the scan signal lines are driven. Therefore, the resultant scan signal line driver circuit can retain display quality at low cost by quickly erasing the afterimage produced when the power supply is turned off.

In the scan signal line driver circuit in accordance with the present invention, preferably, the scan signal line driver circuit is cascaded to another scan signal line driver circuit and further includes a start signal generating circuit for generating a start signal to be supplied to a next scan signal line driver circuit according to the first count; and when the drive mode selecting circuit selects the second drive mode, a second count which is either the rise count or the fall count for the clock signal in a HIGH level period of the start signal generated by the start signal generating circuit is a count according to which the drive mode selecting circuit selects the second drive mode.

According to the configuration, the scan signal line driver circuit is cascaded to another scan signal line driver circuit. If the drive mode selecting circuit selects the second drive mode, the second count is a count according to which the drive mode selecting circuit selects the second drive mode. Therefore, if the drive mode selecting circuit in the scan signal line driver circuit has selected the second drive mode, as the start signal generated by the start signal generating circuit in the scan signal line driver circuit is supplied to the next scan signal line driver circuit, the drive mode selecting circuit in the next scan signal line driver circuit also selects the second drive mode. Accordingly, all the cascaded scan signal line driver circuits select the second drive mode. Therefore, the afterimage produced when the power supply is turned off can be erased quickly and at low cost even when plural scan signal line driver circuits are cascaded.

In the scan signal line driver circuit in accordance with the present invention, preferably, there is further provided a power-on reset circuit for sensing a startup of a power supply and generating a power-on reset signal, wherein: the clock pulse counter circuit includes a counter for counting either the rise count or the fall count for the clock signal; and when the power supply is turned on, the counter is reset in response to the power-on reset signal.

According to the configuration, if the power supply is turned on, the power-on reset circuit generates a power-on reset signal in response to which the counter in the clock pulse counter circuit is reset. Therefore, when the power supply is turned off and subsequently turned on, the counter is prevented from continuously counting starting with the final value obtained upon turning off the power supply in the last use.

A display device in accordance with the present invention includes the scan signal line driver circuit.

According to the configuration, the resultant display device can retain display quality at low cost by quickly erasing the afterimage produced when the power supply is turned off.

Another method of driving in accordance with the present invention, to address the problems, is characterized in that it is a method of driving a display device including a scan signal line driver circuit, the method including: the rise counting step of sensing, as a first count, either a rise count or a fall count for a clock signal supplied to the scan signal line driver circuit in a HIGH level period of a start signal supplied to the scan signal line driver circuit; and the drive mode selecting step of selecting, according to the first count, either a first drive mode in which scan signal lines of a display screen are driven in a predetermined sequence or a second drive mode in which the scan signal lines are all simultaneously driven.

According to the configuration, if the second drive mode has been selected in the drive mode selecting step, the scan signal lines are all simultaneously driven. Therefore, the electric charge accumulated in the pixel capacitance in the liquid crystal panel is removed quickly. Therefore, by designing specifications for the start signal produced upon turning off the power supply so as to obtain such a first count that the second drive mode can be selected in the drive mode selecting step, the afterimage produced when the power supply is turned off can be quickly erased. Furthermore, either the first drive mode or the second drive mode is selected in the drive mode selecting step according to the first count sensed in the clock pulse counter step. There is no need to provide the scan signal line driver circuit with a terminal and wiring to deliver a signal communicating the timing when all the scan signal lines are driven. Therefore, the resultant method of driving a display device can retain display quality at low cost by quickly erasing the afterimage produced when the power supply is turned off.

In the scan signal line driver circuit in accordance with the present invention, preferably, the scan signal line driver circuit is cascaded to another scan signal line driver circuit; the method further includes the start signal generating step of generating a start signal to be supplied to a next scan signal line driver circuit according to the first count; and when the drive mode selecting step selects the second drive mode, a second count which is either the rise count or the fall count for the clock signal in a HIGH level period of the start signal generated in the start signal generating step is a count according to which the drive mode selecting step selects the second drive mode.

According to the configuration, the scan signal line driver circuit is cascaded to another scan signal line driver circuit. If the drive mode selecting step selects the second drive mode, the second count is a count according to which the drive mode selecting step selects the second drive mode. Therefore, if the second drive mode has been selected for the scan signal line driver circuit, as the start signal generated by the scan signal line driver circuit in the start signal generating step is supplied to the next scan signal line driver circuit, the scan signal line driver circuit also selects the second drive mode. Accordingly, all the cascaded scan signal line driver circuits select the second drive mode. Therefore, the afterimage produced when the power supply is turned off can be erased quickly and at low cost even when plural scan signal line driver circuits are cascaded.

A scan signal line driver circuit in accordance with the present invention is, as described in the foregoing, a scan signal line driver circuit cascaded to another scan signal line driver circuit, the scan signal line driver circuit driving scan signal lines of a display screen according to an externally supplied start signal and an externally supplied clock signal, the scan signal line driver circuit including: a scan signal output circuit for performing alternately scanning whereby either odd-numbered scan signal lines or even-numbered scan signal lines are sequentially driven and scanning whereby the remaining scan signal lines are sequentially driven; a clock pulse counter circuit for sensing, as a first count, either a rise count or a fall count for the clock signal in a HIGH level period of the externally supplied start signal; a scan sequence setup circuit for setting up a scan sequence to be followed by the scan signal output circuit according to the first count; and a start signal generating circuit for generating a start signal to be supplied to a next scan signal line driver circuit, wherein: a second count which is either the rise count or the fall count for the clock signal in a HIGH level period of the start signal generated by the start signal generating circuit differs from the first count; and when the next scan signal line driver circuit takes over driving of scan signal lines, a scan signal line driven immediately before the takeover is not adjacent to a scan signal line driven immediately after the takeover.

A method of driving in accordance with the present invention is a method of driving a display device including cascaded scan signal line driver circuits, the method including: the rise counting step of sensing, as a first count, either a rise count or a fall count for a clock signal supplied to one of the scan signal line driver circuits in a HIGH level period of a start signal supplied to that scan signal line driver circuit; the scan signal line driving step of performing alternately scanning whereby either odd-numbered scan signal lines or even-numbered scan signal lines of a display screen are sequentially driven and scanning whereby the remaining scan signal lines are sequentially driven; the scan sequence setup step of, prior to the scan signal line driving step, setting up a scan sequence to be followed in the scan signal line driving step according to the first count; and the start signal supply step of supplying a start signal to a next one of the scan signal line driver circuits, wherein: a second count which is either the rise count or the fall count for the clock signal in a HIGH level period of the start signal supplied in the start signal supply step differs from the first count; and when the next one of the scan signal line driver circuits takes over driving of scan signal lines, a scan signal line driven immediately before the takeover is not adjacent to a scan signal line driven immediately after the takeover.

The configuration is beneficial in that it achieves a scan signal line driver circuit and a method of driving a display device capable of producing high quality images at low cost while restricting the power consumption and heat generation by the data signal line driver circuit.

Another scan signal line driver circuit in accordance with the present invention is, as described in the foregoing, a scan signal line driver circuit driving scan signal lines of a display screen according to an externally supplied start signal and an externally supplied clock signal, the scan signal line driver circuit including: a clock pulse counter circuit for sensing, as a first count, either a rise count or a fall count for the clock signal in a HIGH level period of the externally supplied start signal; and a drive mode selecting circuit for selecting, according to the first count, either a first drive mode in which the scan signal lines are driven in a predetermined sequence or a second drive mode in which the scan signal lines are all simultaneously driven.

Another method of driving in accordance with the present invention is a method of driving a display device including a scan signal line driver circuit, the method including: the rise counting step of sensing, as a first count, either a rise count or a fall count for a clock signal supplied to the scan signal line driver circuit in a HIGH level period of a start signal supplied to the scan signal line driver circuit; and the drive mode selecting step of selecting, according to the first count, either a first drive mode in which scan signal lines of a display screen are driven in a predetermined sequence or a second drive mode in which the scan signal lines are all simultaneously driven.

The configuration is beneficial in that it achieves a scan signal line driver circuit and a method of driving a display device capable of retaining display quality at low cost by quickly erasing the afterimage produced when the power supply is turned off.

Additional objectives, advantages and novel features of the invention will be set forth in part in the description which follows, and in part will become apparent to those skilled in the art upon examination of the following or may be learned by practice of the invention.

BRIEF DESCRIPTION OF DRAWINGS

FIG. 15 is a circuit diagram depicting a specific configuration of a start signal generating circuit in the gate driver.

REFERENCE SIGNS LIST

1 Liquid Crystal Display Device (Display Device)
2 Liquid Crystal Panel (Display Screen)
4, 14, 24, 34 Gate Driver (Scan Signal Line Driver Circuit)
41, 141 Scan Signal Output Circuit
42, 342 Rise Counter Circuit (Clock Pulse Counter Circuit)
43, 143, 243 Scan Sequence Setup Circuit
44, 144, 244, 344 Start Signal Generating Circuit
145, 245 Delay Circuit
346 Power-on Reset Circuit
347 Drive Mode Selecting Circuit
SP Start Signal
CLK Operating Clock (Clock Signal)
GL Scan Signal Line

DESCRIPTION OF EMBODIMENTS

The following will describe embodiments of the semiconductor device in accordance with the present invention in reference to drawings. The description will involve various technically favorable limitations in the implementation of the present invention. The scope of the present invention is nonetheless by no means limited by the embodiments or drawings.

Embodiment 1

An embodiment of the present invention will be described below in reference to FIGS. 1 to 32.

Figure 1:
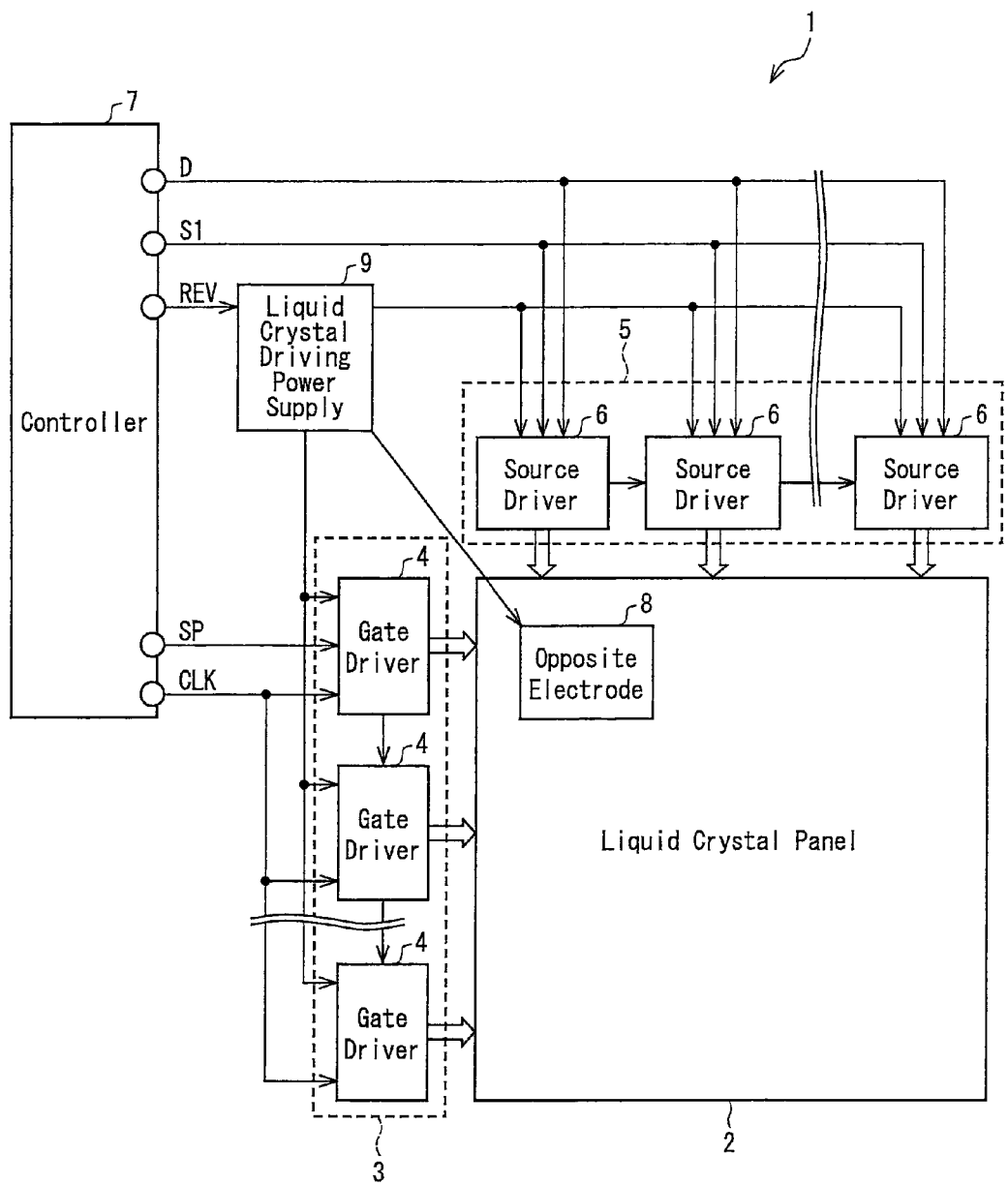
FIG. 1 is a block diagram depicting the configuration of a major part of a liquid crystal display device in accordance with the present invention.

FIG. 1 is a block diagram depicting the configuration of a major part of a liquid crystal display device 1 in accordance with the present embodiment. The liquid crystal display device 1 is a liquid crystal display device of a TFT (thin film transistor) scheme which is a typical example of active matrix schemes. The liquid crystal display device 1 includes a liquid crystal panel 2, a gate driver section 3, a source driver section 5, a controller 7, an opposite electrode 8, and a liquid crystal driving power supply 9.

The opposite electrode 8, disposed inside the liquid crystal panel 2, is made of plural parts mutually coupled to form a single common electrode. The source driver section 5 includes source drivers 6. The gate driver section 3 includes gate drivers 4. The controller 7 outputs display data D and a control signal Si (both being a digital signal) to the source drivers 6. The controller 7 outputs an operating clock CLK to the gate drivers 4 and a start signal SP to the first-stage gate driver 4. The liquid crystal driving power supply 9 generates an external reference voltage for output to the gate driver section 3, the source driver section 5, and the opposite electrode 8.

The gate driver section 3 receives a gate voltage from the liquid crystal driving power supply 9 and outputs a scan signal sequentially scanning the scan signal lines in the liquid crystal panel 2.

In the source driver section 5, the display data D from the controller 7 is time divided and latched by the source drivers 6. Each source driver 6 converts the time-divided display data D from digital to analog to output, to the liquid crystal panel 2, a data signal for grayscale display according to the brightness of a display target pixel.

Figure 2:
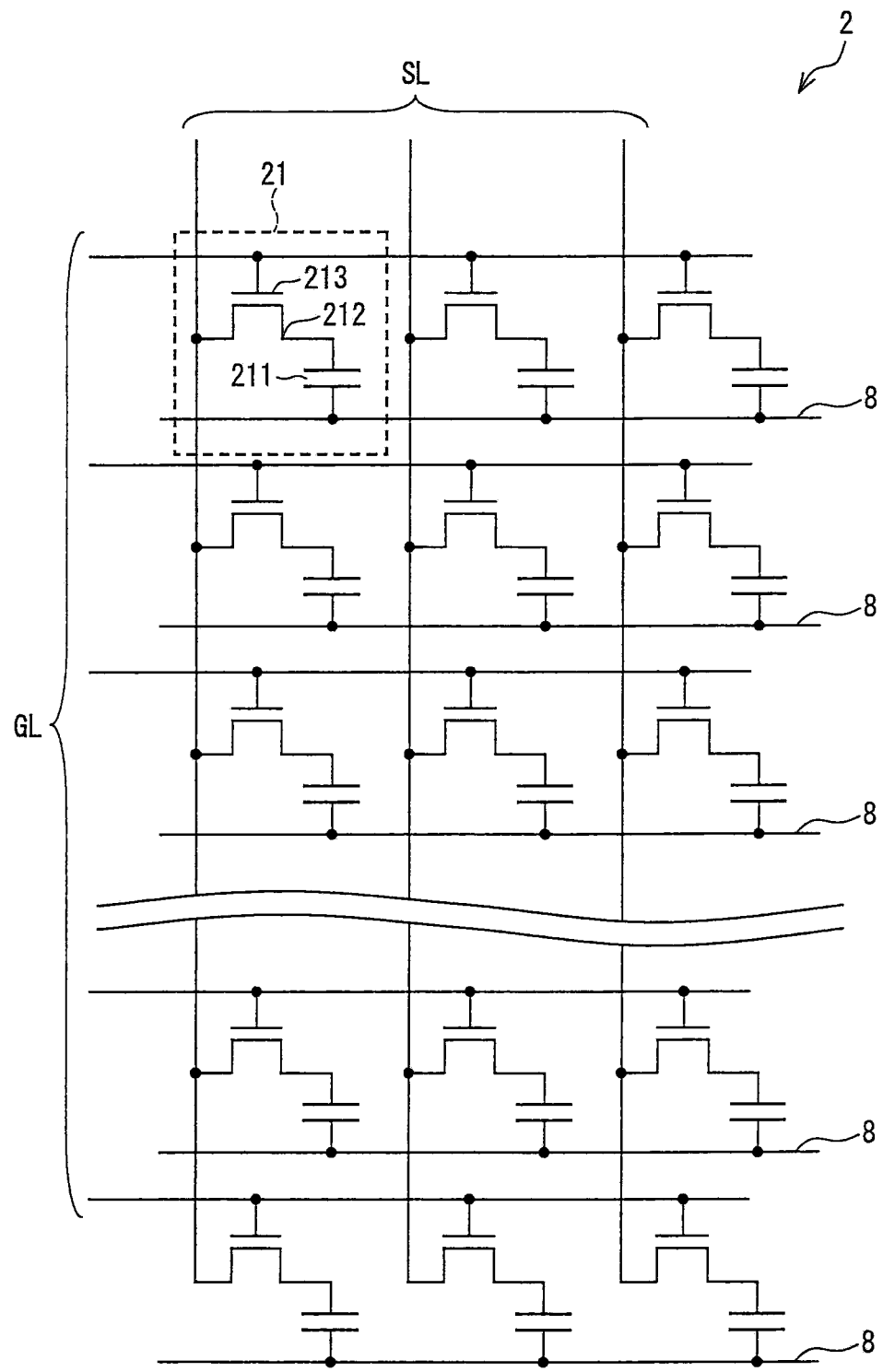
FIG. 2 is a circuit diagram depicting the configuration of a liquid crystal panel incorporated in the liquid crystal display device.

FIG. 2 is a circuit diagram depicting the configuration of the liquid crystal panel 2. The liquid crystal panel 2 includes source signal lines SL, scan signal lines GL, liquid crystal display elements 21, and an opposite electrode 8.

The source signal lines SL run parallel to each other with predetermined spacings between them. The scan signal lines GL run parallel to each other with predetermined spacings between them, crossing the source signal lines SL at right angles.

A single liquid crystal display element 21 is disposed at each intersection of the source signal lines SL and the scan signal lines GL. Each liquid crystal display element 21 includes a pixel capacitance 211, a pixel electrode 212, and a TFT 213. The pixel capacitance 211 is coupled at an end thereof to the pixel electrode 212 and at the other end thereof to the opposite electrode 8. The TFT 213 controls ON/OFF of the voltage application to the pixel electrode 212. The TFT 213 is connected at the source thereof to the associated source signal line SL, at the gate thereof to the associated scan signal line GL, and at the drain thereof to the pixel electrode 212.

The scan signal lines GL are fed with a scan signal from the gate drivers 4 shown in FIG. 1 to sequentially turn on the TFTs 213 arranged in the column direction. Meanwhile, the source signal lines SL are fed with grayscale display voltage from the source drivers shown in FIG. 1. When the TFT 213 is on, the grayscale display voltage from the source signal line SL is applied to the pixel electrode 212, charging the pixel capacitance 211. Accordingly, the liquid crystal changes its optical transmittance according to the grayscale display voltage for pixel display.

Figure 3:
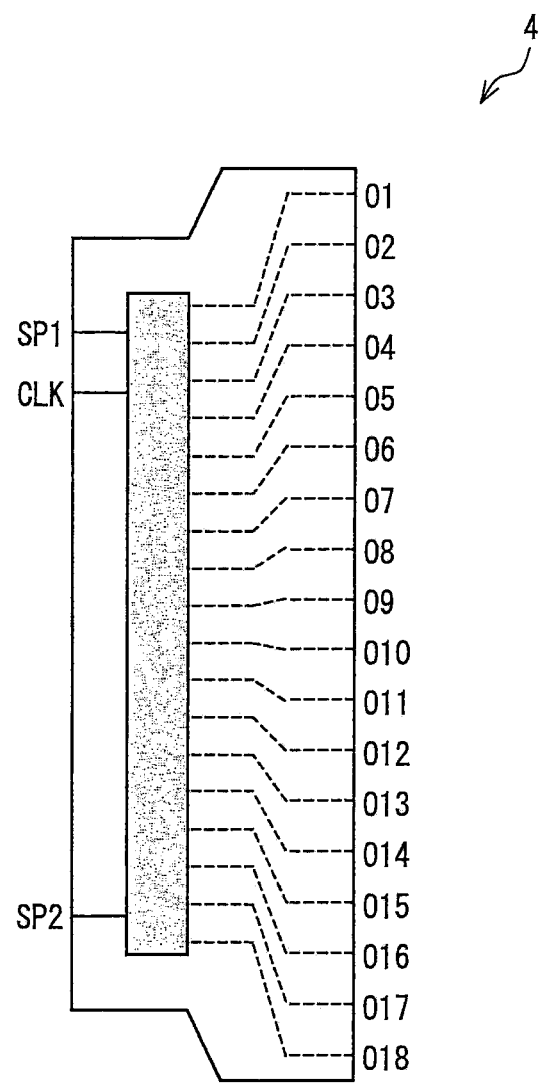
FIG. 3 is a schematic illustration of the configuration of a gate driver mounted to the liquid crystal panel.

FIG. 3 illustrates a gate driver 4. The gate driver 4 outputs a scan signal to the scan signal lines of the liquid crystal panel 2. The gate driver 4, provided with 18 output terminals O1 to O18, is capable of switching between interlaced driving scan sequences similarly to the gate driver 102 shown in FIG. 31(b). The gate driver 4 includes three other terminals SP1, SP2, and CLK. Again similarly to the gate driver 102, the terminal CLK is an input terminal for the operating clock CLK, the terminal SP1 is an input terminal for the start signal SP, and the terminal SP2 is an output terminal for the start signal SP2 transmitted to the cascaded succeeding-stage gate driver 4.

Dissimilar to the gate driver 102, the gate driver 4 includes no switching terminal OS for function switching. In other words, the gate driver 4 needs no switching terminal OS to switch between interlaced driving scan sequences. Scan sequences are switched using HIGH width of the start signal SP fed at the terminal SP1 as will be detailed later.

Figure 4:
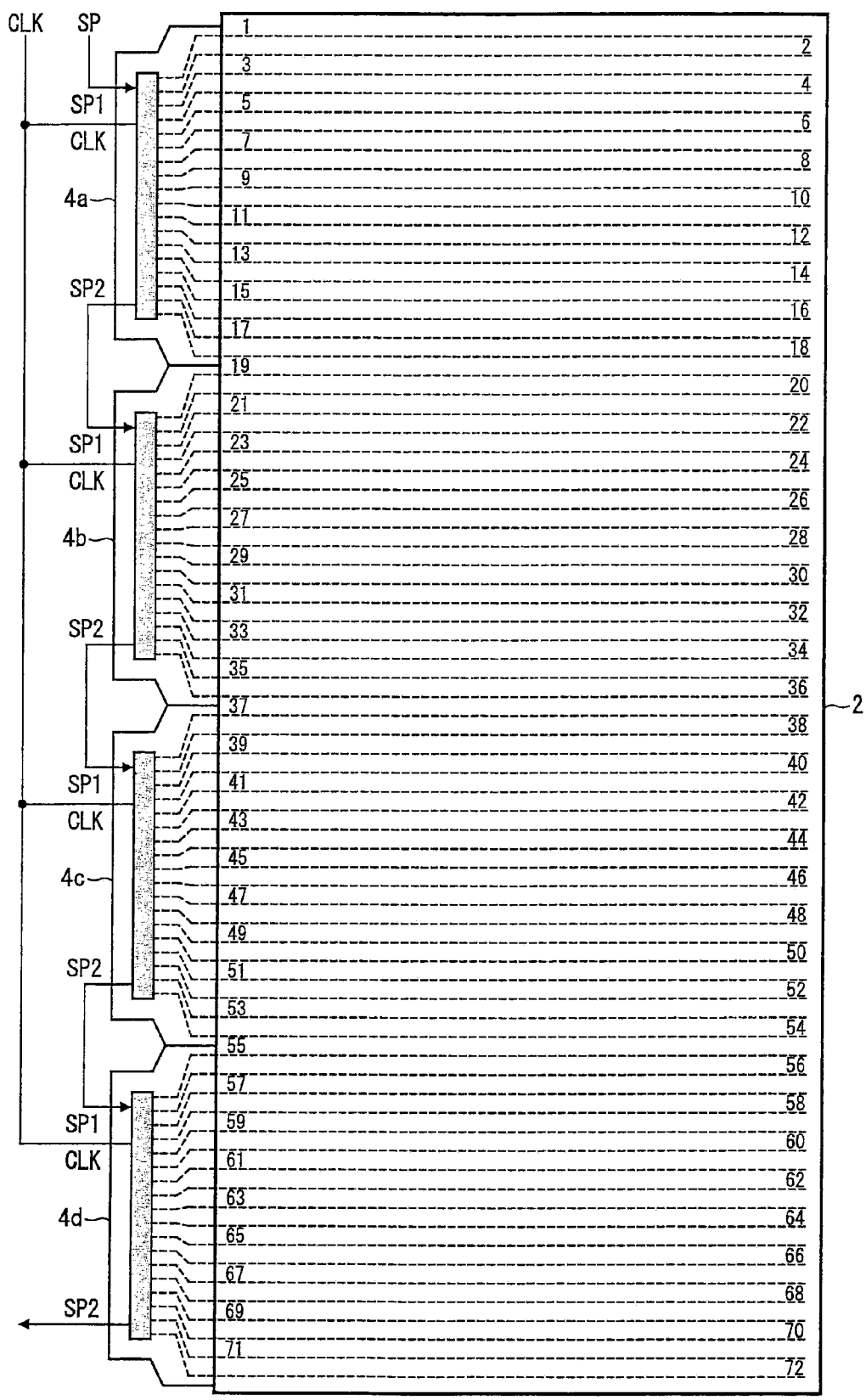
FIG. 4 is a schematic illustration of the gate drivers being mounted to the liquid crystal panel.

FIG. 4 illustrates four gate drivers 4a to 4d being mounted to the liquid crystal panel 2.

The liquid crystal panel 2 has 72 scan signal lines 1 to 72 representing respectively the scan signal lines GL shown in FIG. 2. For convenience, FIG. 4 shows no configuration other than the scan signal lines 1 to 72 with respect to the liquid crystal panel 2.

The gate drivers 4a, 4b, 4c, and 4d are identical to the gate drivers 4, but marked with different reference numbers to indicate their connection sequence. The gate drivers 4a to 4d, constituting the gate driver section 3 shown in FIG. 1, are cascaded in this order. In other words, the terminal SP2 of the gate driver 4a is connected to the terminal SP1 of the gate driver 4b; the terminal SP2 of the gate driver 4b is connected to the terminal SP1 of the gate driver 4c; and the terminal SP2 of the gate driver 4c is connected to the terminal SP1 of the gate driver 4d.

The terminals CLK of the gate drivers 4a, 4b, 4c, and 4d receive the operating clock CLK from the controller 7 shown in FIG. 1. The terminal SP1 of the first-stage gate driver 4a receives the start signal (instruction to start scanning) SP from the controller 7. The output terminals O1 to O18 of the gate driver 4a are connected respectively to the scan signal lines 1 to 18; the output terminals O1 to O18 of the gate driver 4b are connected respectively to the scan signal lines 19 to 36; the output terminals O1 to O18 of the gate driver 4c are connected respectively to the scan signal lines 37 to 54; and the output terminals O1 to O18 of the gate driver 4d are connected respectively to the scan signal lines 55 to 72. The configuration allows the gate drivers 4a, 4b, 4c, and 4d to scan the scan signal lines 1 to 72 of the liquid crystal panel 2.

As mentioned earlier, the gate driver 4 switches between scan sequences by using HIGH width of the start signal SP being fed at the terminal SP1. Specifically, the scan sequence for the gate driver 4 is determined according to the rise count M of the operating clock CLK in a HIGH level period of the start signal SP. If the rise count M is an odd number, the scan signal lines are sequentially scanned starting with the odd-numbered rows followed by the even-numbered rows; if the rise count M is an even number, the scan signal lines are sequentially scanned starting with the even-numbered rows followed by the odd-numbered rows.

The gate driver 4 transmits, from its terminal SP2 to the terminal SP1 of the succeeding-stage gate driver 4, a start signal SP in a HIGH level period of which the operating clock CLK rises M+1 (=N) times. In other words, if the rise count M of the operating clock CLK in a HIGH level period of the start signal SP fed at the terminal SP1 of the preceding-stage gate driver 4 is an odd number, the rise count N of the operating clock CLK in a HIGH level period of the start signal SP fed at the terminal SP1 of the succeeding-stage gate driver 4 is an even number. On the other hand, if the rise count M of the operating clock CLK in a HIGH level period of the start signal SP fed at the terminal SP1 of the preceding-stage gate driver 4 is an even number, the rise count N of the operating clock CLK in a HIGH level period of the start signal SP fed at the terminal SP1 of the succeeding-stage gate driver 4 is an odd number.

Accordingly, if the preceding-stage gate driver 4 sequentially scans the odd-numbered rows and then the even-numbered rows, the succeeding-stage gate driver 4 sequentially scans the even-numbered rows and then the odd-numbered rows. On the other hand, if the preceding-stage gate driver 4 sequentially scans the even-numbered rows and then the odd-numbered rows, the succeeding-stage gate driver 4 sequentially scans the odd-numbered rows and then the even-numbered rows.

Figure 5:
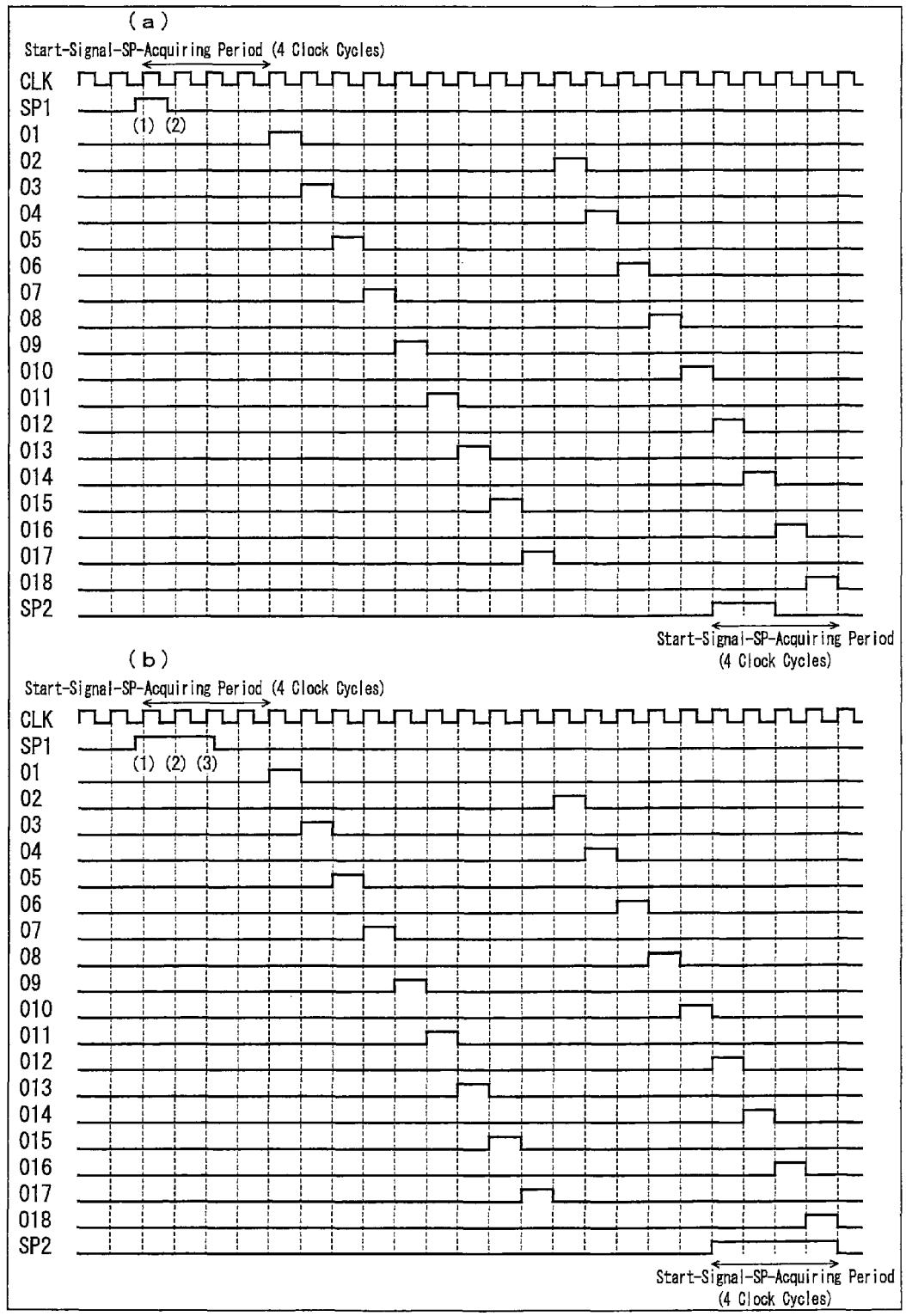
FIG. 5 is a timing chart illustrating interlaced driving by the gate drivers, (a) depicting an operating clock rising once in a HIGH level period of a start signal, (b) depicting the operating clock rising 3 times in that period.
Figure 6:
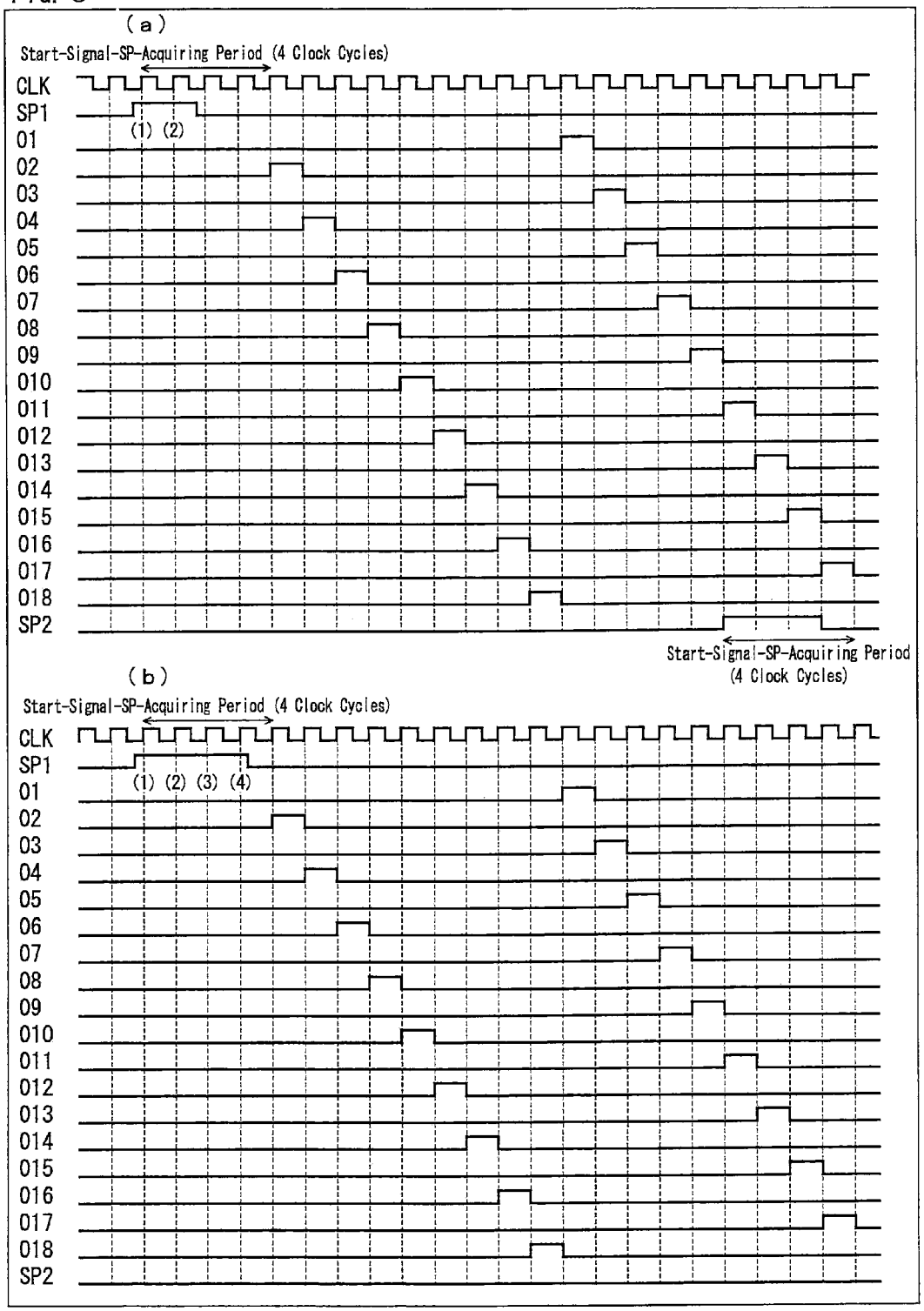
FIG. 6 is a timing chart illustrating interlaced driving by the gate drivers, (a) depicting the operating clock rising twice in that HIGH level period of the start signal, (b) depicting the operating clock rising 4 times in that period.

The interlaced driving implemented by the gate drivers 4 is now described on the basis of the timing charts in FIGS. 5 and 6.

Both (a) and (b) of FIG. 5 show the driving waveform of the scan signal output of the gate driver 4 when the rise count M of the operating clock CLK in a HIGH level period of the start signal SP is an odd number.

As shown in (a) of FIG. 5, if the operating clock CLK rises once in a HIGH level period of the start signal SP fed at the terminal SP1, the gate driver 4 first outputs the scan signal at those output terminals O1, O3, O5, ..., and O17 connected to the scan signal lines in the odd-numbered rows (hereinafter, the "odd-numbered drive terminals") and then outputs the scan signal at those output terminals O2, O4, and O6, ..., and O18 connected to the scan signal lines in the odd-numbered rows (hereinafter, the "even-numbered drive terminals"). At the terminal SP2 connected to the terminal SP1 of the succeeding-stage gate driver 4, the start signal SP is output with a 2 clock cycle HIGH width.

As shown in (b) of FIG. 5, if the operating clock CLK rises 3 times in a HIGH level period of the start signal SP fed at the terminal SP1, the gate driver 4 outputs the scan signal in the same sequence as in the previous case, i.e., first at the odd-numbered drive terminals O1, O3, O5, ..., and O17 and then at the even-numbered drive terminals O2, O4, and O6, ..., and O18. At the terminal SP2, the start signal SP is output with a 4 clock cycle HIGH width.

Both (a) and (b) of FIG. 6 show the driving waveform of the scan signal output of the gate driver 4 when the rise count M is an even number.

As shown in (a) of FIG. 6, if the operating clock CLK rises twice in a HIGH level period of the start signal SP fed at the terminal SP1, the gate driver 4 first outputs the scan signal at the even-numbered drive terminals O2, O4, and O6, ..., and O18 and then outputs the scan signal at the odd-numbered drive terminals O1, O3, O5, ..., and O17. At the terminal SP2 connected to the terminal SP1 of the succeeding-stage gate driver 4, the start signal SP is output with a 3 clock cycle HIGH width.

As shown in (b) of FIG. 6, if the operating clock CLK rises 4 times in a HIGH level period of the start signal SP fed at the terminal SP1, the gate driver 4 outputs the scan signal in the same sequence as in the previous case, i.e., first at the even-numbered drive terminals O2, O4, and O6, ..., and O18 and then at the odd-numbered drive terminals O1, O3, O5, ..., and O17. No start signal SP is output at the terminal SP2 when the operating clock CLK rises 4 times in a HIGH level period of the start signal SP fed at the terminal SP1.

Figure 10:
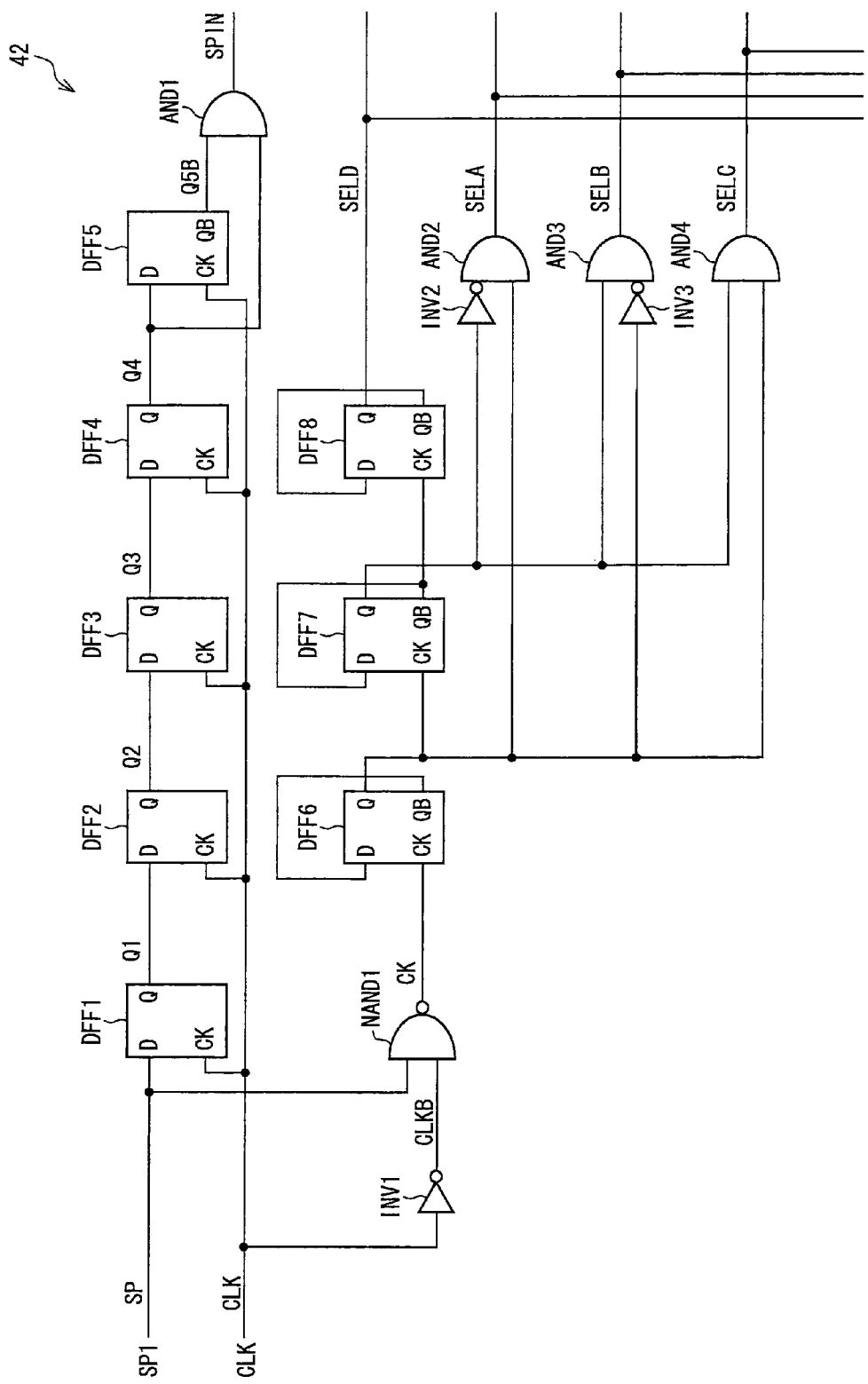
FIG. 10 is a circuit diagram depicting a specific configuration of a rise counter circuit in the gate driver.

In FIG. 10, when the rise count M is 5 or greater, the signal SELD is output as in when the rise count M is 4 times. In other words, the detectable rise count M is at maximum 4 (=Mmax) in the gate driver 4. Hence, the present embodiment assumes that the rise count M be from 1 to 4. The scan sequence is determined according to these values.

The gate driver 4 specifies a start-signal-SP-acquiring period (scan sequence setup period) to determine the scan sequence. Specifically, in the timing charts in FIGS. 5 and 6, the first 4 clock cycles starting at the first rise of the operating clock CLK after a rise of the start signal SP are specified as the start-signal-SP-acquiring period. As the acquiring period elapses, the scanning is started.

Since the start-signal-SP-acquiring period is set to 4 clock cycles as above, the output timing for the start signal SP at the terminal SP2 is advanced so that the termination of the scanning by the preceding-stage gate driver 4 coincides with the start of the scanning by the succeeding-stage gate driver 4. Specifically, when the scan sequence is odd-numbered rows→even-numbered rows as shown in (a) and (b) of FIG. 5, the start signal SP is output at the terminal SP2 simultaneously with the output terminal O12 going HIGH; when the scan sequence is even-numbered rows→odd-numbered rows as shown in (a) and (b) of FIG. 6, the start signal SP is output at the terminal SP2 simultaneously with the output terminal O11 going HIGH. In other words, the start signal SP is output at the terminal SP2 4 clock cycles before the termination of the scanning by the gate driver 4.

Figure 7:
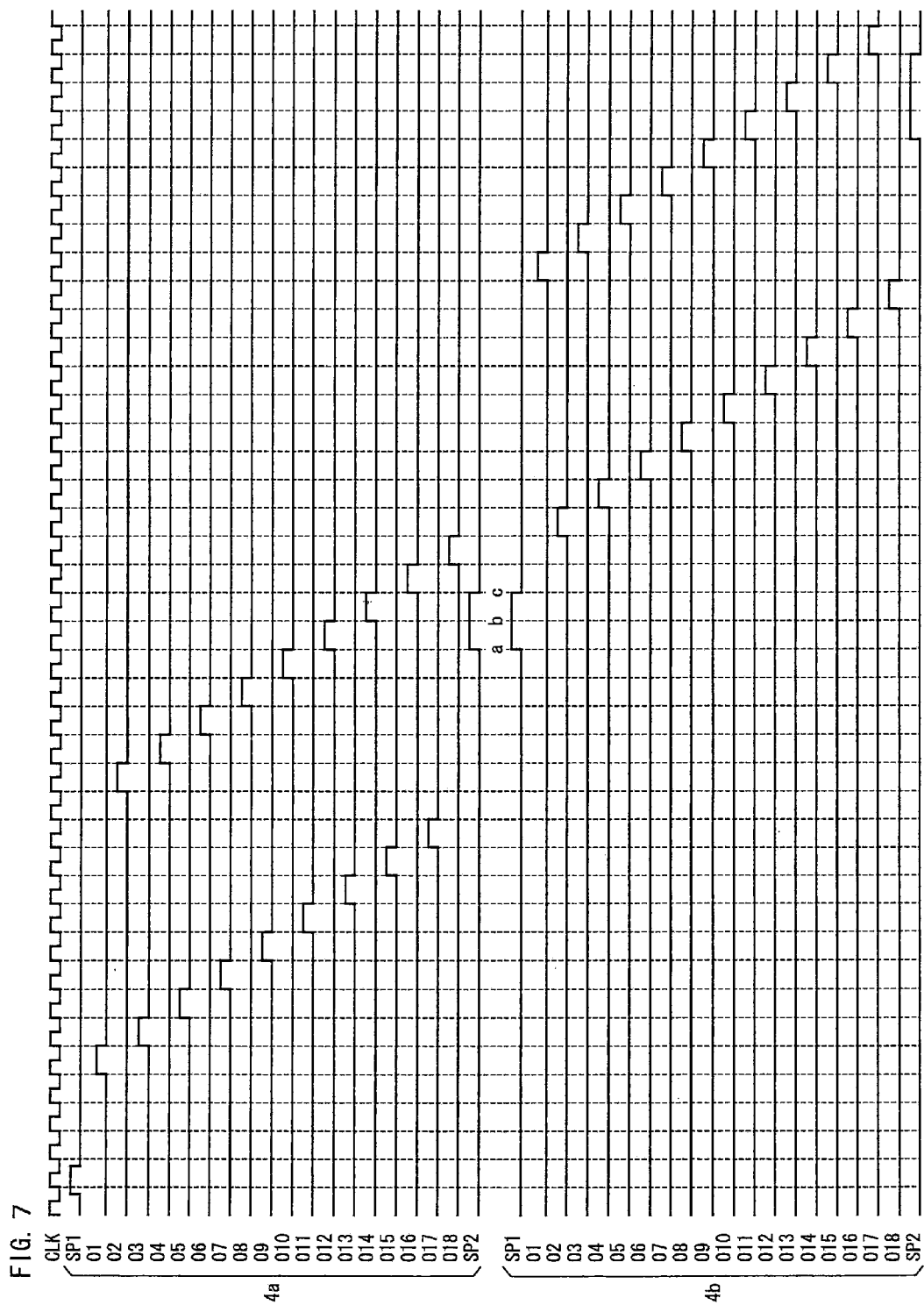
FIG. 7 is a timing chart illustrating interlaced driving by the first- and second-stage gate drivers of four gate drivers being cascaded.
Figure 8:
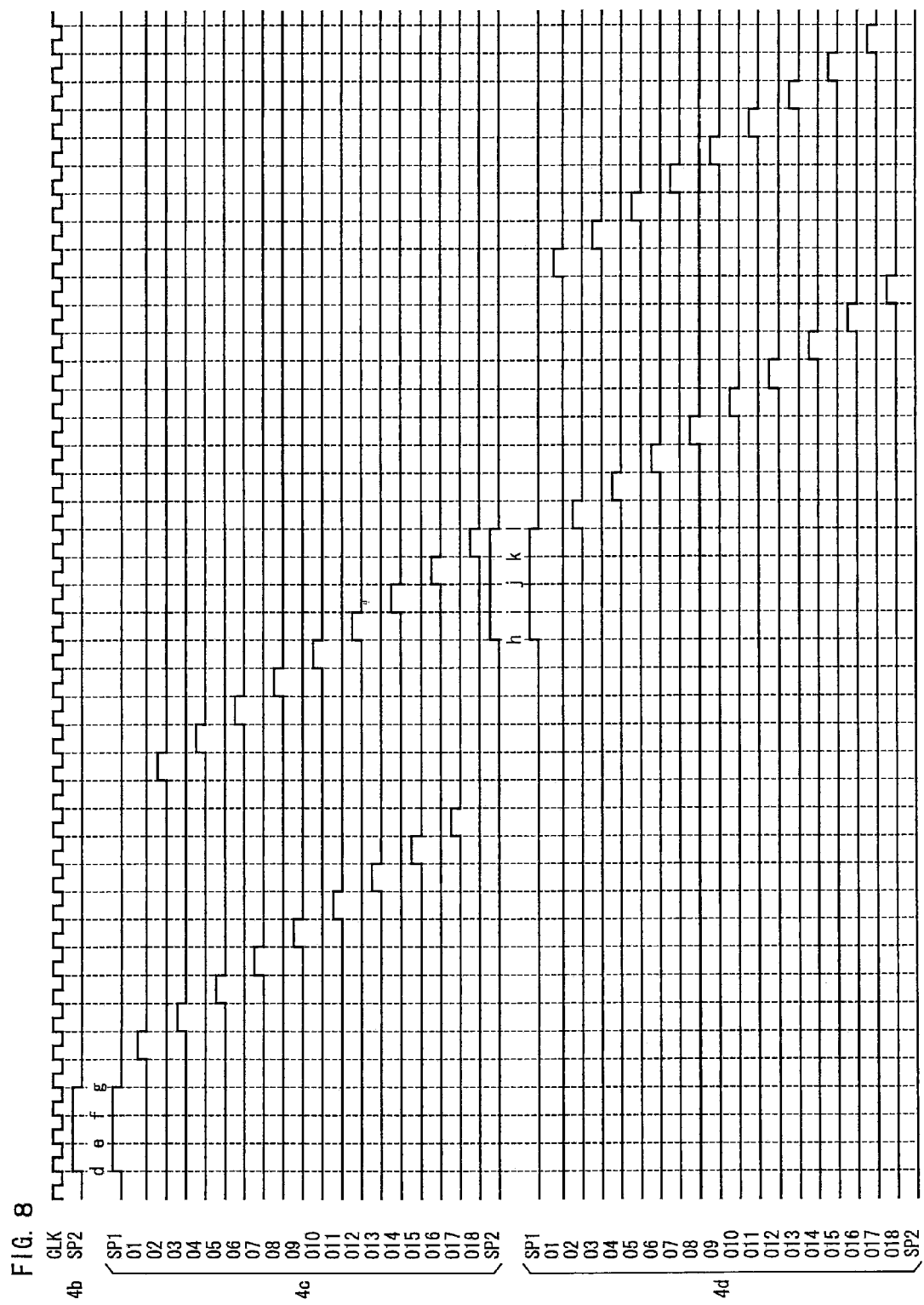
FIG. 8 is a timing chart illustrating interlaced driving by the third- and fourth-stage gate drivers of the four gate drivers being cascaded.

Now, the interlaced driving implemented by the four cascaded gate drivers 4a, 4b, 4c, and 4d in FIG. 4 is described in reference to FIGS. 7 and 8.

FIG. 7 is a timing chart illustrating the interlaced driving implemented by the first-stage gate driver 4a and the second-stage gate driver 4b.

The start signal SP fed at the terminal SP1 of the gate driver 4a is designed so that the operating clock CLK rises once in a HIGH level period of the start signal SP. The gate driver 4a therefore performs interlaced driving by outputting the scan signal first at the odd-numbered drive terminals and then at the even-numbered drive terminals. First, the output terminal O1 goes HIGH. On a next rise of the operating clock CLK, the output terminal O1 goes LOW, and simultaneously the output terminal O3 goes HIGH. The outputs to the odd-numbered rows go HIGH in this manner, up to the output terminal O17. Subsequently, the output terminal O2 goes HIGH. On a next rise of the operating clock CLK, the output terminal O2 goes LOW, and simultaneously the output terminal O4 goes HIGH. The outputs to the even-numbered rows go HIGH in this manner, up to the output terminal O18.

A start signal SP with a 2 clock cycle-long HIGH period is output at the terminal SP2 4 clock cycles before the succeeding-stage gate driver 4b starts scanning, that is, upon the output terminal O12 going HIGH.

This start signal SP is generated according to the operating clock CLK for output at the terminal SP2 of the gate driver 4a. Consequently, the start signal SP has a delay with respect to the operating clock CLK. Besides, the gate driver 4b senses the input of the start signal SP at the terminal SP1 by way of a rise of the operating clock CLK. Therefore, the start signal SP is determined as LOW at time "a" in FIG. 7 and as HIGH at times "b" and "c."

Since the start signal SP fed at the terminal SP1 of the gate driver 4b is HIGH at times "b" and "c," the rise count for the operating clock CLK in a HIGH level period of the start signal SP is 2. Therefore, the gate driver 4b performs interlaced driving so that the scan sequence is even-numbered rows→odd-numbered rows. First, the output terminal O2 goes HIGH. On a next rise of the operating clock CLK, the output terminal O2 goes LOW, and simultaneously the output terminal O4 goes HIGH. The outputs to the even-numbered rows go HIGH in this manner, up to the output terminal O18. Subsequently the output terminal O1 goes HIGH. On a next rise of the operating clock CLK, the output terminal O1 goes LOW, and simultaneously the output terminal O3 goes HIGH. The outputs to the odd-numbered rows go HIGH in this manner, up to the output terminal O17.

A start signal SP with a 3 clock cycle-long HIGH period is output at the terminal SP2 4 clock cycles before the succeeding-stage gate driver 4c starts scanning, that is, upon the output terminal O11 going HIGH.

If there were provided two cascaded stages, i.e., only the gate driver 4a and the gate driver 4b, there would be no more gate drivers. The start signal SP output at the terminal SP2 of the gate driver 4b would be neglected.

FIG. 8 is a timing chart illustrating the interlaced driving implemented by the third-stage gate driver 4c and the fourth-stage gate driver 4d.

The terminal SP1 of the gate driver 4c is cascaded to the terminal SP2 of the preceding-stage gate driver 4b (see FIG. 7). The start signal SP output at the terminal SP2 of the gate driver 4b is generated according to the operating clock CLK for output and consequently has a delay with respect to the operating clock CLK. Besides, the gate driver 4c senses the input of the start signal SP at the terminal SP1 by way of a rise of the operating clock CLK. Therefore, the start signal SP is determined as LOW at time "d" in FIG. 8 and as HIGH at times "e," "f," and "g." The rise count for the operating clock CLK in a HIGH level period of the start signal SP fed at the terminal SP1 of the gate driver 4c is 3.

Therefore, the gate driver 4c performs interlaced driving so that, similarly to the gate driver 4a, the scan sequence is odd-numbered rows→even-numbered rows. A start signal SP with a 4 clock cycle-long HIGH period is output at the terminal SP2 4 clock cycles before the succeeding-stage gate driver 4d starts scanning, that is, upon the output terminal O12 going HIGH.

The start signal SP is also generated according to the operating clock CLK for output and has a delay with respect to the operating clock CLK. Besides, the gate driver 4c senses the input of the start signal SP at the terminal SP1 by way of a rise of the operating clock CLK. Therefore, the start signal SP is determined as LOW at time "h" in FIG. 8 and as HIGH at times "i," "j," "k," and "l." The rise count for the operating clock CLK in a HIGH level period of the start signal SP fed at the terminal SP1 of the gate driver 4d is 4.

Therefore, the gate driver 4d performs interlaced driving so that, similarly to the gate driver 4b, the scan sequence is even-numbered rows→odd-numbered rows. In the gate driver 4d, the operating clock CLK rises 4 times in a HIGH level period of the start signal SP fed at the terminal SP1. Therefore, no start signal SP is output at the terminal SP2 (see (b) of FIG. 6).

As described in the foregoing, when the four gate drivers 4a to 4d are cascaded, the first- and third-stage gate drivers 4a and 4c performs interlaced driving so that the scan sequence is odd-numbered rows→even-numbered rows, and the second- and fourth-stage gate drivers 4b and 4d performs interlaced driving so that the scan sequence is even-numbered rows→odd-numbered rows. High display quality is achieved because of the four-part division of the liquid crystal panel 2 and the interlaced driving by alternating the odd-numbered rows→even-numbered rows scanning and the even-numbered rows→odd-numbered rows scanning. Furthermore, the gate drivers 4, not including the switching terminal OS shown in FIG. 39, requires less wiring, etc. and is less costly than the configuration of patent literature 3.

Next, a specific circuit configuration for the gate drivers 4 whereby the interlaced driving is implemented without the provision of a switching terminal OS will be described in reference to FIGS. 9 to 18.

Figure 9:
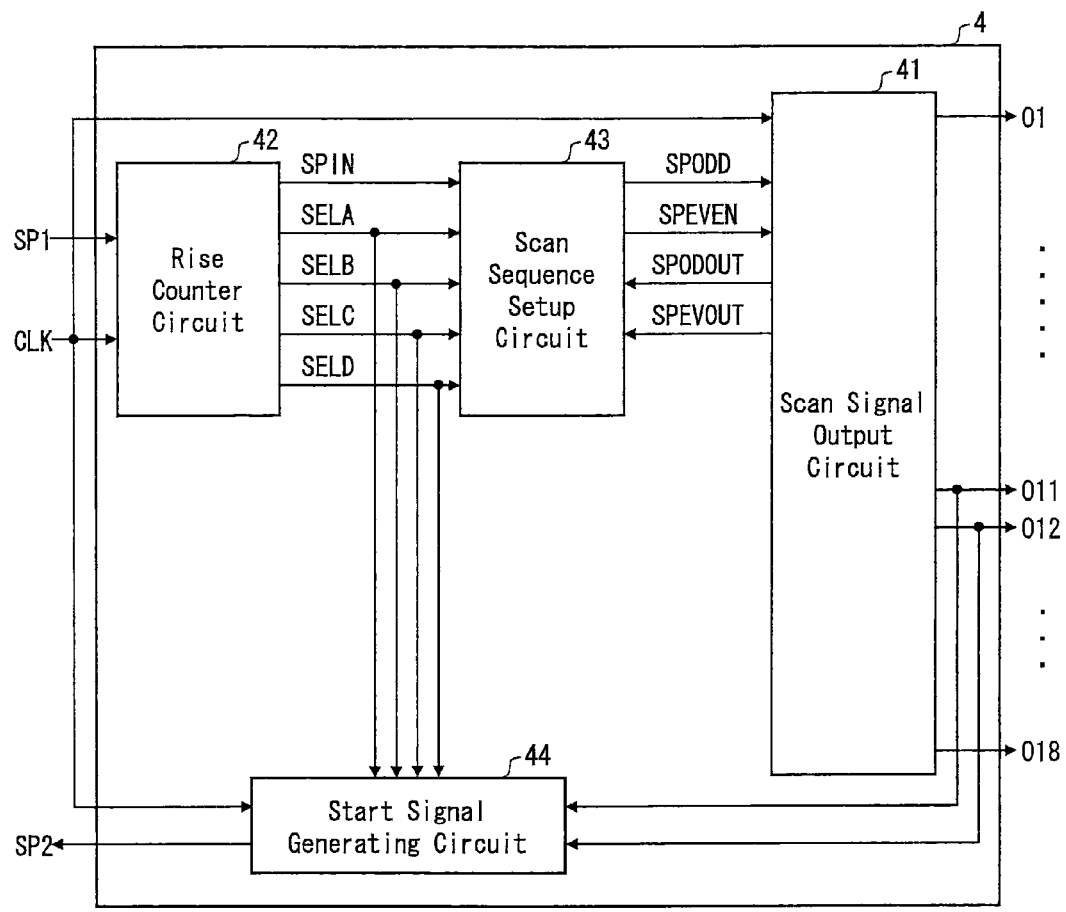
FIG. 9 is a block diagram depicting the configuration of a major part of the gate driver.

FIG. 9 is a block diagram depicting the configuration of the gate driver 4. The gate driver 4 includes a scan signal output circuit 41, a rise counter circuit 42, a scan sequence setup circuit 43, and a start signal generating circuit 144.

The scan signal output circuit 41 generates a scan signal for output at the output terminals O1 to O18 (see FIG. 4) of the gate driver 4.

The rise counter circuit 42 senses the rise count M of the operating clock CLK in a HIGH level period of the start signal SP fed at the terminal SP1 of the gate driver 4. The scan sequence setup circuit 43 decides a scan sequence to be followed by the scan signal output circuit 41 from the rise count sensed by the rise counter circuit 42.

The start signal generating circuit 144 generates the start signal SP for output at the terminal SP2 of the gate driver 4. The rise count N of the operating clock in a HIGH level period of the start signal SP output from the start signal generating circuit 144 is M+1.

The operating clock CLK, supplied at the terminal CLK of the gate driver 4, is fed to the scan signal output circuit 41, the rise counter circuit 42, and the start signal generating circuit 144. The start signal SP fed at the terminal SP1 of the gate driver 4 is fed to the rise counter circuit 42.

The rise counter circuit 42 outputs a signal SPIN to the scan sequence setup circuit 43 and also outputs signals SELA, SELB, SELC, and SELD to the scan sequence setup circuit 43 and the start signal generating circuit 144. The scan sequence setup circuit 43 outputs signals SPODD and SPEVEN to the scan signal output circuit 41. The scan signal output circuit 41 in turn outputs signals SPODOUT and SPEVOUT to the scan sequence setup circuit 43.

The scan signal output circuit 41 is connected to the output terminals O1 to O18. The lines connected to the output terminals O11 and O12 are connected also to the start signal generating circuit 144 respectively. This means that as a scan signal is output at the output terminal O11 or O12, a HIGH pulse is supplied simultaneously to the start signal generating circuit 144.

The scan signal output circuit 41 is a driver circuit for interlaced driving by first sequentially scanning either the scan signal lines in the odd-numbered rows or the scan signal lines in the even-numbered rows and then sequentially scanning the rest of the scan signal lines. The scan signal output circuit 41 sequentially scans the scan signal lines in the odd-numbered rows if the signal SPODD is fed and sequentially scans the scan signal lines in the even-numbered rows if the signal SPEVEN is fed.

In other words, to have the odd-numbered rows scanned followed by the scanning of the even-numbered rows, the scan sequence setup circuit 43 outputs the signal SPODD to the scan signal output circuit 41, the scan signal output circuit 41 then outputs the signal SPODOUT to the scan sequence setup circuit 43, and subsequently, the scan sequence setup circuit 43 outputs the signal SPEVEN to the scan signal output circuit 41. To reverse the scan sequence, i.e., have the even-numbered rows scanned followed by the scanning of the odd-numbered rows, the scan sequence setup circuit 43 outputs the signal SPEVEN to the scan signal output circuit 41, the scan signal output circuit 41 then outputs the signal SPE-VOUT to the scan sequence setup circuit 43, and subsequently, the scan sequence setup circuit 43 outputs the signal SPODD to the scan signal output circuit 41.

FIG. 10 depicts a specific circuit configuration for the rise counter circuit 42. The rise counter circuit 42 includes eight D-type flip-flop circuits (DFF1 to 8), four AND gates (AND1 to 4), a NAND gate (NAND1), and three inverters (INV1 to 3). DFF1 to DFF5 constitute a 5-stage shift register circuit. The operating clock CLK, supplied at the terminal CLK of the gate driver 4, is fed at the clock input terminals CK of DFF1 to 5. The start signal SP, supplied at the terminal SP1 of the gate driver 4, is fed to the data input terminal D of DFF1 (first stage). The data output terminal Q of DFF4 is connected to the data input terminal D of DFF5 and also to the input terminal of AND1. The inverted data output terminal QB of DFF5 is also connected to the input terminal of AND1 which outputs the signal SPIN to the scan sequence setup circuit 43.

Accordingly, the start signal SP is delayed by 4 clock cycles of the operating clock CLK by the shift register circuit constituted by DFF1 to DFF5 and reshaped by AND1 to have a width equivalent to 1 clock cycle of the operating clock CLK, before being output as the signal SPIN.

The start signal SP is fed also at the input terminal of NAND1. The operating clock CLK is fed also at the input terminal of the NAND1 via INV1. NAND1 outputs the counter signal CK based of the start signal SP and the inverted clock CLKB output of INV1.

DFF6 to DFF8 constitute a 3-stage counter circuit. The counter signal CK is fed at the clock input terminal CK of DFF6. The inverted data output terminal QB and the data input terminal D of DFF6 are connected to each other. The data output terminal Q of DFF6 is connected to the clock input terminal CK of DFF7, the input terminals of AND2 and AND4, and via INV3 to the input terminal of AND3.

The inverted data output terminal QB of DFF7 is connected to data input terminal D of DFF7 and the clock input terminal CK of DFF8. The data output terminal Q of DFF7 is connected to the input terminals of AND3 and AND4 and via INV2 to the input terminal of AND2.

The inverted data output terminal QB and the data input terminal D of DFF8 are connected to each other. AND2, AND3, and AND4 output the signals SELA, SELB, and SELC respectively. The data output terminal Q of DFF8 outputs the signal SELD.

Accordingly, the counter circuit constituted by DFF6 to DFF8 counts the fall count for the inverted clock CLKB in a HIGH level period of the start signal SP and outputs the signals SELA, SELB, SELC, and SELD to the scan sequence setup circuit 43 and the start signal generating circuit 44.

Figure 11:
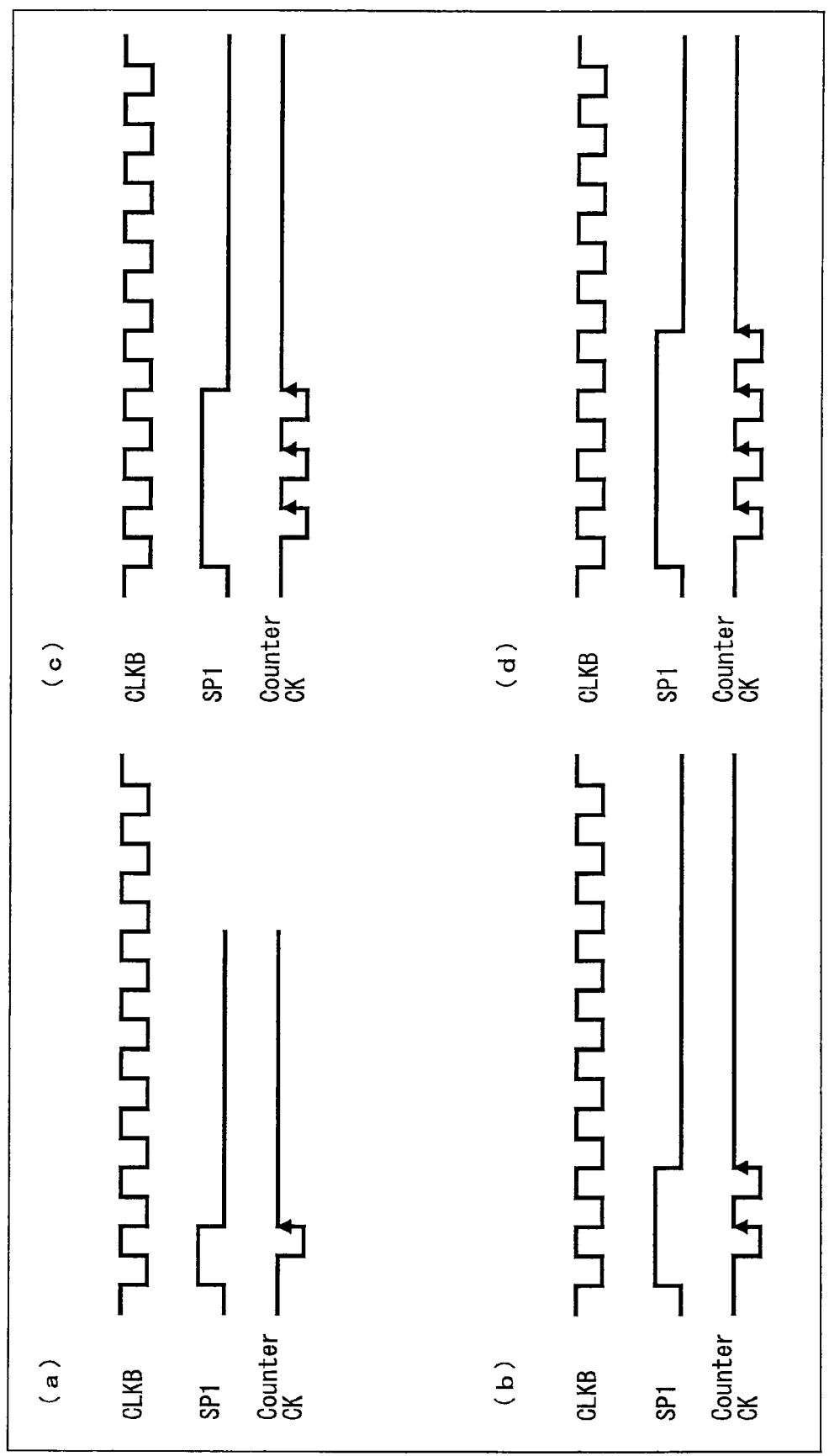
FIG. 11 is a timing chart illustrating an inverted clock, a start signal, and a counter signal in the rise counter circuit, (a) depicting the inverted clock falling once in a HIGH level period of the start signal, (b) depicting the inverted clock falling twice in that period, (c) depicting the inverted clock falling 3 times in that period, (d) depicting the inverted clock falling 4 times in that period.

(a) to (d) of FIG. 11 are timing charts representing the inverted clock CLKB, the start signal SP, and the counter signal CK in the rise counter circuit 42. The inverted clock CLKB is the same signal as the output signal of INV1.

(a) of FIG. 11 represents a case where the inverted clock CLKB falls (i.e., the operating clock CLK rises) once in a HIGH level period of the start signal SP, in other words, where the HIGH width of the start signal SP is equal to 1 clock cycle. NAND1 renders the counter signal CK LOW if both the start signal SP and the inverted clock CLKB are HIGH. The counter signal CK is HIGH when the start signal SP rises because the inverted clock CLKB is LOW. The inverted clock CLKB falls once in a HIGH level period of the start signal SP. Therefore, the counter signal CK rises once. Since DFF6 flips on a rise, the counter circuit constituted by DFF6 to DFF8 operates once.

(b) of FIG. 11 represents a case where the HIGH width of the start signal SP is equal to 2 clock cycles. Since the counter signal CK rises twice in a HIGH level period of the start signal SP, the counter signal CK rises twice. Therefore, the counter circuit operates twice.

(c) of FIG. 11 represents a case where the HIGH width of the start signal SP is equal to 3 clock cycles. Since the counter signal CK rises 3 times in a HIGH level period of the start signal SP, the counter signal CK rises 3 times. Therefore, the counter circuit operates 3 times.

(d) of FIG. 11 represents a case where the HIGH width of the start signal SP is equal to 4 clock cycles. Since the counter signal CK rises 4 times in a HIGH level period of the start signal SP, the counter signal CK rises 4 times. Therefore, the counter circuit operates 4 times.

In this manner, the signal SELA goes HIGH if the count given by the counter circuit and AND2 to AND4 shown in FIG. 10 is 1, that is, if the HIGH width of the start signal SP is equal to 1 clock cycle; the signal SELB goes HIGH if the count is 2, that is, if the HIGH width of the start signal SP is equal to 2 clock cycles; the signal SELC goes HIGH if the count is 3, that is, if the HIGH width of the start signal SP is equal to 3 clock cycles; and the signal SELD goes HIGH if the count is 4, that is, if the HIGH width of the start signal SP is equal to 4 clock cycles.

Figure 12:
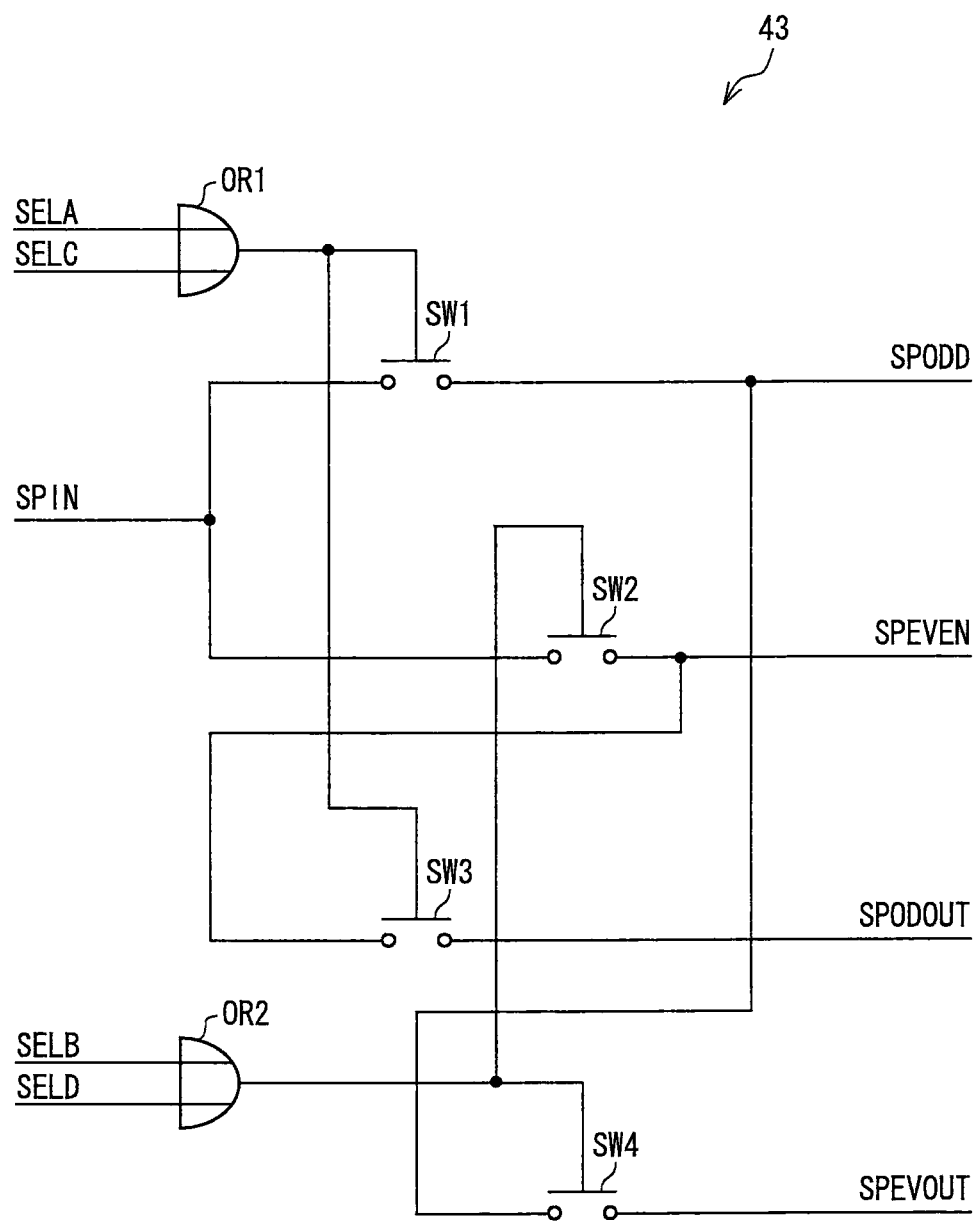
FIG. 12 is a circuit diagram depicting a specific configuration of a scan sequence setup circuit in the gate driver.

FIG. 12 depicts a specific circuit configuration for the scan sequence setup circuit 43. The scan sequence setup circuit 43 includes two OR gates (OR1, 2) and four switches (SW1 to 4). The switches are made of a MOS transistor in the present embodiment, which is by no means limiting the invention. OR1 receives the signal SELA and the signal SELC from the rise counter circuit 42. OR2 receives the signal SELB and the signal SELD from the rise counter circuit 42. The output terminal of OR1 is connected to the gate of SW1 and the gate of SW3. The output terminal of OR2 is connected to the gate of SW2 and the gate of SW4.

Accordingly, when the HIGH width of the start signal SP is equal to 1 clock cycle or 3 clock cycles, SW1 and SW3 turn on; and when the HIGH width of the start signal SP is equal to 2 clock cycles or 4 clock cycles, SW2 and SW4 turn on. The signal SPIN from the rise counter circuit 42 is connected to the sources of SW1 and SW2.

Figure 13:
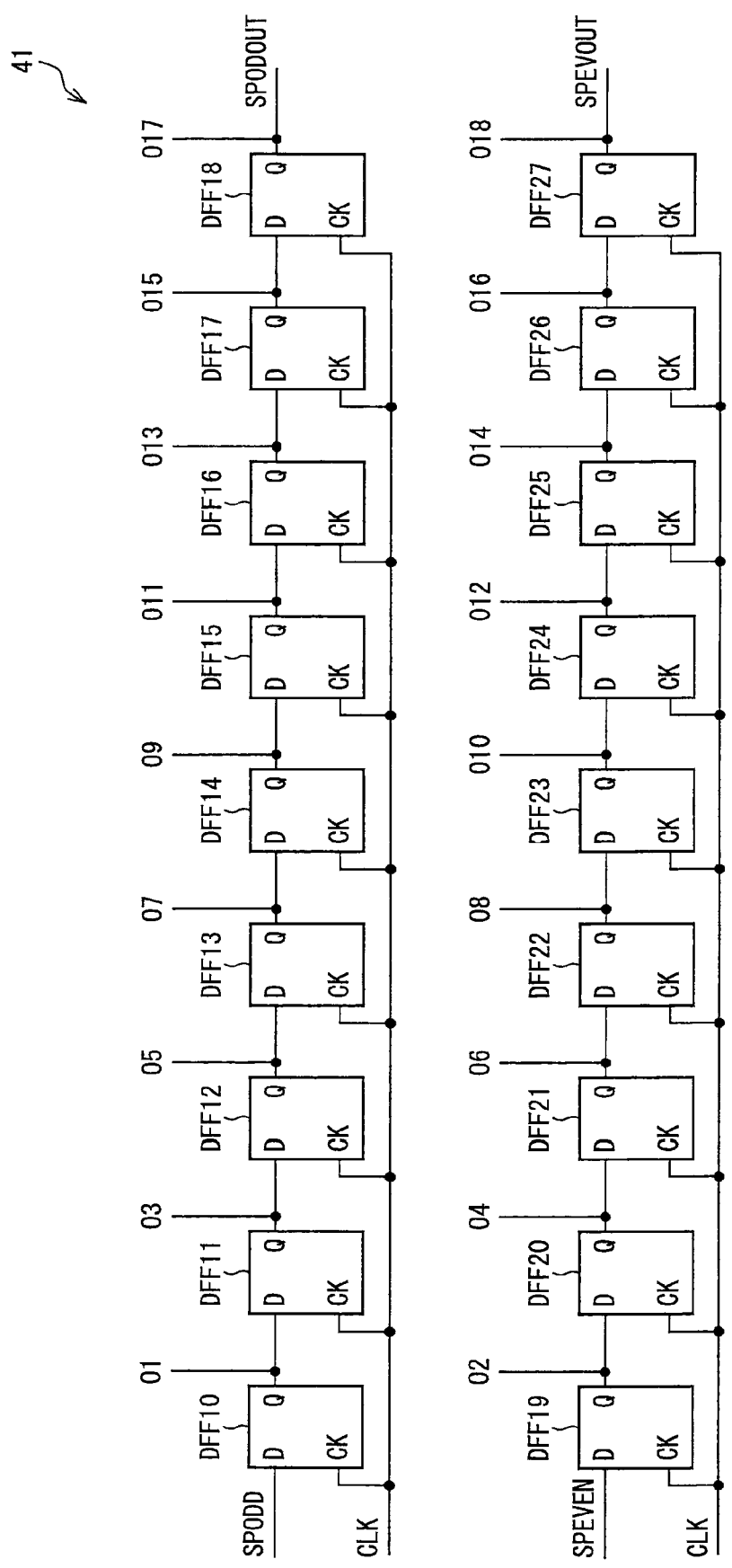
FIG. 13 is a circuit diagram depicting a specific configuration of a scan signal output circuit in the gate driver.

FIG. 13 depicts a specific circuit configuration for the scan signal output circuit 41. The scan signal output circuit 41 includes 18 DFF10 to 27. DFF10 to 18 constitute a shift register, and DFF19 to 27 constitute another shift register. The operating clock CLK is fed at the clock input terminals of DFF10 to 27.

Referring to FIGS. 12 and 13, the connection between the scan sequence setup circuit 43 and the scan signal output circuit 41 is now described.

The drain of SW1 in the scan sequence setup circuit 43 is connected to the drain of SW4 and the data input terminal D of DFF10 in the scan signal output circuit 41. The signal SPODD is supplied to DFF10. The drain of SW2 is connected to the drain of SW3 and the data input terminal D of DFF19 in the scan signal output circuit 41. The signal SPEVEN is supplied to DFF19.

The source of SW3 is connected to the data output terminal Q of DFF18 in the scan signal output circuit 41. The signal SPODOUT is supplied from DFF18. The source of SW4 is connected to the data output terminal Q of DFF27 in the scan signal output circuit 41. The signal SPEVOUT is supplied from DFF27.

The shift register constituted by DFF10 to 18 in the scan signal output circuit 41 outputs a scan signal for driving the scan signal lines in the odd-numbered rows. The signal SPODD is fed at the data input terminal D of the first-stage DFF10 from SW1 of the scan sequence setup circuit 43. The data output terminals Q of DFF10 to 17 are connected to the data input terminal D of DFF in the succeeding stage and also to the output terminals O1, O3, O5, . . . , and O15. The data output terminal Q of DFF18 is connected to the output terminal O17 and the source of SW3 in the scan sequence setup circuit 43.

Meanwhile, the shift register constituted by DFF19 to 27 outputs a scan signal for driving the scan signal lines in the even-numbered rows. The signal SPEVEN is fed at the data input terminal D of the first-stage DFF19 from SW2 of the scan sequence setup circuit 43. The data output terminals Q of DFF19 to 26 are connected to the data input terminal D of DFF in the succeeding stage and also to the output terminals O2, O4, and O6, . . . , and O16. The data output terminal Q of DFF27 is connected to the output terminal O18 and the source of SW4 in the scan sequence setup circuit 43.

If the HIGH width of the start signal SP is equal to 1 clock cycle or 3 clock cycles in the scan sequence setup circuit 43, that is, if the HIGH width of the start signal SP is equal to an odd multiple of the clock cycle, SW1 and SW3 turn on, feeding the signal SPODD to DFF10 in the scan signal output circuit 41 via the drain of SW1. Therefore, if the HIGH width of the start signal SP is equal to an odd multiple of the clock cycle, the scan signal lines in the odd-numbered rows is driven first. The signal SPODD is sequentially output up to the output terminal O17, and then the signal SPODOUT is output. Since SW3 in the scan sequence setup circuit 43 is ON, the signal SPEVEN is fed to DFF19 in the scan signal output circuit 41 via the drain of SW3. This marks the termination of the scanning of the odd-numbered rows and starts the scanning of the even-numbered rows. The signal SPEVEN is sequentially output up to the output terminal O18. The signal SPEVOUT is output from DFF27. However, since SW4 in the scan sequence setup circuit 43 is OFF, the signal SPODD is not supplied to DFF10 upon the termination of the scanning of the even-numbered rows.

On the other hand, if the HIGH width of the start signal SP is equal to 2 clock cycles or 4 clock cycles, that is, if the HIGH width of the start signal SP is equal to an even multiple of the clock cycle, SW2 and SW4 turn on, feeding the signal SPEVEN to DFF19 in the scan signal output circuit 41 via the drain of SW2. Therefore, if the HIGH width of the start signal SP is equal to an even multiple of the clock cycle, the scan signal lines in the even-numbered rows is driven first. The signal SPEVEN is sequentially output up to the output terminal O18, and then the signal SPEVOUT is output. Since SW4 in the scan sequence setup circuit 43 is ON, the signal SPODD is fed to DFF10 in the scan signal output circuit 41 via the drain of SW4. This marks the termination of the scanning of the even-numbered rows and starts the scanning of the odd-numbered rows. The signal SPODD is sequentially output up to the output terminal O17. The signal SPODOUT is output from DFF18. However, since SW3 in the scan sequence setup circuit 43 is OFF, the signal SPEVEN is not supplied to DFF19 upon the termination of the scanning of the odd-numbered rows.

Next, referring to FIG. 14, the timings when the signal SPIN is generated according to the start signal SP will be described.

Figure 14:
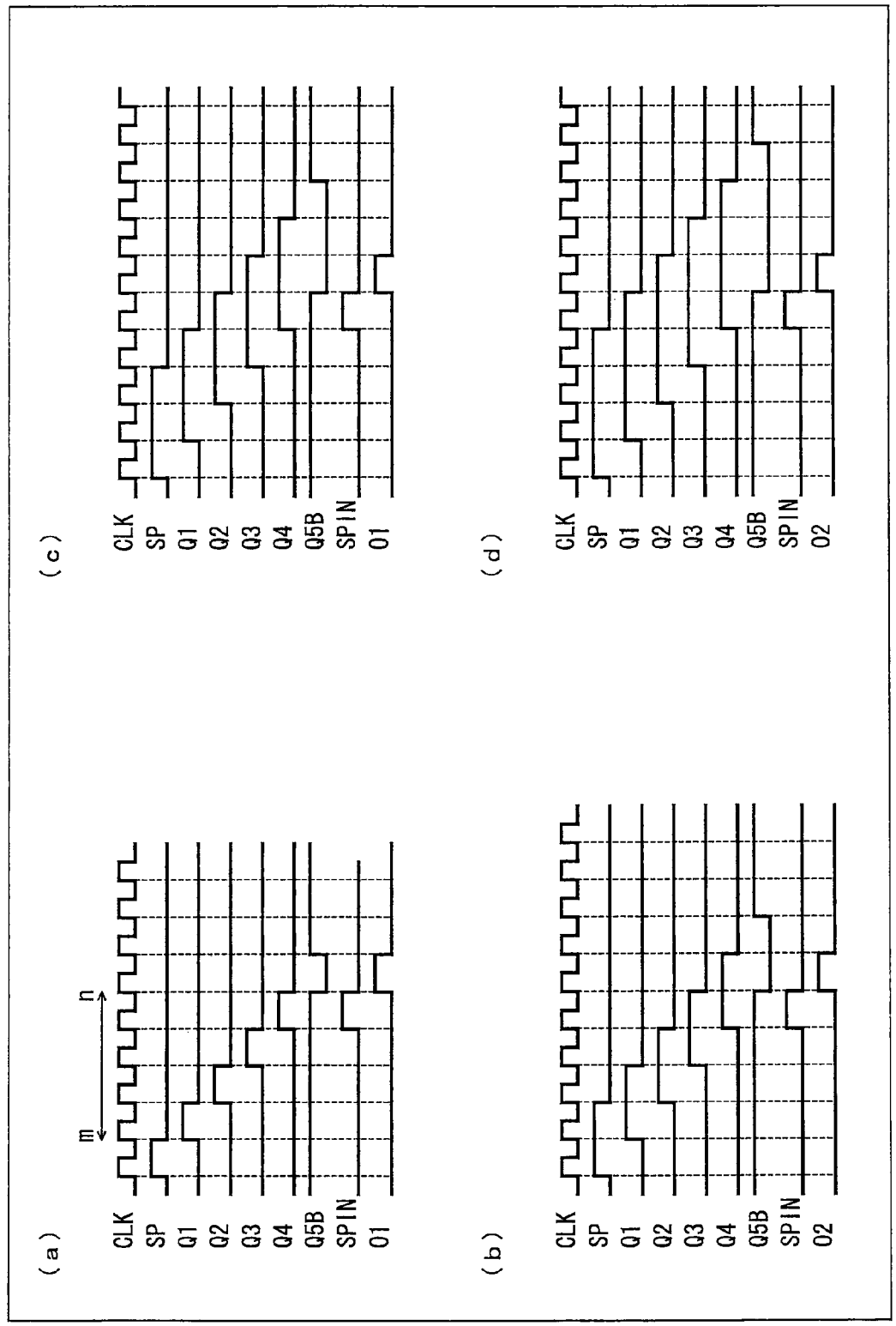
FIG. 14 is a timing chart illustrating an operating clock, a start signal, etc. in the scan sequence setup circuit and the scan signals at output terminals of the scan signal output circuit, (a) depicting an operating clock rising once in a HIGH level period of the start signal, (b) depicting the operating clock rising twice in that period, (c) depicting the operating clock rising 3 times in that period, (d) depicting the operating clock rising twice in that period.

(a) to (d) of FIG. 14 are timing charts illustrating the operating clock CLK, the start signal SP, the signals Q1 to Q4 and Q5B, and the signal SPIN, all shown in FIG. 12, and a scan signal output at the output terminal O1 or O2. The signals Q1 to Q4 are output signals from DFF1 to DFF4 respectively. The signal Q5B is an output signal at the inverted data output terminal QB of DFF5.

(a) of FIG. 14 represents a case where the rise count M of the operating clock CLK in a HIGH level period of the start signal SP is 1, in other words, the HIGH width of the start signal SP is equal to 1 clock cycle. The rise of the start signal SP is shown to coincide with the rise of the operating clock CLK. Actually, the start signal SP is delayed and changes after a change of the operating clock CLK. The signal Q1 therefore goes HIGH at time "m." The signal Q1 is sequentially shifted, and the signal Q4 and the signal Q5B are fed to AND1.

The signal SPIN corresponds to the scan start signal for the gate driver 4. As mentioned earlier, if the HIGH width of the start signal SP is equal to 1 clock cycle, SW1 is ON, feeding the signal SPODD to DFF10 shown in FIG. 13. Accordingly, the scan signal output at the output terminal O1 goes HIGH upon a next rise of the operating clock CLK. In other words, the start of the drive output is recognized at time "n" which is 4 clock cycles after time "m." The gate driver 4 starts first scanning the odd-numbered rows.

(b) of FIG. 14 represents a case where the HIGH width of the start signal SP is equal to 2 clock cycles. Similarly to (a) of FIG. 14, the signal Q1 goes HIGH at time "m." However, since the HIGH width of the start signal SP is equal to 2 clock cycles, the HIGH width of the signal Q1 is also equal to 2 clock cycles. The signals Q2 to Q4 also have a HIGH width equal to 2 clock cycles. Since the signal Q4 and the signal Q5B are fed to AND1, however, the signal SPIN has a HIGH width equal to 1 clock cycle. Therefore, similarly to (a) of FIG. 14, a signal SPIN with a 1 clock cycle HIGH width is output 3 clock cycles after a rise of the signal Q1.

As mentioned earlier, if the HIGH width of the start signal SP is equal to 2 clock cycles, SW2 is ON, feeding the signal SPSPEVEN to DFF19 shown in FIG. 13. Accordingly, the scan signal output at the output terminal O2 goes HIGH upon a next rise of the operating clock CLK. In other words, similarly to (a) of FIG. 14, the start of the drive output is recognized 4 clock cycles after a rise of the signal Q1. The gate driver 4 starts first scanning the even-numbered rows.

(c) of FIG. 14 represents a case where the HIGH width of the start signal SP is equal to 3 clock cycles. The HIGH width of the start signal SP is equal to 3 clock cycles. The signals Q1 to Q4 therefore also have a HIGH width equal to 3 clock cycles. Since the signal Q4 and the signal Q5B are fed to AND1, however, the signal SPIN has a HIGH width equal to 1 clock cycle. Therefore, similarly to (a) of FIG. 14, a signal SPIN with a 1 clock cycle HIGH width is output 3 clock cycles after a rise of the signal Q1. If the HIGH width of the start signal SP is equal to 3 clock cycles, SW1 is ON, feeing the signal SPODD to DFF10 shown in FIG. 13. Accordingly, the scan signal output at the output terminal O1 goes HIGH upon a next rise of the operating clock CLK. Therefore, similarly to (a) of FIG. 14, the gate driver 4 first starts scanning the odd-numbered rows 4 clock cycles after a rise of the signal Q1.

(d) of FIG. 14 represents a case where the HIGH width of the start signal SP is equal to 4 clock cycles. The HIGH width of the start signal SP is equal to 4 clock cycles. The signals Q1 to Q4 therefore also have a HIGH width equal to 4 clock cycles. Since the signal Q4 and the signal Q5B are fed to AND1, however, the signal SPIN has a HIGH width equal to 1 clock cycle. Therefore, similarly to (a) of FIG. 14, a signal SPIN with a 1 clock cycle HIGH width is output 4 clock cycles after a rise of the signal Q1. If the HIGH width of the start signal SP is equal to 4 clock cycles, SW2 is ON, feeding the signal SPSPEVEN to DFF19 shown in FIG. 13. Accordingly, the scan signal output at the output terminal O2 goes HIGH upon a next rise of the operating clock CLK. Therefore, similarly to (b) of FIG. 14, the gate driver 4 first starts scanning the even-numbered rows 4 clock cycles after a rise of the signal Q1.

Figure 15:
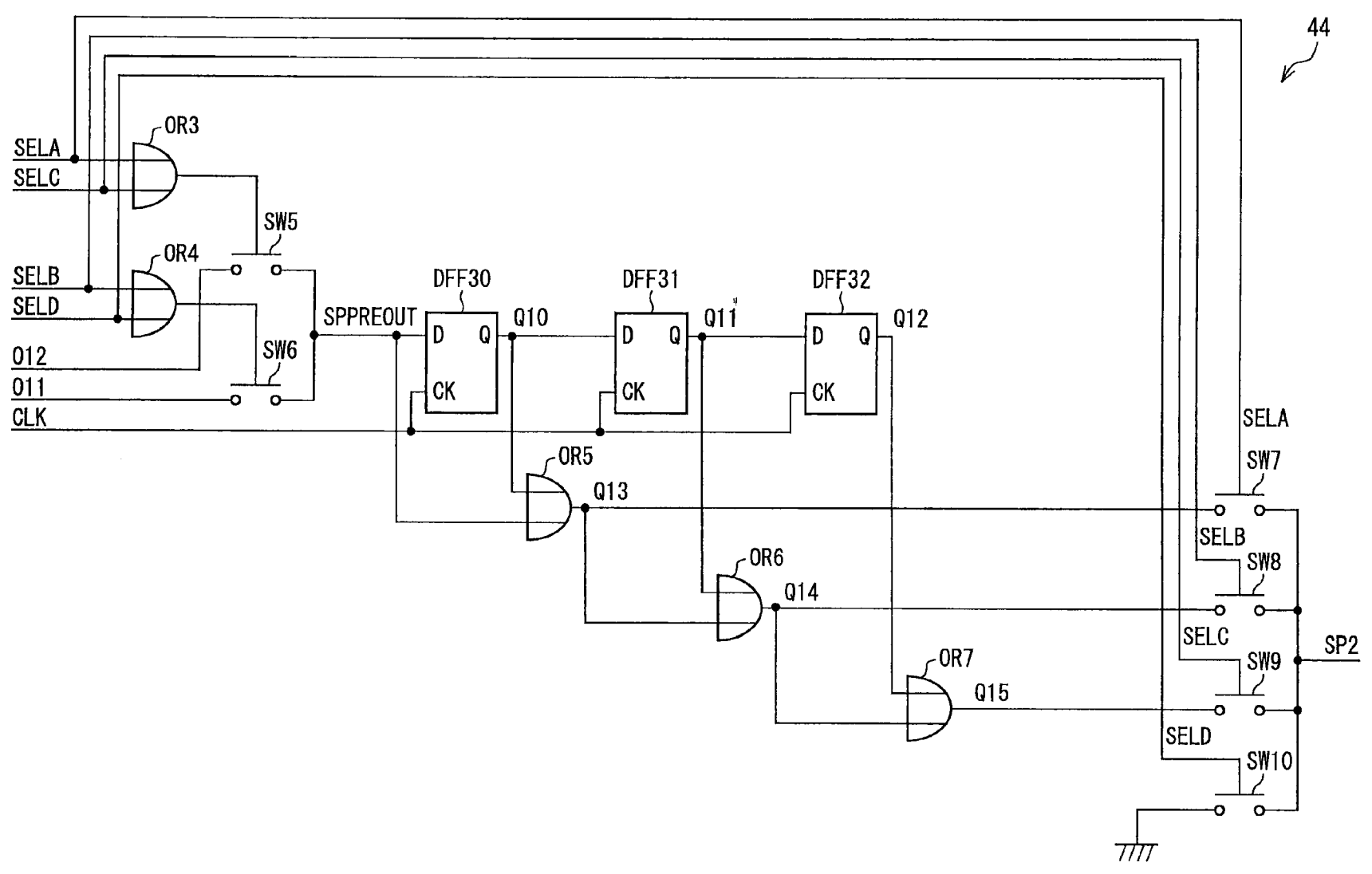

FIG. 15 depicts a specific circuit configuration for the start signal generating circuit 44 shown in FIG. 9. The start signal generating circuit 44 includes three D-type flip-flop circuits (DFF30 to 32), five OR gates (OR3 to 7), and six switches (SW1 to 4).

The signal outputs SELA, SELB, SELC, and SELD of the rise counter circuit 42 shown in FIG. 9 are input as follows. The signal SELA is fed to the input terminal of OR3 and the gate of SW7. The signal SELB is fed to the input terminal of OR4 and the gate of SW8. The signal SELC is fed to the input terminal of OR3 and the gate of SW9. The signal SELD is fed to the input terminal of OR4 and the gate of SW10. The output signal of OR3 is fed to the gate of SW5. The output signal of OR4 is fed to the gate of SW6. The output signals of DFF24 and DFF15 in the scan signal output circuit 41 shown in FIG. 13 are fed at the source of SW5 and the source of SW6 respectively.

The circuit constituted by OR3, OR4, SW5, and SW6 is a circuit for selecting when to output the start signal SP to the succeeding-stage gate driver 4.

As mentioned earlier, if the HIGH width of the start signal SP fed to the rise counter circuit 42 is equal to 1 clock cycle or 3 clock cycles, the signal SELA or the signal SELC is output; if the HIGH width of the start signal SP is equal to 2 clock cycles or 4 clock cycles, the signal SELB or the signal SELD is output. In other words, if the scan signal output circuit 41 sequentially scans the odd-numbered rows and then the even-numbered rows, SW5 turns on; if the scan signal output circuit 41 sequentially scans the even-numbered rows and then the odd-numbered rows, SW6 turns on. The signal SPPREOUT output at the drain of either SW5 or SW6 is fed at the data input terminal D of DFF30 and the input terminal of OR5.

Accordingly, if the odd-numbered rows are first scanned to implement interlaced driving, the output signal of DFF24 in the scan signal output circuit 41 is selected. Therefore, the signal SPPREOUT is output 4 clock cycles before the output timing for DFF27 which is the last output for the interlaced driving implemented by the scan signal output circuit 41. Likewise, if the even-numbered rows are first scanned to implement interlaced driving, the output signal of DFF15 in the scan signal output circuit 41 is selected. Therefore, the signal SPPREOUT is output 4 clock cycles before the output timing for DFF18 which is the last output for the interlaced driving implemented by the scan signal output circuit 41.

Since the start signal is output from the start signal generating circuit 44 to the succeeding-stage gate driver 4 earlier than the termination of the scanning by the gate driver 4 by as much as the start-signal-SP-acquiring period, the termination of the scanning by the gate driver 4 can be immediately followed by the start of the scanning by the succeeding-stage gate driver 4.

The circuit constituted by DFF30 to 32, OR5 to 7, and SW7 to 10 is a circuit for setting the HIGH width of the start signal SP fed to the succeeding-stage gate driver 4.

DFF30 to DFF32 constitute a shift register. The operating clock CLK shown in FIG. 9 is fed at the clock input terminals of DFF30 to 32. The data output terminal Q of DFF30 is connected to the data input terminal D of DFF31 and also to the input terminal of OR5. The output terminal of OR5 is connected to the source of SW7 and the input terminal of OR6. The data output terminal Q of DFF31 is connected to the data input terminal D of DFF32 and also to the input terminal of OR7. The output terminal of OR6 is connected to the source of SW8 and the input terminal of OR7. The data output terminal Q of DFF32 is connected to the input terminal of OR7. The output terminal of OR7 is connected to the source of SW9. The drains of SW7 to SW10 are all connected to the output terminal SP2. The source of SW10 is grounded.

Figure 16:
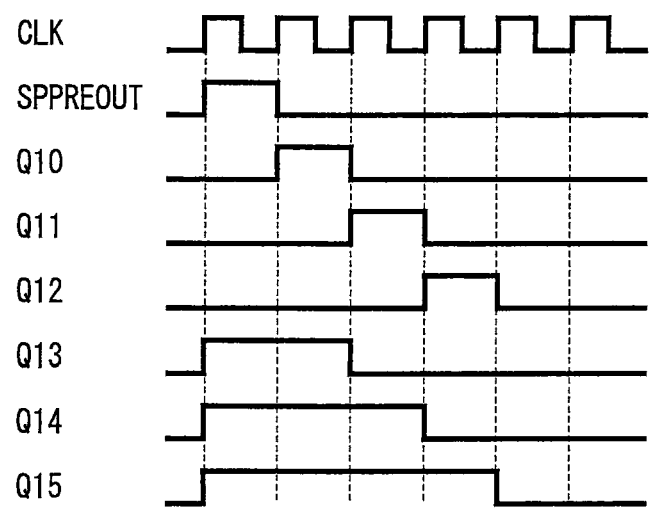
FIG. 16 is a timing chart illustrating signal outputs of the start signal generating circuit.

FIG. 16 represents output timings for the signal SPPRE-OUT at drain of SW5 or SW6, the signals Q10 to 12 from DFF30 to 32, and the signals Q13 to 15 from OR5 to 7 in the circuit configuration described above.

The output signal SPPREOUT is shifted by the shift register constituted by DFF30 to 32, producing the signals Q10, Q11, and Q12. The signal SPPREOUT and the signal Q10 are fed to OR5 where they are ORed to generate the signal Q13. The signal Q11 and the signal Q13 are fed to OR6 where they are ORed to generate the signal Q14. Similarly, the signal Q12 and the signal Q14 are fed to OR7 where they are ORed to generate the signal Q15. Accordingly, the signal Q13 has a HIGH width equal to 2 clock cycles, the signal Q14 has a HIGH width equal to 3 clock cycles, and the signal Q15 has a HIGH width equal to 4 clock cycles.

When the HIGH width of the start signal SP fed to the rise counter circuit 42 is equal to 1 clock cycle, the signal SELA is output, and SW7 is turned on. Therefore, the signal Q13 with a 2 clock cycle HIGH width is output at the output terminal SP2. When the HIGH width of the start signal SP is equal to 2 clock cycles, the signal SELB is output, and SW8 is turned on. Therefore, the signal Q14 with a 3 clock cycle HIGH width is output at the output terminal SP2. Similarly, when the HIGH width of the start signal SP is equal to 3 clock cycles, the signal SELC is output, and SW8 is turned on. Therefore, the signal Q15 with 4 clock cycle HIGH width is output at the output terminal SP2.

The present embodiment involves no more than four cascaded gate drivers 4. Therefore, when the HIGH width of the start signal SP is equal to 4 clock cycles, there is no need to output a signal at the output terminal SP2. Hence, when the signal SELD is output, and SW10 is turned on, no HIGH pulse is output because the source of SW10 is grounded.

Alternatively, a signal may be output at the output terminal SP2 even if the HIGH width of the start signal SP is equal to 4 clock cycles.

Figure 17:
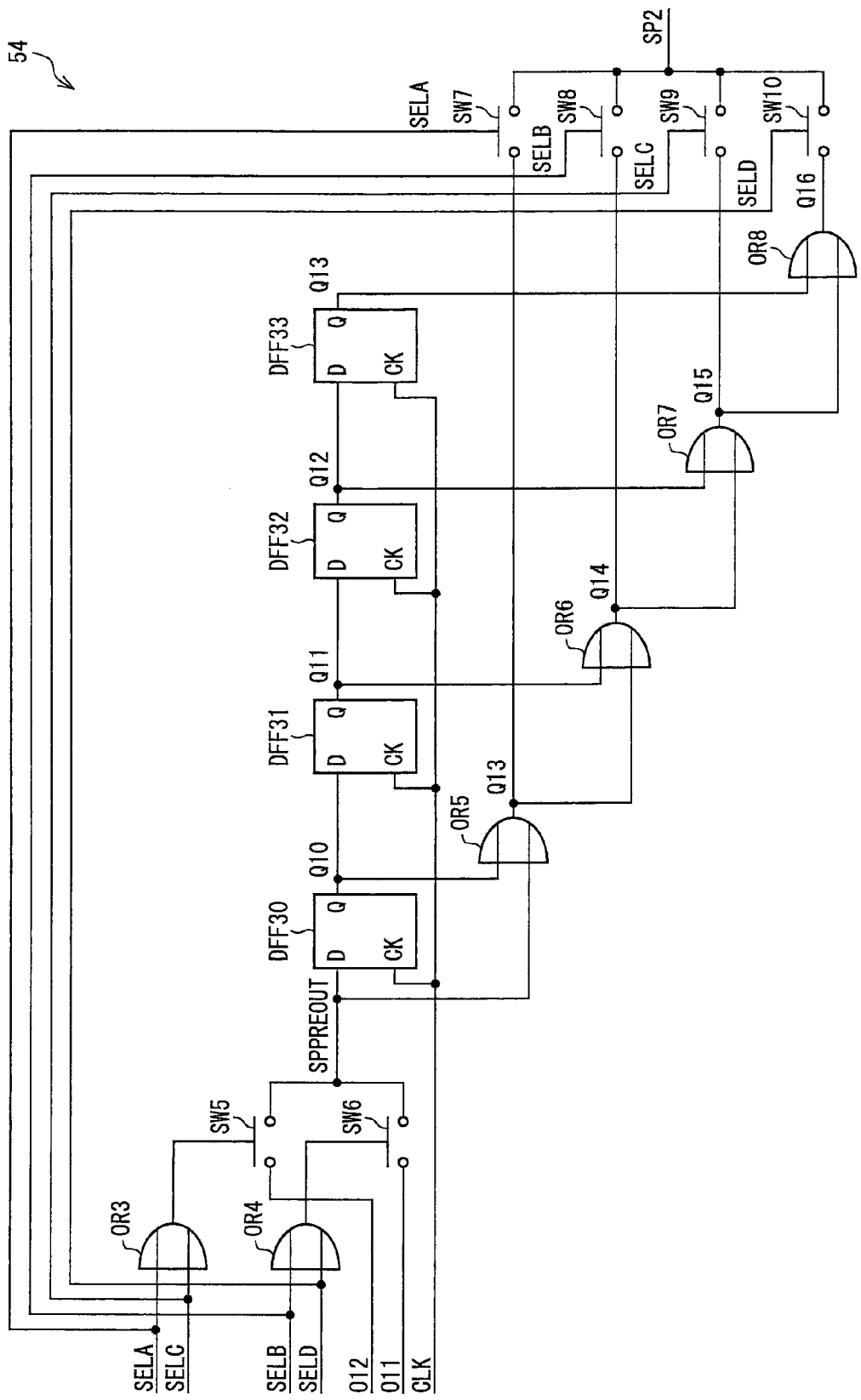
FIG. 17 is a circuit diagram depicting a variation of the start signal generating circuit.

FIG. 17 represents the circuit configuration of the start signal generating circuit 54. The start signal generating circuit 54 is a variation of the start signal generating circuit 44 shown in FIG. 15: DFF33 and OR8 are added, and the source of SW10 is connected to the output terminal of OR8. The data input terminal D of DFF33 receives the output signal Q12 from DFF32. The output signal Q13 at the data output terminal Q of DFF33 is fed to OR8. OR8 also receives the output signal Q15 from OR7 and outputs the signal Q16 at the source of SW 10. The signal Q16, being an OR of the signal Q13 and the signal Q15, has a HIGH width equal to 5 clock cycles. With no fifth stage in the cascade, the start signal SP output is neglected.

Alternatively, no signal SELD may be output to the start signal output circuit.

Figure 18:
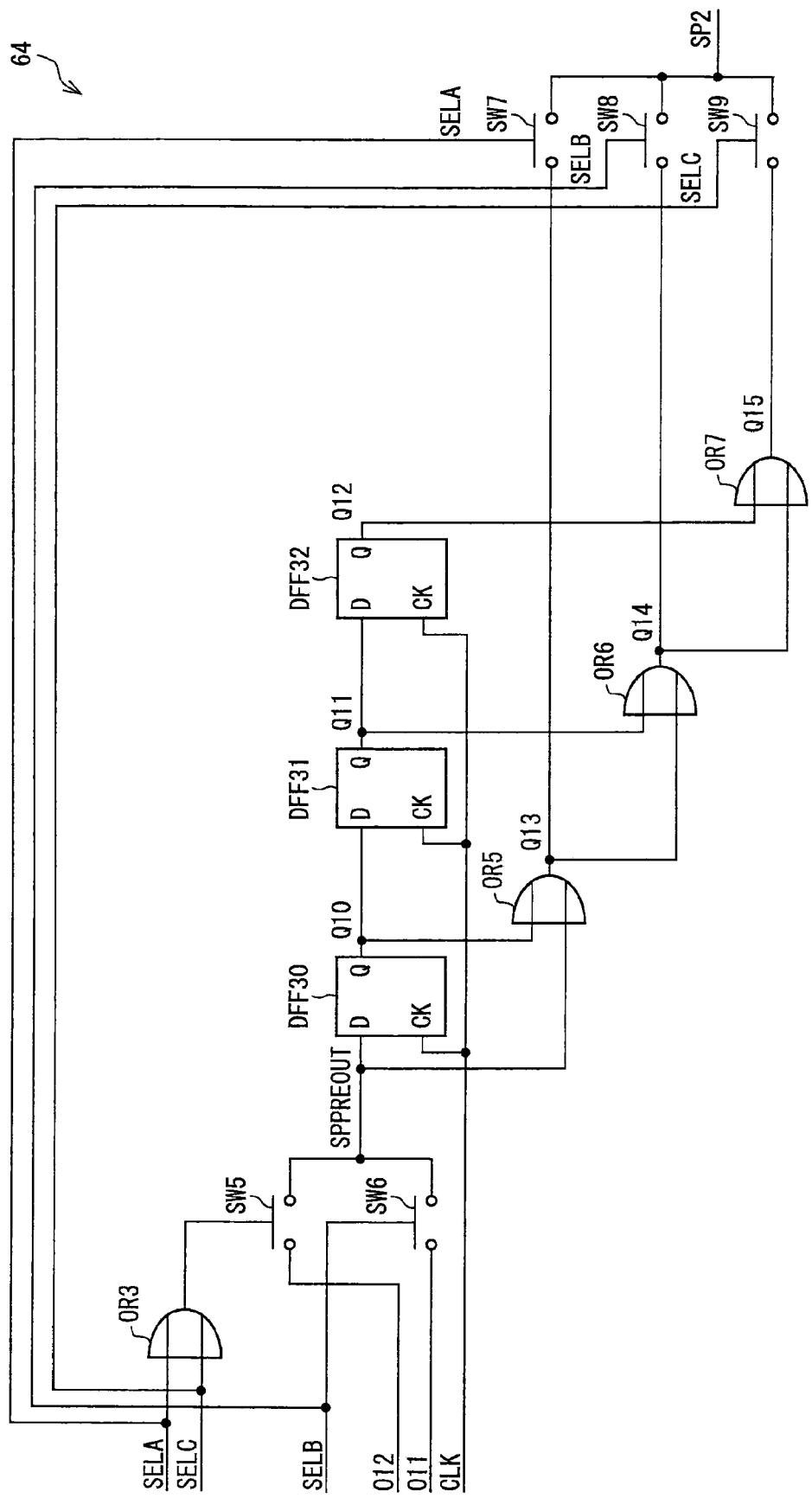
FIG. 18 is a circuit diagram depicting another variation of the start signal generating circuit.

FIG. 18 represents the circuit configuration of the start signal generating circuit 64. The start signal generating circuit 64 is a variation of the start signal generating circuit shown in FIG. 15: OR4 and SW10 are omitted. Consequently, the signal SELD is not fed to the start signal generating circuit 64. The signal SELD output of the rise counter circuit 42 is fed to the gate of SW6 directly without going through an OR gate. Accordingly, when the HIGH width of the start signal SP is equal to 4 clock cycles, SW7 to SW9 are all OFF. Therefore, similarly to the configuration shown in FIG. 15, no HIGH pulse is output at the output terminal SP2.

As described in the foregoing, the gate driver 4 each include the circuits shown in FIGS. 10, 12, 13, and 15 (or 17 and 18). The inclusion enables the gate drivers 4 to perform the interlaced driving shown in FIGS. 5 to 8.

In the present embodiment, if the rise count M of the operating clock CLK in a HIGH level period of the start signal SP is an odd number, the odd-numbered rows are sequentially scanned first, followed by the sequential scanning of the even-numbered rows; if the rise count M is an even number, the even-numbered rows are sequentially scanned first, followed by the sequential scanning of the odd-numbered rows. This is not the only possibility. Alternatively, if the rise count M is an odd number, the even-numbered rows may be sequentially scanned first, followed by the sequential scanning of the odd-numbered rows; if the rise count M is an even number, the odd-numbered rows may be sequentially scanned first, followed by the sequential scanning of the even-numbered rows.

This reverse sequence is achieved by the following specific circuit configuration. The signal input to OR1 and the signal input to OR2 are interchanged in the scan sequence setup circuit 43 shown in FIG. 12. In addition to that, the signal input to OR3 and the signal input to OR4 are interchanged in the start signal generating circuits 44, 54, 64 shown in FIGS. 15, 17, and 18. In other words, the signal SELB and the signal SELD are supplied to OR1 and OR3, and the signal SELA and the signal SELC are supplied to OR2 and OR4. This configuration provides such gate drivers that the even-numbered rows can be sequentially scanned first, followed by the scanning of the odd-numbered rows if the rise count M is an odd number, and the odd-numbered rows can be sequentially scanned first, followed by the scanning of the even-numbered rows if the rise count M is an even number.

Furthermore, the scan sequence may not set up according to whether the rise count M is an odd number or an even number. For example, if the rise count M is 1 or 2, the odd-numbered rows may be sequentially scanned first, followed by the sequential scanning of the even-numbered rows; if the rise count M is 3 or 4, the even-numbered rows may be sequentially scanned first, followed by the sequential scanning of the odd-numbered rows. This sequence is achieved by setting the rise count N of the operating clock CLK in a HIGH level period of the start signal SP to 3 for input to the succeeding stage if the rise count M is 1, setting the rise count N to 4 if the rise count M is 2, and setting the rise count N to 2 if the rise count M is 3. The settings enables the first- and third-stage gate drivers to sequentially scan the odd-numbered rows and then the even-numbered rows and enables the second- and fourth-stage gate drivers to sequentially scan the even-numbered rows and then the odd-numbered rows. The settings thus enables the interlaced driving shown in FIGS. 7 and 8.

This operation is achieved by the following circuit configuration. The configuration in FIG. 12 is changed so that the signal SELA and the signal SELB can be supplied to OR1, and the signal SELC and the signal SELD can be supplied to OR2. In FIG. 15, the configuration is changed so that the signal SELA can be supplied to the gates of OR3 and SW8, the signal SELB can be supplied to the gates of OR3 and SW9, the signal SELC can be supplied to the gates of OR4 and SW7, and the signal SELD can be supplied to the gates of OR4 and SW10.

If the rise count M is equal to the rise count N, the preceding-stage gate driver and the succeeding-stage gate driver perform the same operation. Therefore, the rise count M must not be equal to the rise count N.

Suitably adjusting the relationship between the rise count M and the scan sequence and the relationship between the rise count M and the rise count N as in the above examples allows alternate cascading of a gate driver which sequentially scans the odd-numbered rows and then the even-numbered rows and a gate driver which sequentially scans the even-numbered rows and then the odd-numbered rows.

Figure 39:
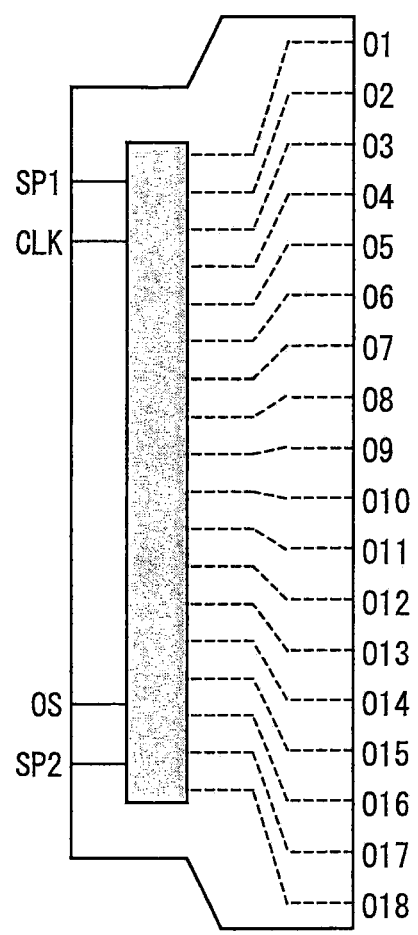
FIG. 39 is a schematic illustration of the configuration of the gate driver shown in FIG. 38.
Figure 40:
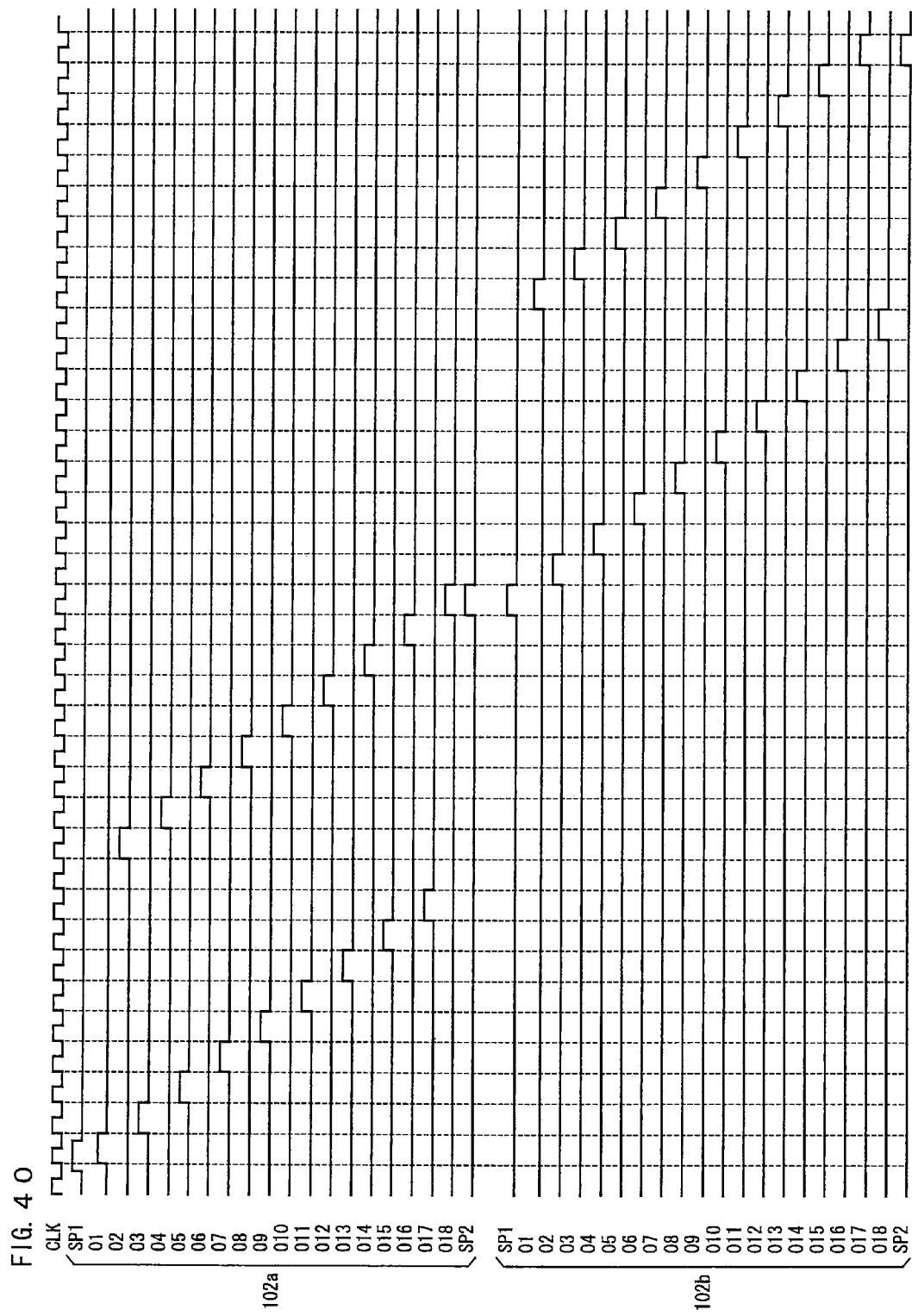
FIG. 40 is a timing chart illustrating scan signal outputs (driving waveforms) from the gate driver shown in FIG. 39.

In none the configurations of the present embodiment, the gate drivers need to include the switching terminal OS shown in FIG. 39. The configurations thus require less wiring, etc., hence substrates of smaller size and less manufacturing cost.

The manufacturing cost of an integrated circuit generally increases with an increasing chip area. The transistors and other components for the circuitry by which the rise counter circuit 42, the scan sequence setup circuit 43, and the start signal generating circuit 44 are implemented are very small in size. These circuits, even if provided in the gate drivers 4, require no additional chip area or, where necessary at all, a very small additional area. Therefore, the rise counter circuit 42, the scan sequence setup circuit 43, and the start signal generating circuit 44 can be provided with almost zero extra cost. The resultant cost is kept to a minimum in comparison to the cost of conventional configurations.

Each configuration described in the present embodiment contains four cascaded gate drivers 4. Instead, the cascade may include two or three of them. Making changes to the integrated circuit acting as the gate drivers 4 inevitably requires modification to the mask used in manufacture, which would result in additional cost. In the present embodiment, however, changing the number of gate drivers in the cascade does not require no modification to the circuit configuration of the gate drivers 4. High volume production of identical gate drivers can further restrict the manufacturing cost.

Embodiment 2

The following will describe another embodiment of the present invention in reference to FIGS. 19 to 25.

In embodiment 1, there were provided four gate drivers 4, and the screen was split into four divisions to perform interlaced driving. In contrast, the present embodiment will describe a configuration in which the number of divisions into which the screen is split is greater than the number of gate drivers mounted, i.e., a configuration in which the number of scan units in which the odd-numbered rows and the even-numbered rows are scanned once is greater than the number of gate drivers mounted.

Figure 19:
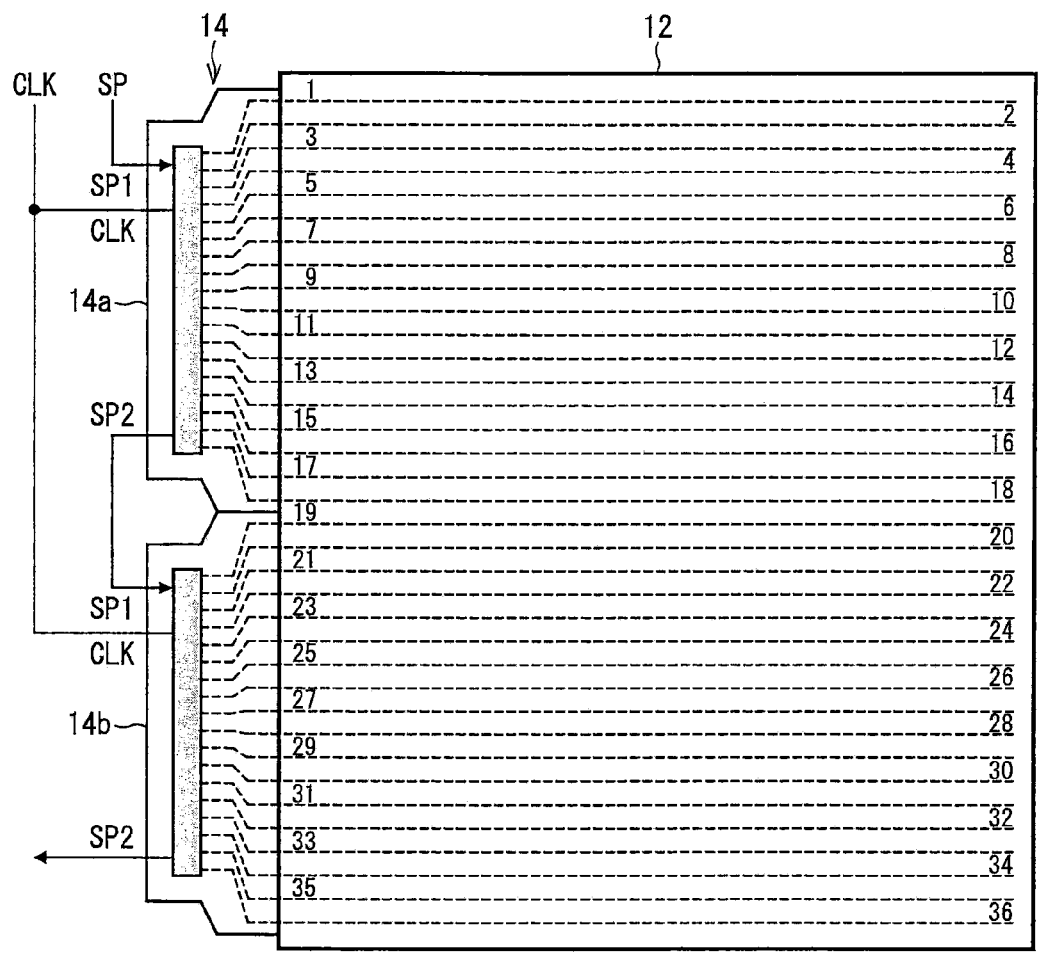
FIG. 19 is a schematic illustration of other gate drivers in accordance with the present invention being mounted to a liquid crystal panel.
Figure 38:
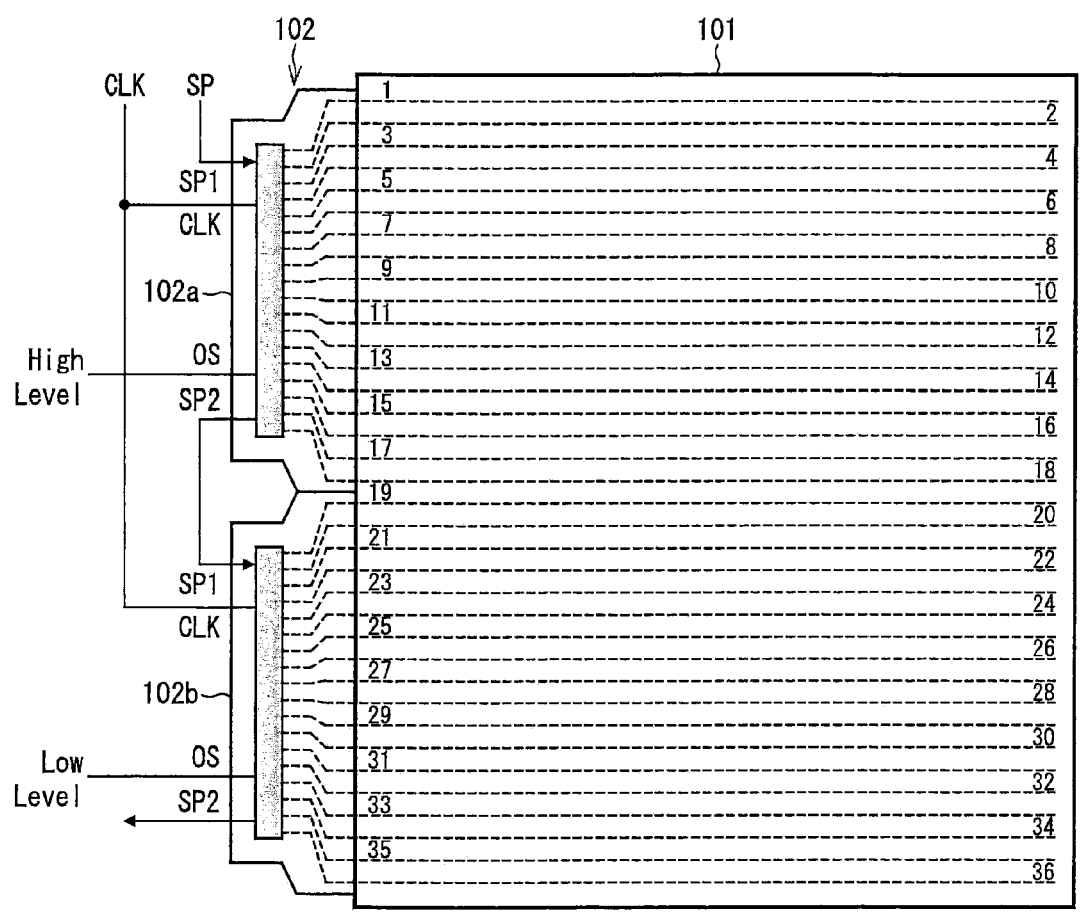
FIG. 38 is a schematic illustration of conventional gate drivers being mounted to a liquid crystal panel.

FIG. 19 illustrates two gate drivers 14 being mounted to a liquid crystal panel 12. The liquid crystal panel 12 includes 36 scan signal lines 1 to 36 similarly to the liquid crystal panel 101 shown in FIG. 38. The two gate drivers 14 are cascaded and similarly to the gate drivers 4 in accordance with embodiment 1, need no switching terminal OS to switch between interlaced driving scan sequences. Scan sequences are switched using HIGH width of the start signal SP fed at the terminal SP1. For convenience, the first-stage gate driver will be referred to as the gate driver 14a, and the second-stage gate driver 14 as the gate driver 14b.

Figure 20:
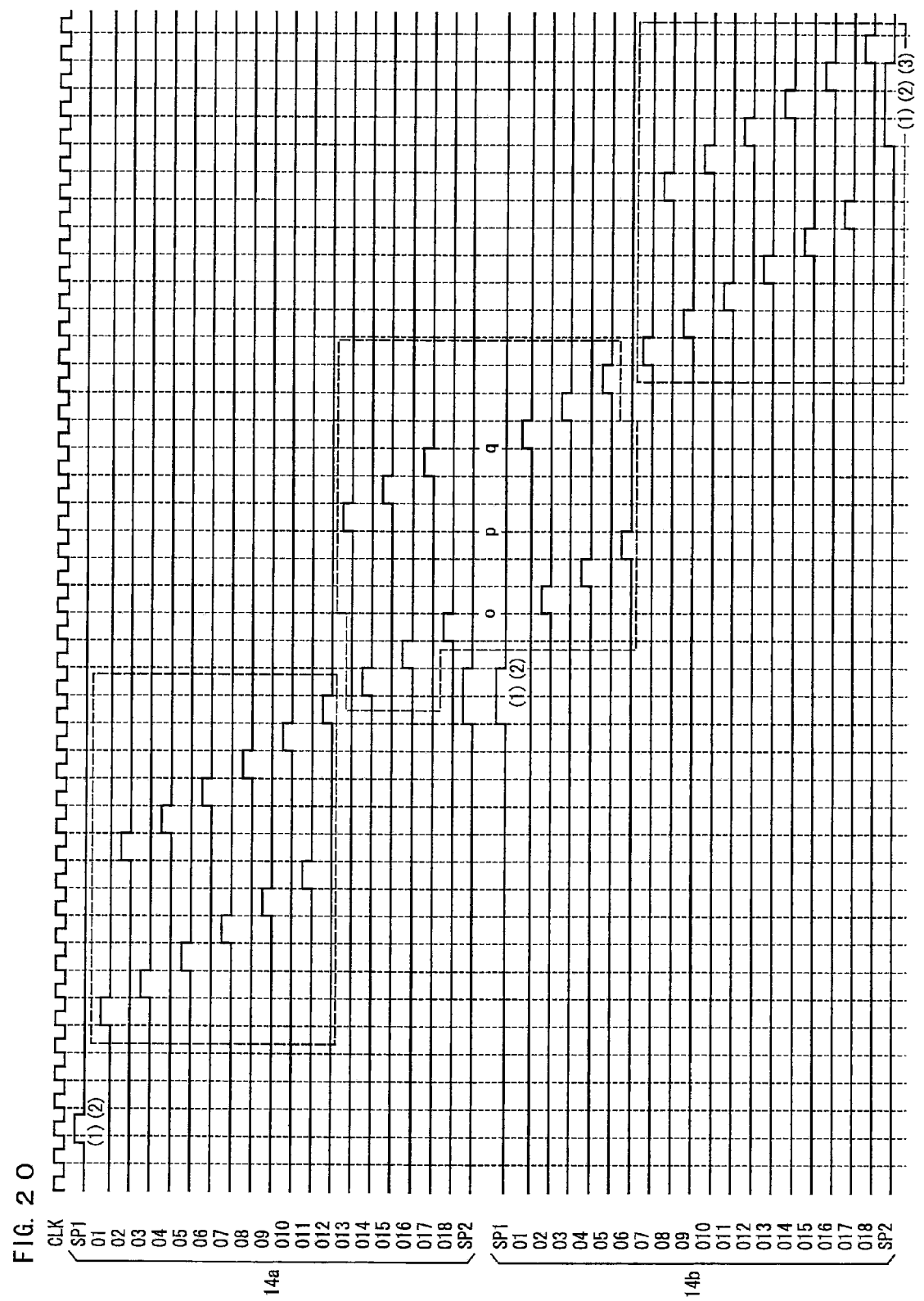
FIG. 20 is a timing chart illustrating interlaced driving by two of the other gate drivers being cascaded.

FIG. 20 illustrates the interlaced driving implemented by the two gate drivers 14a and 14b. As indicated by three broken lines, the gate drivers 14a and 14b perform interlaced driving by splitting the liquid crystal panel 12 into three divisions.

Specifically, since the rise count M of the operating clock CLK in a HIGH level period of the start signal SP fed at the terminal SP1 of the gate driver 14a is one, the gate driver 14a starts output at the odd-numbered drive terminal O1. The gate driver 14a outputs the scan signal at the odd-numbered drive terminals up to O11 and then outputs the scan signal sequentially at the even-numbered drive terminals O2 to O12, which rounds up the scanning of the first of the three divisions. The gate driver 14a, simultaneously with its output of the scan signal at O12, transmits a start signal SP with a 2 clock cycle HIGH width from the terminal SP2 to the terminal SP1 of the gate driver 14b.

The second screen division is scanned by the two gate drivers 14a and 14b. As the gate driver 14a outputs the scan signal at the even-numbered drive terminals O14 to O18, the gate driver 4a temporarily suspends the scanning. The gate driver 14b subsequently starts outputting the scan signal at the even-numbered drive terminal O2. The gate driver 14b outputs the scan signal at up to O6, thereby temporarily suspending the scanning. Then, the gate driver 4a outputs the scan signal again sequentially at the odd-numbered drive terminals O13, O15, and O17, which terminates the scanning by the gate driver 14a. Subsequently, the gate driver 14b again starts outputting the scan signal at the odd-numbered drive terminal O1. As the gate driver 14b outputs the scan signal at O5, the gate driver 14b terminates its scanning of the second screen division.

Subsequently, to scan the third screen division, the gate driver 14b outputs the scan signal at the odd-numbered drive terminals O7 to O17 and then at the even-numbered drive terminals O8 to O18. The gate driver 14b, simultaneously with its output of the scan signal at O12, transmits a start signal SP with a 3 clock cycle HIGH width from the terminal SP2 to the terminal SP1 of the gate driver 14b.

The two gate drivers 14a and 14b performs the scanning in this manner, thereby enabling interlaced driving of the three screen divisions. Since the number of divisions into which the screen is split is greater than the number of gate drivers mounted, the configuration produces high quality displays with less visible flickering than the configuration of embodiment 1.

An increased number of gate drivers would add to the number of components and assembly cost of the liquid crystal display device. In contrast, the present embodiment requires fewer gate drivers to drive the same number of screen divisions than the configuration, as in embodiment 1, where there is provided a different gate driver for each division. Therefore, the manufacturing cost of the liquid crystal display device can be restricted.

Now, a specific circuit configuration for the gate drivers 14 will be described in reference to FIGS. 21 to 25.

Figure 21:
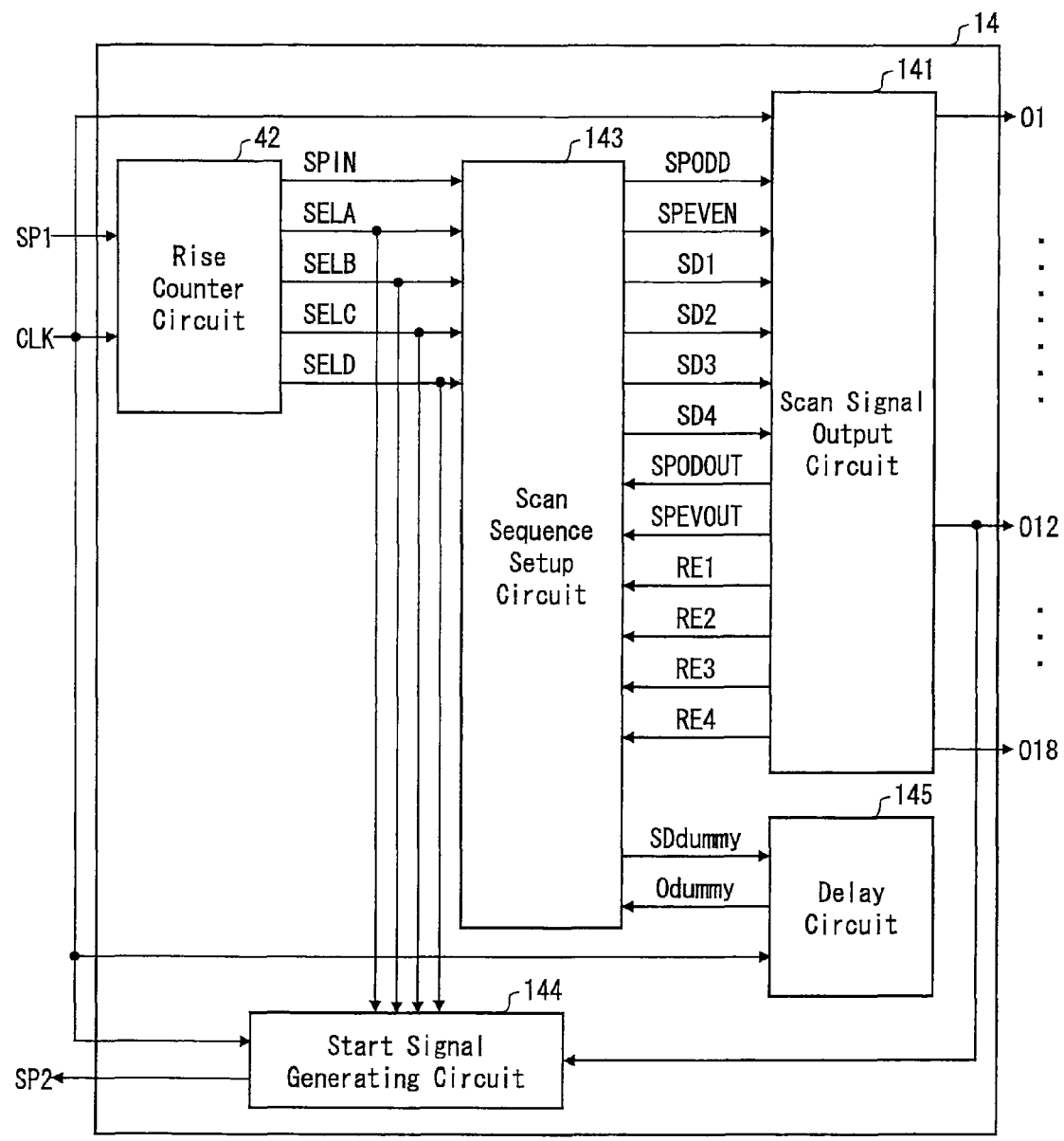
FIG. 21 is a block diagram depicting the configuration of a major part of the gate driver.

FIG. 21 is a block diagram depicting the configuration of the gate driver 14. The gate driver 14 includes a scan signal output circuit 141, a rise counter circuit 42, a scan sequence setup circuit 143, a start signal generating circuit 144, and a delay circuit 145.

The scan signal output circuit 141 generates a scan signal for output at the output terminals O1 to O18 (see FIG. 4) of the gate driver 4.

The rise counter circuit 42, having the same configuration as the rise counter circuit 42 shown in FIG. 9, senses the rise count M of the operating clock CLK in a HIGH level period of the start signal SP fed at the terminal SP1 of the gate driver 14. The scan sequence setup circuit 143 decides a scan sequence to be followed by the scan signal output circuit 141 from the rise count M sensed by the rise counter circuit 42.

The start signal generating circuit 144 generates the start signal SP for output at the terminal SP2 of the gate driver 14, similarly to the start signal generating circuit 44 shown in FIG. 9. The rise count N of the operating clock CLK in a HIGH level period of the start signal SP output from the start signal generating circuit 144 is M+1.

The delay circuit 145 holds the interlaced driving by the gate driver 14 throughout the scanning by the succeeding-stage gate driver 14, i.e., from the temporary suspension to the restarting of the scanning by the gate driver 14 of interest. In other words, the delay circuit 145 delays the scanning by the gate driver 14 for periods "o" to "p" and "p" to "q" shown in FIG. 20, each 3 clock cycle long. The delay circuit 145 receives a signal SDdummy from the scan sequence setup circuit 143. Meanwhile, the scan sequence setup circuit 143 receives a signal Odummy from the delay circuit 145.

The operating clock CLK fed at the terminal CLK of the gate driver 14 is supplied to the scan signal output circuit 141, the rise counter circuit 42, the start signal generating circuit 144, and the delay circuit 145. The start signal SP fed at the terminal SP1 of the gate driver 14 is supplied to the rise counter circuit 42.

The rise counter circuit 42 outputs a signal SPIN to the scan sequence setup circuit 143 and also outputs signals SELA, SELB, SELC, and SELD to the scan sequence setup circuit 143 and the start signal generating circuit 144.

The scan sequence setup circuit 143 outputs six signals SPODD, SPEVEN, and SD1 to SD4 to the scan signal output circuit 141. Meanwhile, the scan signal output circuit 141 outputs six signals SPODOUT, SPEVOUT, and RE1 to RE4 to the scan sequence setup circuit 143.

The scan signal output circuit 141 is connected to the output terminals O1 to O18 similarly to the scan signal output circuit 41 shown in FIG. 9. The lines connected to the output terminal O12 are connected also to the start signal generating circuit 144. This means that as a scan signal is output at the output terminal O12, a HIGH pulse is supplied simultaneously to the start signal generating circuit 144.

The scan signal output circuit 141, upon receiving the signal SPODD, outputs a scan signal first at the odd-numbered drive terminal O1 similarly to the interlaced driving performed by the gate driver 14a in FIG. 20 and upon receiving the signal SPEVEN, outputs a scan signal first at the odd-numbered drive terminal O2 similarly to the interlaced driving performed by the gate driver 14b in FIG. 20.

The following will describe a specific circuit configuration for the scan sequence setup circuit 143, the scan signal output circuit 141, and the delay circuit 145. The rise counter circuit 42 is identical to the circuitry shown in FIG. 10, and its description is omitted.

Figure 22:
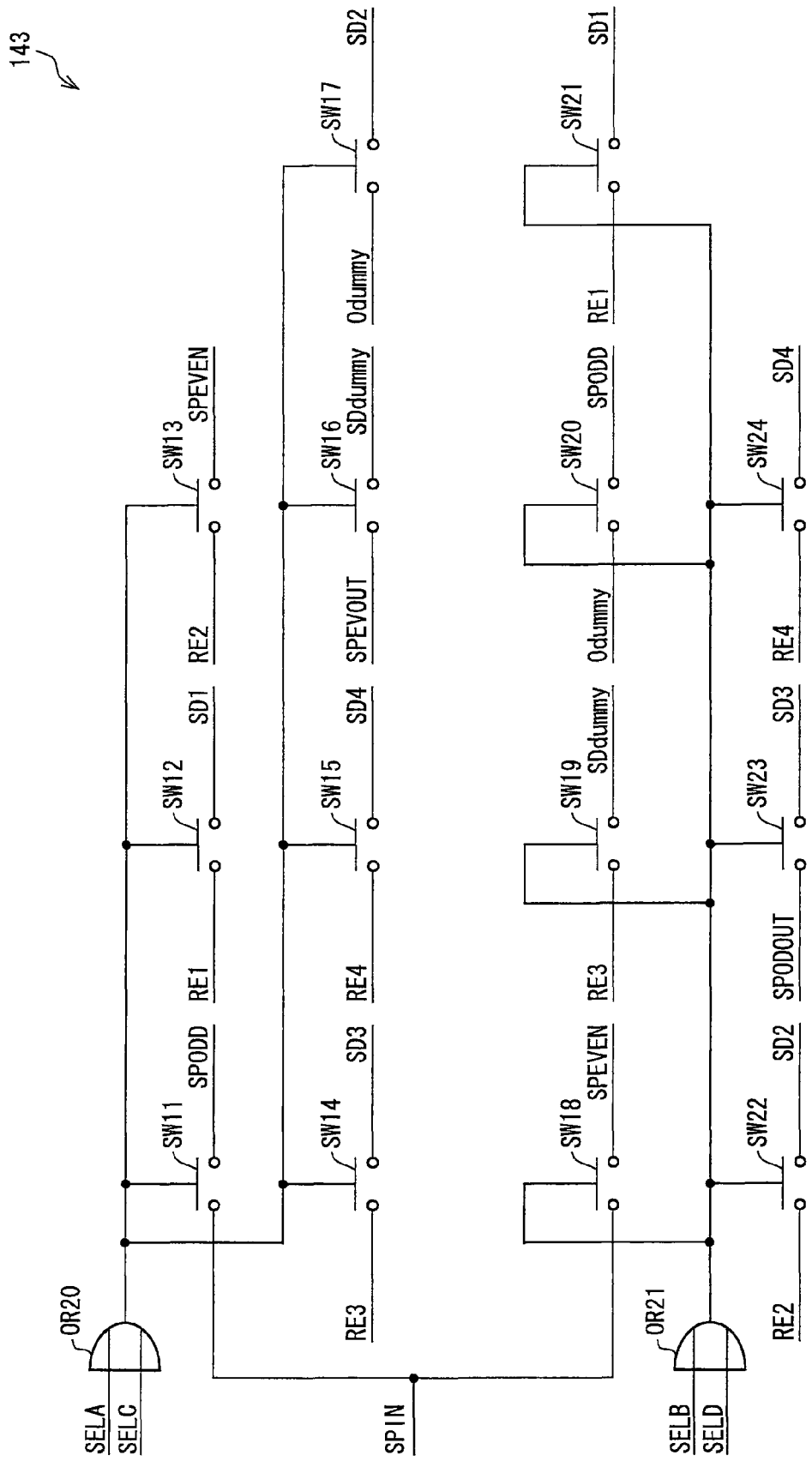
FIG. 22 is a circuit diagram depicting a specific configuration of a scan sequence setup circuit in the gate driver.

FIG. 22 depicts a specific circuit configuration for the scan sequence setup circuit 143. The scan sequence setup circuit 143 includes two OR gates (OR20, 21) and 15 switches (SW11 to 24). OR20 receives the signal SELA and the signal SELC from the rise counter circuit 42. OR21 receives the signal SELB and the signal SELD from the rise counter circuit 42. The output terminal of OR20 is connected to the gates of SW to SW17. The output terminal of OR21 is connected to the gates of SW18 to SW24.

Accordingly, when the HIGH width of the start signal SP detected by the rise counter circuit 42 is equal to 1 clock cycle or 3 clock cycles, SW to SW17 turn on; and when the HIGH width of the start signal SP is equal to 2 clock cycles or 4 clock cycles, SW18 to SW24 turn on.

The signal SPIN from the rise counter circuit 42 is fed at the sources of SW11 and SW 18.

Figure 23:
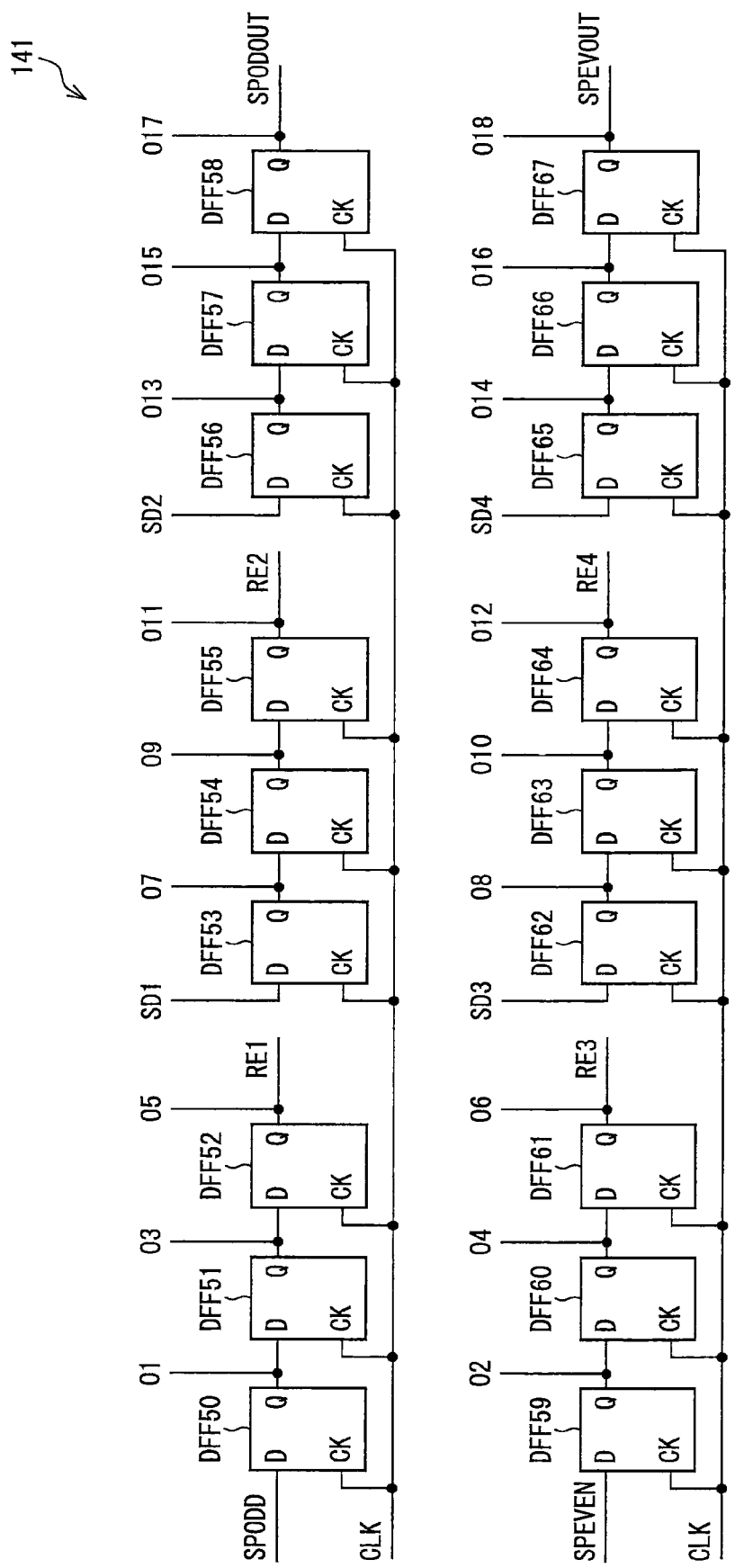
FIG. 23 is a circuit diagram depicting a specific configuration of a scan signal output circuit in the gate driver.

FIG. 23 depicts a specific circuit configuration for the scan signal output circuit 141. The scan signal output circuit 141 includes 18 DFF50 to 67. DFF50 to 52, DFF53 to 55, DFF56 to 58, DFF59 to 61, DFF50 to 52, DFF62 to 64, and DFF65 to 67 constitute respective 3-stage shift registers. The operating clock CLK is supplied at the clock input terminals CK of DFF50 to 67.

Figure 24:
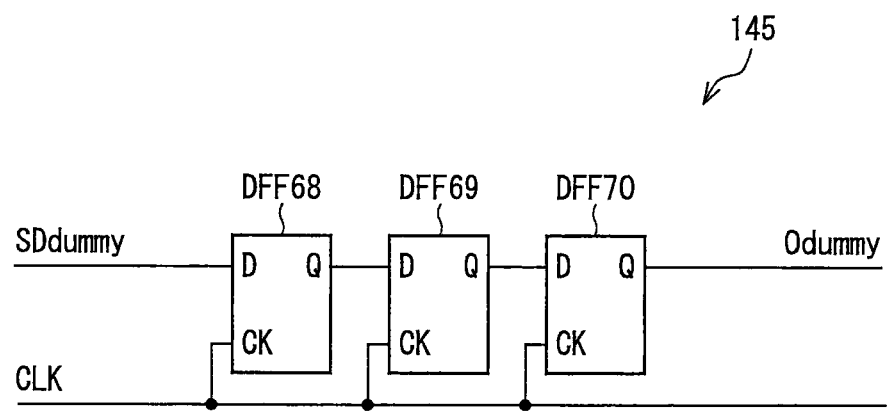
FIG. 24 is a circuit diagram depicting a specific configuration of a delay circuit in the gate driver.

FIG. 24 depicts a specific circuit configuration for the delay circuit 145. The delay circuit 145 includes DFF68 to 70 constituting a 3-stage shift register. The operating clock CLK is supplied at the clock input terminals CK of DFF68 to 70.

The shift registers constituted respectively by DFF50 to 52, DFF53 to 55, and DFF56 to 58 outputs a scan signal for driving the scan signal lines in the odd-numbered rows. The data output terminals Q of DFF50, 51, 53, 54, 56, 57 are connected to the data input terminal D of succeeding-stage DFF and also to the respective output terminals O1, O3, O7, O9, O13, O15. The data input terminal D of first-stage DFF50 is connected to the drains of SW11 and SW20 of the scan sequence setup circuit 143 (FIG. 22) to receive the signal SPODD.

The data output terminal Q of DFF52 is connected to the output terminal O5 and the sources of SW12 and SW21 in the scan sequence setup circuit 143 to feed a signal RE1 at the sources of SW12 and SW21. The drains of SW12 and SW21 are connected to the data input terminal D of DFF53 so that the data input terminal D of DFF53 can receive the signal SD 1.

The data output terminal Q of DFF55 is connected to the output terminal O11 and the sources of SW13 and SW22 in the scan sequence setup circuit 143 to feed a signal RE2 at the sources of W13 and SW22. The drain of SW13 is connected to the drain of SW18 and also to the data input terminal D of DFF59 so that the data input terminal D of DFF59 can receive the signal SPEVEN.

The data output terminal Q of DFF61 is connected to the output terminal O6 and the sources of SW14 and SW19 in the scan sequence setup circuit 143 to feed a signal RE3 at the sources of SW14 and SW19. The drain of SW14 is connected the drain of SW23 and also to the data input terminal D of DFF62 so that the data input terminal D of DFF62 can receive the signal SD3.

The data output terminal Q of DFF64 is connected to the output terminal O12 and the sources of SW15 and SW24 in the scan sequence setup circuit 143 to feed a signal RE4 at the sources of SW15 and SW24. The drain of SW15 is connected to the drain of SW24 and also to the data input terminal D of DFF65 so that the data input terminal D of DFF65 can receive the signal SD4.

The data output terminal Q of DFF67 is connected to the output terminal O18 and the source of SW16 in the scan sequence setup circuit 143 to feed the signal SPEVOUT at the source of SW16. The drain of SW16 is connected to the drain of SW19 and also to the data input terminal D of DFF68 in the delay circuit 145 (FIG. 24) to feed the signal SDdummy to the data input terminal D of DFF68.

The data output terminal Q of DFF70 is connected the sources of SW17 and SW20 in the scan sequence setup circuit 143 to feed the signal Odummy at the sources of SW17 and SW20. The drain of SW17 is connected to the drain of SW22 and also to the data input terminal D of DFF56 to feed the signal SD2 to the data input terminal D of DFF56.

The data output terminal Q of DFF58 is connected to the output terminal O17 and the source of SW23 in scan sequence setup circuit 143 to feed the signal SPODOUT at the source of SW23. The drain of SW23 is connected to the drain of the drain of SW14 and also to the data input terminal D of DFF62 to feed the signal SD3 to the data input terminal D of DFF62.

Figure 25:
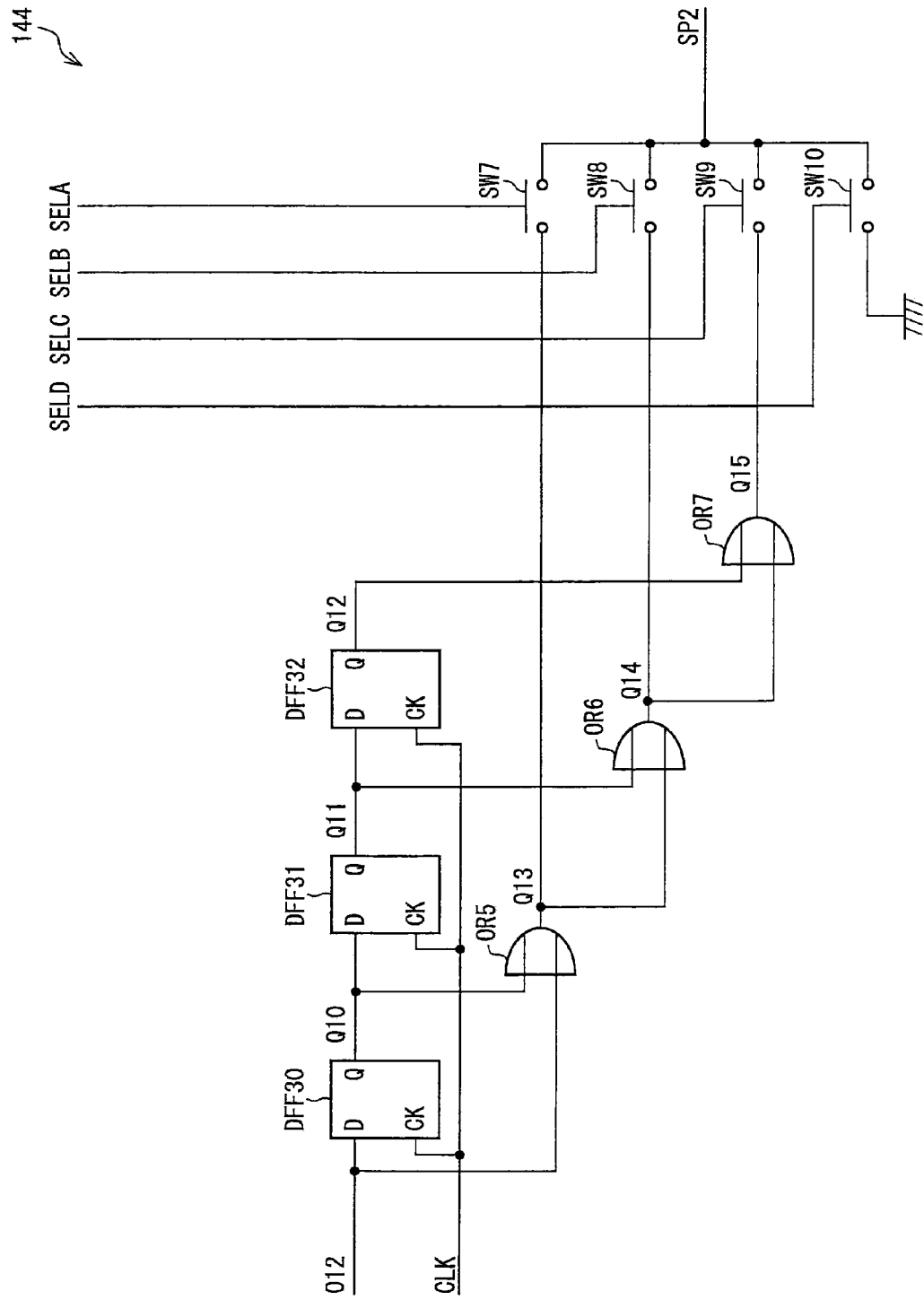
FIG. 25 is a circuit diagram depicting a specific configuration of a start signal generating circuit in the gate driver.

FIG. 25 depicts a specific circuit configuration for the start signal generating circuit 144. The start signal generating circuit 144 has the same configuration as the start signal generating circuit 44 shown in FIG. 15, except that OR3, OR4, SW5, and SW6 are omitted. The signals SELA, SELB, SELC, and SELD from the rise counter circuit 42 are supplied to SW7, SW8, SW9, and SW10 respectively. The output signal of DFF64 shown in FIG. 23 is fed at the data input terminal D of DFF30.

In this configuration, when a start signal SP in a HIGH level period of which the operating clock CLK rises once is fed at the terminal SP1 of the gate driver 14, the rise counter circuit 42 (see FIG. 10) outputs the signal SPIN and the signal SELA to the scan sequence setup circuit 143. That turns on SW to SW17 in the scan sequence setup circuit 143 (FIG. 22). The signal SPIN is fed to SW11, causing the signal SPODD to be fed to DFF50 in the scan signal output circuit 141 (FIG. 23) and a scan signal to be output at the odd-numbered drive terminals O1, O3, and O5. As the scan signal is output at O5, the signal RE1 is supplied from DFF52 to SW12 in the scan sequence setup circuit 143, and the signal SD1 is supplied from DFF52 to DFF53. Accordingly, the scan signal is output at the odd-numbered drive terminals O7, O9, and then O11. The data output terminal Q of DFF52 is also connected to SW21 which is, however, OFF. As the scan signal is output at O11, the signal RE2 is supplied from DFF55 to SW13 in the scan sequence setup circuit 143, and the signal SPEVEN is supplied from DFF55 to DFF59. Accordingly, the scan signal is output at the even-numbered drive terminals O2, O4, and O6. As the scan signal is output at O6, the signal RE3 is supplied from DFF61 to SW14 in the scan sequence setup circuit 143, and the signal SD3 is supplied from DFF61 to DFF62. Accordingly, the scan signal is output at the even-numbered drive terminals O8, O10, and O12. As the scan signal is output at O12, the signal RE4 is supplied from DFF64 to SW15 in the scan sequence setup circuit 143, and the signal SD4 is supplied from DFF64 to DFF65. Accordingly, the scan signal is output at the even-numbered drive terminals O14, O16, and O18. As the scan signal is output at O18, the signal SPEVOUT is supplied from DFF67 to SW16 in the scan sequence setup circuit 143, and the signal SDdummy is supplied from DFF67 to DFF68 in the delay circuit 145 (FIG. 24).

After a 3 clock cycle period ("o" to "p" period in FIG. 20) has passed, the signal Odummy is supplied from DFF70 to SW17 in the scan sequence setup circuit 143, and the signal SD2 is supplied to DFF56. Accordingly, the scanning of the odd-numbered rows is started again, causing the scan signal to be output at the odd-numbered drive terminals O13, O15, and O17. As the scan signal is output at O17, the signal SPODOUT is supplied from DFF58 to SW23 in the scan sequence setup circuit 143. Since SW23 is OFF, however, the signal SPODOUT is neglected, and the gate driver 14 stops scanning until the start signal SP is received.

Furthermore, since the rise count M is 1, the signal SELA is supplied to the start signal generating circuit 144 (see FIG. 25), turning on SW7. Accordingly, as the scan signal is output at O12, the start signal SP with a 2 clock cycle HIGH width is output at the terminal SP2.

In contrast, when a start signal SP for which the rise count M is 2 is fed at the terminal SP1 of the gate driver 14, the rise counter circuit 42 outputs the signal SPIN and the signal SELB to the scan sequence setup circuit 143. That turns on SW18 to SW24 in the scan sequence setup circuit 143. As the signal SPIN is fed to SW18, the signal SPEVEN is fed to DFF59 in the scan signal output circuit 141, and the scan signal is output at the even-numbered drive terminals O2, O4, and O6. As the scan signal is output at O6, the signal RE3 is supplied from DFF61 to SW19 in the scan sequence setup circuit 143, and the signal SDdummy is supplied from DFF61 to DFF68 in the delay circuit 145. The signal RE3 is supplied also to SW14 which however is OFF.

After a 3 clock cycle period ("p" to "q" period in FIG. 20) has passed, the signal Odummy is supplied from DFF70 to SW20 in the scan sequence setup circuit 143, and the signal SPODD is supplied to DFF50. Accordingly, the scan signal is output at the odd-numbered drive terminals O1, O3, and O5. As the scan signal is output at O5, the signal RE1 is supplied from DFF52 to SW21 in the scan sequence setup circuit 143, and the signal SD1 is supplied from DFF52 to DFF53. Accordingly, the scan signal is output at the odd-numbered drive terminals O7, O9, and O11. As the scan signal is output at O11, the signal RE2 is supplied from DFF55 to SW22 in the scan sequence setup circuit 143, and the signal SD2 is supplied from DFF55 to DFF56. Accordingly, the scan signal is output at the odd-numbered drive terminals O13, O15, and then O17. As the scan signal is output at O17, the signal SPODOUT is supplied from DFF58 to SW23 in the scan sequence setup circuit 143, and the signal SD3 is supplied from DFF58 to DFF62. Accordingly, the scanning of the even-numbered rows is started again, causing the scan signal to be output at the even-numbered drive terminals O8, O10, and O12. As the scan signal is output at O12, the signal RE4 is supplied from DFF64 to SW24 in the scan sequence setup circuit 143, and the signal SD4 is supplied from DFF64 to DFF65. Accordingly, the scan signal is output at the even-numbered drive terminals O14, O16, and O18. As the scan signal is output at O18, the signal SPEVOUT is supplied from DFF67 to SW16 in the scan sequence setup circuit 143. Since SW16 is OFF, however, the signal SPEVOUT is neglected, and the gate driver 14 stops scanning until the start signal SP is received.

Furthermore, since the rise count M is 2, the signal SELB is supplied to the start signal generating circuit 144, turning on SW8. Accordingly, as the scan signal is output at O12, the start signal SP with a 3 clock cycle HIGH width is output at the terminal SP2.

As described in the foregoing, the interlaced driving shown in FIG. 20 can be performed by driving the gate drivers 14a and 14b. Since the number of screen divisions is greater than the number of gate drivers 14, the configuration produces images with less flickering than the configuration where the number of screen divisions is equal to the number of gate drivers. In addition, the configuration lowers the number of components and thus restricts the assembly cost of the display device.

Embodiment 3

The following will describe another embodiment of the present invention in reference to FIGS. 26 to 32.

In embodiment 2, there were provided two gate drivers 4, and the screen was split into three division to perform interlaced driving. This setting of the number of divisions into which the screen is split to a value greater the number of gate drivers mounted enables production of high quality images with limited flickering. On the other hand, an increased number of divisions into which the screen is split entails an increased number of polarity inversions. That in turn increases the frequency of charging/discharging in the source drivers, thus increases power consumption. Therefore, to give priority to restriction of current consumption rather than image quality, the screen does not need to be split in many divisions. The present embodiment will describe a configuration where the number of divisions into which the screen is split is less than the number of gate drivers mounted, i.e., a configuration where the number of scan units in which the odd-numbered rows and the even-numbered rows are scanned once is less than the number of gate drivers mounted.

Figure 26:
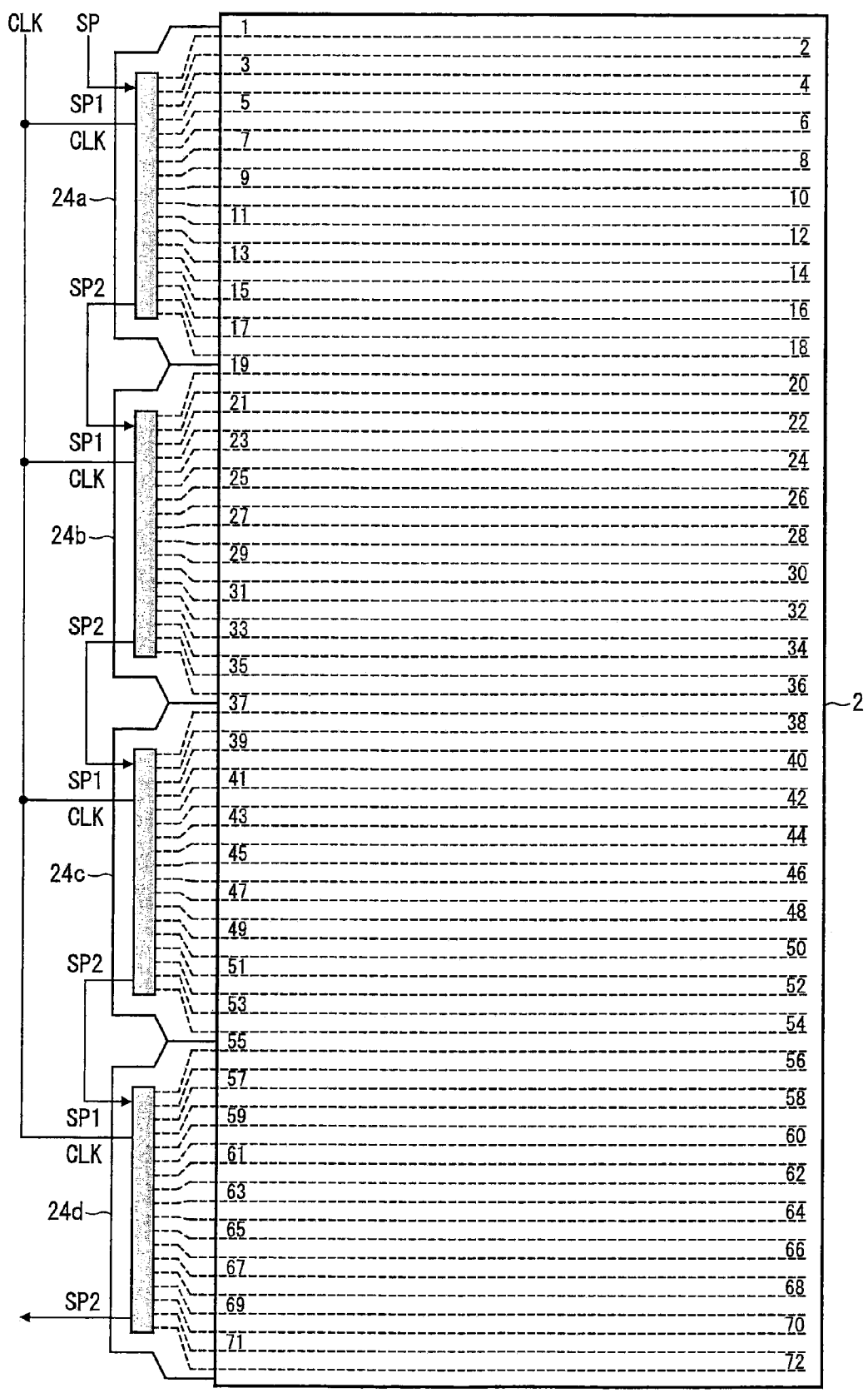
FIG. 26 is a schematic illustration of other gate drivers in accordance with the present invention being mounted to a liquid crystal panel.

FIG. 26 illustrates two gate drivers 24 being mounted to a liquid crystal panel 2. The liquid crystal panel 2 includes 72 scan signal lines 1 to 72 similarly to the liquid crystal panel 101 shown in FIG. 4. In other words, each screen division has 72/3=24 scan signal lines. The four gate drivers are cascaded and similarly to the gate drivers 4 in accordance with embodiment 1, needs no switching terminal OS to switch between interlaced driving scan sequences. Scan sequences are switched using the HIGH width of the start signal SP fed at the terminal SP1. For convenience, the first- to fourth-stage gate drivers 24 will be referred to as the gate drivers 24a, 24b, 24c, 24d respectively.

Figure 27:
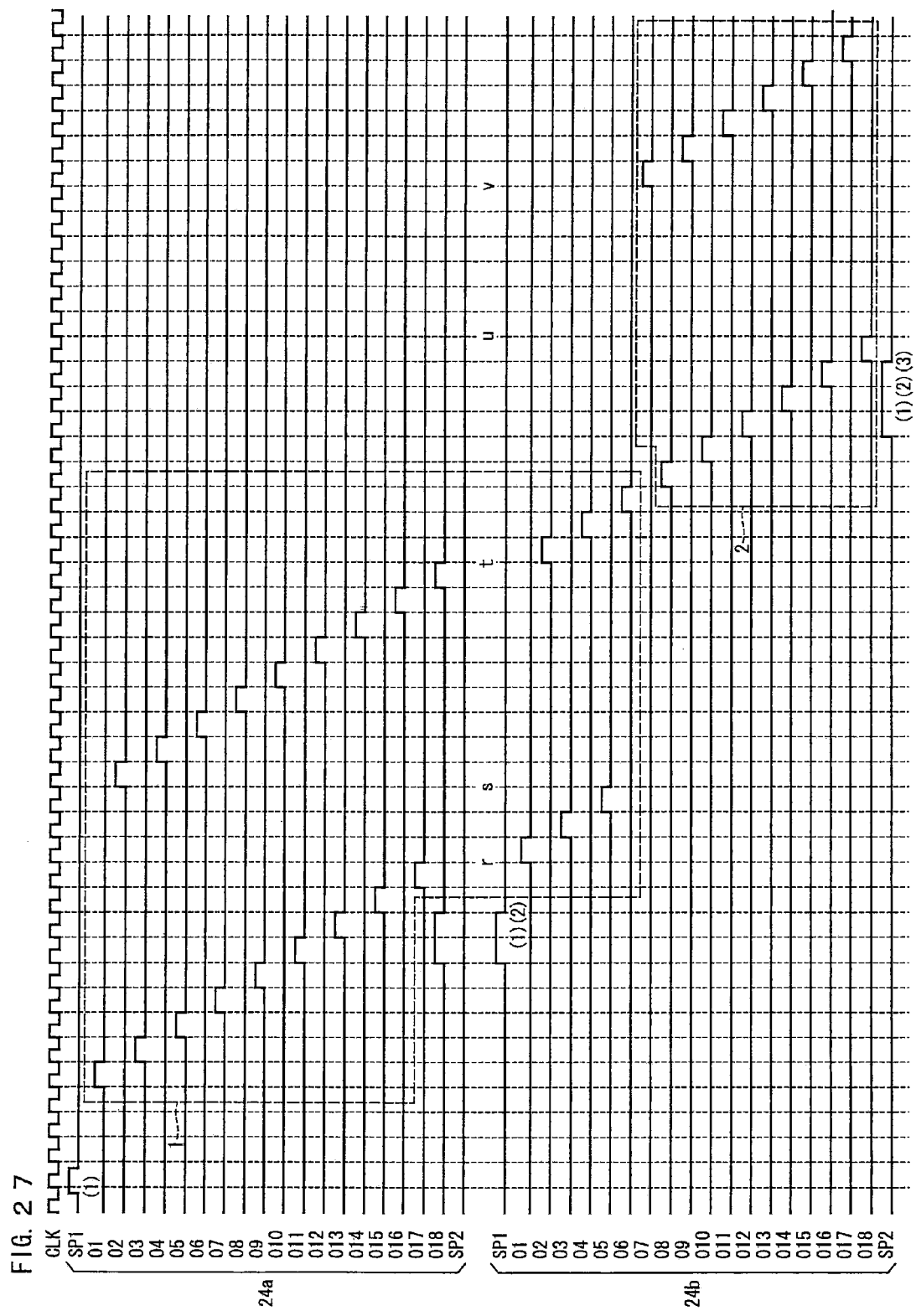
FIG. 27 is a timing chart illustrating interlaced driving by the first- and second-stage gate drivers of four gate drivers being cascaded.
Figure 28:
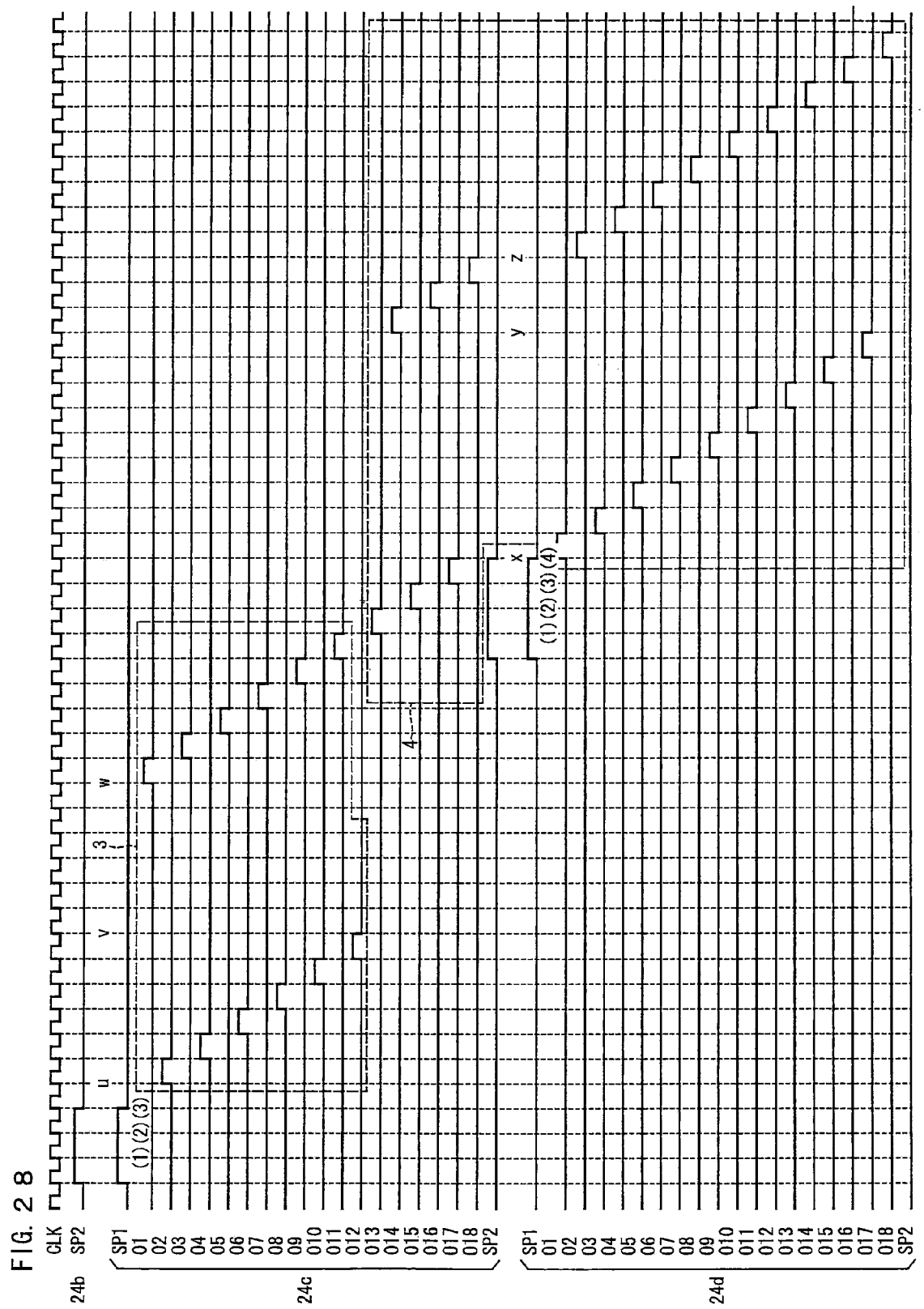
FIG. 28 is a timing chart illustrating interlaced driving by the third- and fourth-stage gate drivers of the four gate drivers being cascaded.

FIGS. 27 and 28 illustrate the interlaced driving implemented by the four gate drivers 24a to 24d. The gate drivers 24a to 24d perform interlaced driving by splitting the liquid crystal panel 12 into three divisions. In other words, the broken line 1 in FIG. 27 represents the scanning of the first screen division; the broken line 2 in FIG. 27 and the broken line 3 in FIG. 28 represent the scanning of the second screen division; and the broken line 4 in FIG. 28 represents the scanning of the third screen division.

The first screen division is scanned by the gate drivers 24a and 24b. When a start signal SP in a HIGH level period of which the operating clock CLK rises once is fed at the terminal SP1 of the gate driver 24a, the gate driver 24a outputs the scan signal starting with the odd-numbered drive terminal O1. As the gate driver 14a outputs the scan signal at the odd-numbered drive terminal O17, the gate driver 14a temporarily suspends the scanning. The succeeding-stage gate driver 24b outputs the scan signal starting with the odd-numbered drive terminal O1. The gate driver 24b outputs the scan signal up to the odd-numbered drive terminal O5, thereby temporarily suspending the scanning. Then, the preceding-stage gate driver 24a outputs the scan signal starting with the even-numbered drive terminal O2. The gate driver 24a outputs the scan signal up to the even-numbered drive terminal O18 and terminates its part of the scanning. Then, the succeeding-stage gate driver 24b again outputs the scan signal starting with the even-numbered drive terminal O2. The gate driver 24b outputs the scan signal up to the even-numbered drive terminal O6, which terminates the scanning of the first screen division.

The second screen division is scanned by the gate drivers 24b and 24c. The gate driver 24b starts the scanning by outputting the scan signal at the even-numbered drive terminal O8. The gate driver 24b outputs the scan signal up to the even-numbered drive terminal O18, thereby temporarily suspending the scanning. Then, as illustrated in FIG. 28, the succeeding-stage gate driver 24c outputs the scan signal starting with the even-numbered drive terminal O2. The gate driver 24c outputs the scan signal up to the even-numbered drive terminal O12, thereby temporarily suspending the scanning. Then, as illustrated in FIG. 27, the gate driver 24b again outputs the scan signal starting with the odd-numbered drive terminal O7. The gate driver 24b outputs the scan signal up to the odd-numbered drive terminal O17 and terminates its part of the scanning. Subsequently, as illustrated in FIG. 28, the gate driver 24c again outputs the scan signal starting with the odd-numbered drive terminal O1. The gate driver 24c outputs the scan signal up to the odd-numbered drive terminal O11, which terminates the scanning of the second screen division.

The third screen division is scanned by the gate drivers 24c and 24d. The gate driver 24c starts the scanning by outputting the scan signal at the odd-numbered drive terminal O13. The gate driver 24c outputs the scan signal up to the odd-numbered drive terminal O17, thereby temporarily suspending the scanning. Then, the succeeding-stage gate driver 24d outputs the scan signal starting with the odd-numbered drive terminal O1. The gate driver 24 outputs the scan signal up to the odd-numbered drive terminal O17, temporarily suspending the scanning. Then, the preceding-stage gate driver 24c outputs the scan signal starting with the even-numbered drive terminal O14. The gate driver 24c outputs the scan signal up to the even-numbered drive terminal O18 and terminates its part of the scanning. Then, the succeeding-stage gate driver 24d again outputs the scan signal starting with the even-numbered drive terminal O2. The gate driver 24d outputs the scan signal up to the even-numbered drive terminal O18, which terminates the scanning of the third screen division.

In addition, the gate driver 24a outputs a start signal SP with a 2 clock cycle HIGH width at the terminal SP2, as well as outputs the scan signal at the odd-numbered drive terminal O11. The start signal SP is supplied to the succeeding-stage gate driver 24b. Similarly, the gate driver 24c outputs a start signal SP with a 4 clock cycle HIGH width at the terminal SP2, as well as outputs the scan signal at the odd-numbered drive terminal O11. The start signal SP is supplied to the succeeding-stage gate driver 24d. Meanwhile, the gate driver 24b outputs a start signal SP with a 3 clock cycle HIGH width at the terminal SP2, as well as outputs the scan signal at the even-numbered drive terminal O12. The start signal SP is supplied to the succeeding-stage gate driver 24c.

The gate drivers 4 and 14 in embodiments 1 and 2 decided the scan sequence according to whether the rise count M of the operating clock in a HIGH level period of the start signal supplied to the gate drivers is an odd number or an even number. In contrast, the gate drivers 24 in accordance with the present embodiment operate differently depending on whether the rise count M is 1, 2, or 3. In addition, in the present embodiment, the gate drivers 24 operate identically when the rise count M is 1 and 4.

In other words, when the rise count M is 1, the gate driver 24a operates as shown in FIG. 27. When the rise count M is 2, the gate driver 24b operates as shown in FIG. 27. When the rise count M is 3, the gate driver 24c operates as shown in FIG. 28. When the rise count M is 4, the gate driver 24d operates as shown in FIG. 28.

The scanning implemented by these procedures enables the four cascaded gate drivers 24 to perform interlaced driving of three screen divisions. Since the number of divisions into which the screen is split is less than the number of gate drivers mounted, this scanning involves fewer polarity inversions and better restricts power consumption than the configuration of embodiment 1.

Now, a specific circuit configuration for the gate drivers 24 will be described in reference to FIGS. 29 to 32.

Figure 29:
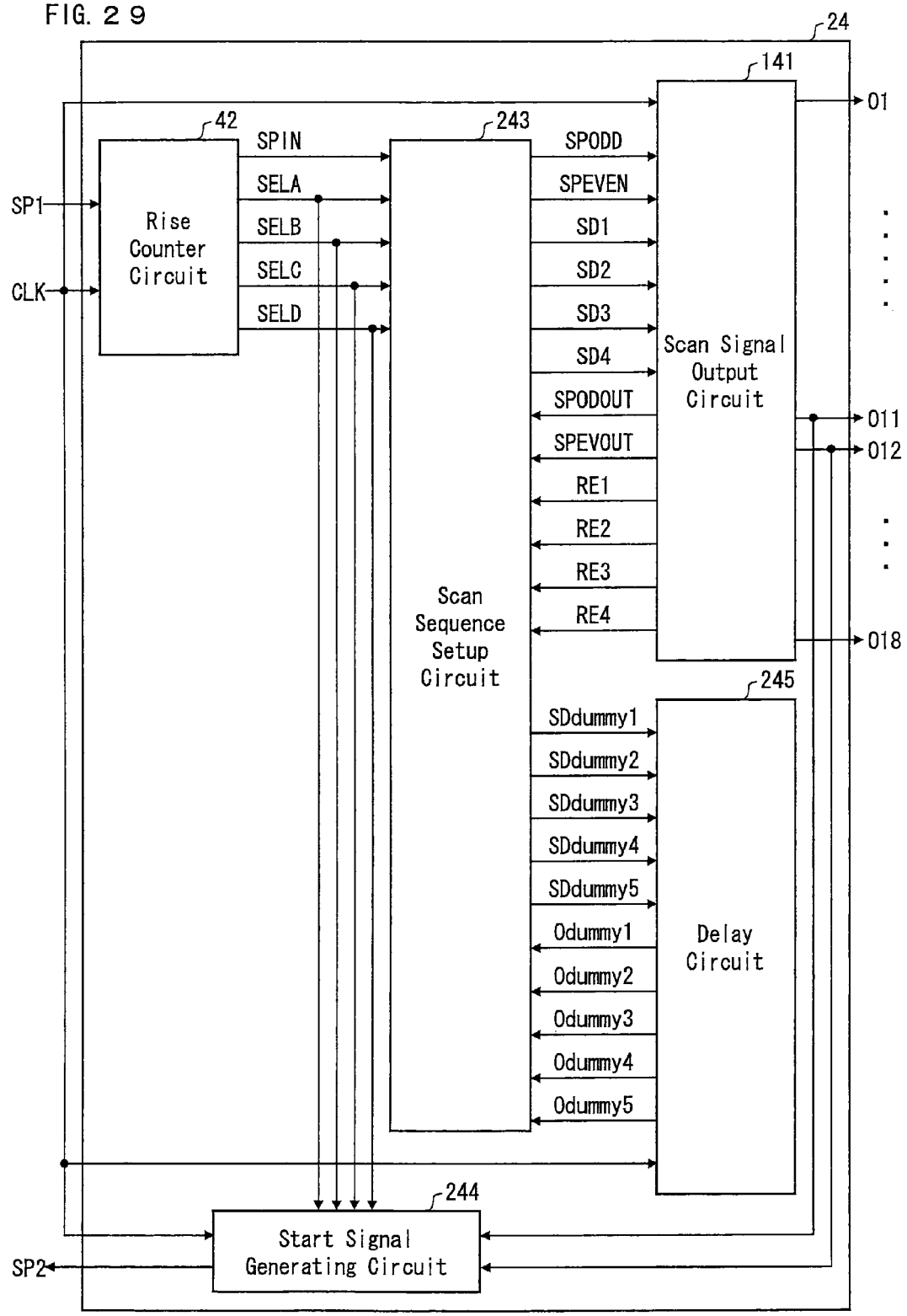
FIG. 29 is a block diagram depicting the configuration of a major part of the gate driver.

FIG. 29 is a block diagram depicting the configuration of the gate driver 24. The gate driver 24 includes a scan signal output circuit 141, a rise counter circuit 42, a scan sequence setup circuit 243, a start signal generating circuit 244, and a delay circuit 245.

The scan signal output circuit 141, having the same configuration as the scan signal output circuit 141 shown in FIG. 21, generates a scan signal for output at the output terminals O1 to O18 (see FIG. 4) of the gate driver 4.

The rise counter circuit 42, having the same configuration as the rise counter circuit 42 shown in FIG. 9, senses the rise count M of the operating clock CLK in a HIGH level period of the start signal SP fed at the terminal SP1 of the gate driver 24. The scan sequence setup circuit 243 decides a scan sequence to be followed by the scan signal output circuit 141 from the rise count M sensed by the rise counter circuit 42.

The start signal generating circuit 244 generates the start signal SP for output at the terminal SP2 of the gate driver 24.

The rise count N of the operating clock CLK in a HIGH level period of the start signal SP output from the start signal generating circuit 244 is M+1.

The delay circuit 245 holds the interlaced driving by the gate driver 24 throughout the scanning by the succeeding-stage gate driver 24, i.e., from the temporary suspension to the restarting of the scanning by the gate driver 24 of interest. In other words, the delay circuit 245 delays the scanning by the gate driver 14 for periods "r" to "s," "s" to "t," and "u" to "v" shown in FIG. 27 and "v" to "w," "x" to "y," and "y" to "z" shown in FIG. 28. The delay circuit 245 receives five signals SDdummy1 to SDdummy5 from the scan sequence setup circuit 243. Meanwhile, the scan sequence setup circuit 243 receives five signals Odummy1 to Odummy5 from the delay circuit 245.

The operating clock CLK fed at the terminal CLK of the gate driver 24 is supplied to the scan signal output circuit 241, the rise counter circuit 42, the start signal generating circuit 244, and the delay circuit 245. The start signal SP fed at the terminal SP1 of the gate driver 24 is supplied to the rise counter circuit 42.

The rise counter circuit 42 outputs a signal SPIN to the scan sequence setup circuit 243 and also outputs signals SELA, SELB, SELC, and SELD to the scan sequence setup circuit 243 and the start signal generating circuit 244.

The scan sequence setup circuit 243 outputs six signals SPODD, SPEVEN, and SD1 to SD4 to the scan signal output circuit 141. Meanwhile, the scan signal output circuit 141 outputs six signals SPODOUT, SPEVOUT, and RE1 to RE4 to the scan sequence setup circuit 243.

The scan signal output circuit 141 is connected to the output terminals O1 to O18. The lines connected to the output terminal O11 and O12 are connected also to the start signal generating circuit 144. This means that as a scan signal is output at the output terminal O11 or O12, a HIGH pulse is supplied simultaneously to the start signal generating circuit 144.

The following will describe a specific circuit configuration for the scan sequence setup circuit 243, the delay circuit 145, and the start signal generating circuit 244. The rise counter circuit 42 and the scan signal output circuit 141 is identical to the circuitry shown in FIGS. 10 and 23 respectively, and their description is omitted.

Figure 30:
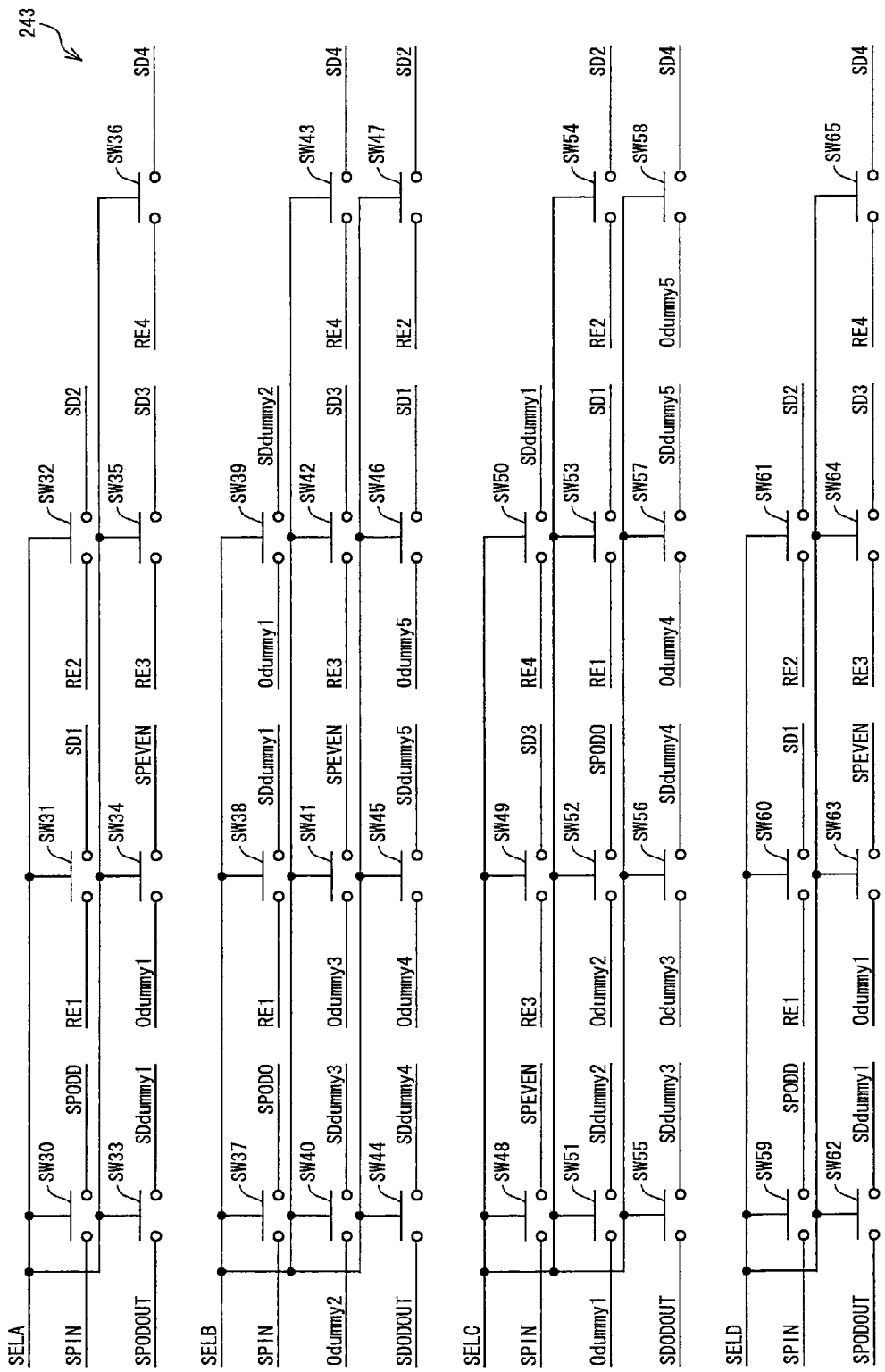
FIG. 30 is a circuit diagram depicting a specific configuration of a scan sequence setup circuit in the gate driver.

FIG. 30 depicts a specific circuit configuration for the scan sequence setup circuit 243. The scan sequence setup circuit 243 includes 36 switches (SW30 to 65). The signal SELA from the rise counter circuit 42 is fed at the gates of SW30 to SW36. The signal SELB from the rise counter circuit 42 is fed at the gates of SW37 to SW47. The signal SELC from the rise counter circuit 42 is fed at the gates of SW48 to SW58. The signal SELD from the rise counter circuit 42 is fed at the gates of SW59 to SW65.

Accordingly, when the HIGH width of the start signal SP sensed by the rise counter circuit 42 is equal to 1 clock cycle, SW30 to SW36 turn on; when the HIGH width of the start signal SP is equal to 2 clock cycles; SW37 to SW47 turn on; when the HIGH width of the start signal SP is equal to 3 clock cycles, SW48 to SW58 turn on; and when the HIGH width of the start signal SP is equal to 4 clock cycles, SW59 to SW65 turn on.

The signal SPIN from the rise counter circuit 42 is fed at the sources of SW30, SW37, SW48, and SW59.

Figure 31:
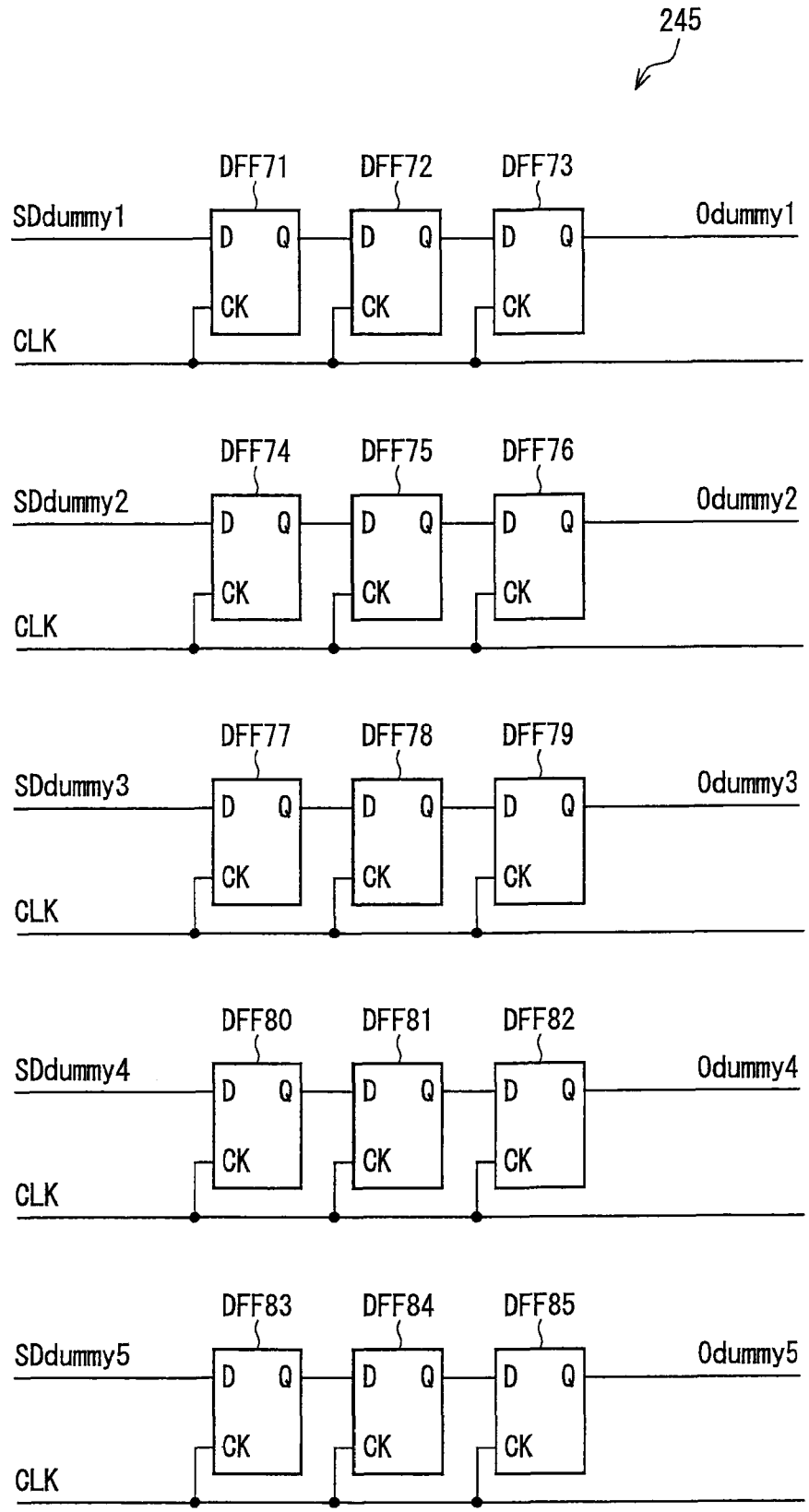
FIG. 31 is a circuit diagram depicting a specific configuration of a delay circuit in the gate driver.

FIG. 31 depicts a specific circuit configuration for the delay circuit 245. The delay circuit 245 includes 15 D-type flip-flops (DFF71 to 85). DFF71 to 73, DFF74 to 76, DFF77 to 79, DFF80 to 82, and DFF83 to 85 constitute respective 3-stage shift registers. The operating clock CLK is supplied at the clock input terminals CK of DFF71 to 85.

Referring to FIGS. 23 and 30, the connection between the scan signal output circuit 141 and the scan sequence setup circuit 243 is now described.

The data input terminal N of DFF50 in the scan signal output circuit 141 is connected to the drains of SW30, SW37, SW52, and SW59 in the scan sequence setup circuit 243. The data input terminal N of DFF50 receives the signal SPODD. The data output terminal Q of DFF52 is connected to the output terminal O5 and also to the sources of SW31, SW38, SW53, and SW60. The data output terminal Q outputs the signal RE1.

The data input terminal N of DFF53 is connected to the drains of SW31, SW46, SW53, and SW60, and receives the signal SD1. The data output terminal Q of DFF55 is connected to the output terminal O11 and also to the sources of SW32, SW47, SW54, and SW61. The data output terminal Q of DFF55 outputs the signal RE2.

The data input terminal N of DFF56 is connected to the drains of SW32, SW47, SW54, and SW61 and receives the signal SD2. The data output terminal Q of DFF58 is connected to the output terminal O17 and also to the sources of SW33, SW55, and SW62. The data output terminal Q of DFF58 outputs the signal SPODOUT.

The data input terminal N of DFF59 is connected to the drains of SW34, SW41, SW48, and SW63 and receives the signal SPEVEN. The data output terminal Q of DFF61 is connected to the output terminal O6 and also to the sources of SW35, SW42, SW49, and SW64. The data output terminal Q of DFF61 outputs the signal RE3.

The data input terminal N of DFF62 is connected to the drains of SW35, SW42, SW49, and SW64 and receives the signal SD3. The data output terminal Q of DFF64 is connected to the output terminal O12 and also to the sources of SW36, SW43, SW50, and SW65. The data output terminal Q of DFF64 outputs the signal RE4.

The data input terminal N of DFF65 is connected to the drains of SW36, SW43, SW58, and SW65 and receives the signal SD4. The data output terminal Q of DFF67 is connected to the output terminal O18 and also to the source of SW44. The data output terminal Q of DFF67 outputs the signal SPEVOUT.

Next, referring to FIGS. 30 and 31, the connect between the scan sequence setup circuit 243 and the delay circuit 245 will be described.

The data input terminal N of DFF71 in the delay circuit 245 is connected to the drains of SW33, SW38, SW50, and SW62 in the scan sequence setup circuit 243 and receives the signal SDdummy1. The data output terminal Q of DFF73 is connected to the sources of SW34, SW39, SW51, and SW63 and outputs the signal Odummy1.

The data input terminal N of DFF74 is connected to the drains of SW39 and SW51 and receives the signal SDdummy2. The data output terminal Q of DFF76 is connected to the sources of SW40 and SW52 and outputs the signal Odummy2.

The data input terminal N of DFF77 is connected to the drains of SW40 and SW55 and receives the signal SDdummy3. The data output terminal Q of DFF79 is connected to the sources of SW41 and SW56 and outputs the signal Odummy3.

The data input terminal N of DFF80 is connected to the drains of SW44 and SW56 and receives the signal SDdummy4. The data output terminal Q of DFF82 is connected to the sources of SW45 and SW57 and outputs the signal Odummy4.

The data input terminal N of DFF83 is connected to the drains of SW45 and SW57 and receives the signal SDdummy5. The data output terminal Q of DFF85 is connected to the sources of SW46 and SW58 and outputs the signal Odummy5.

Figure 32:
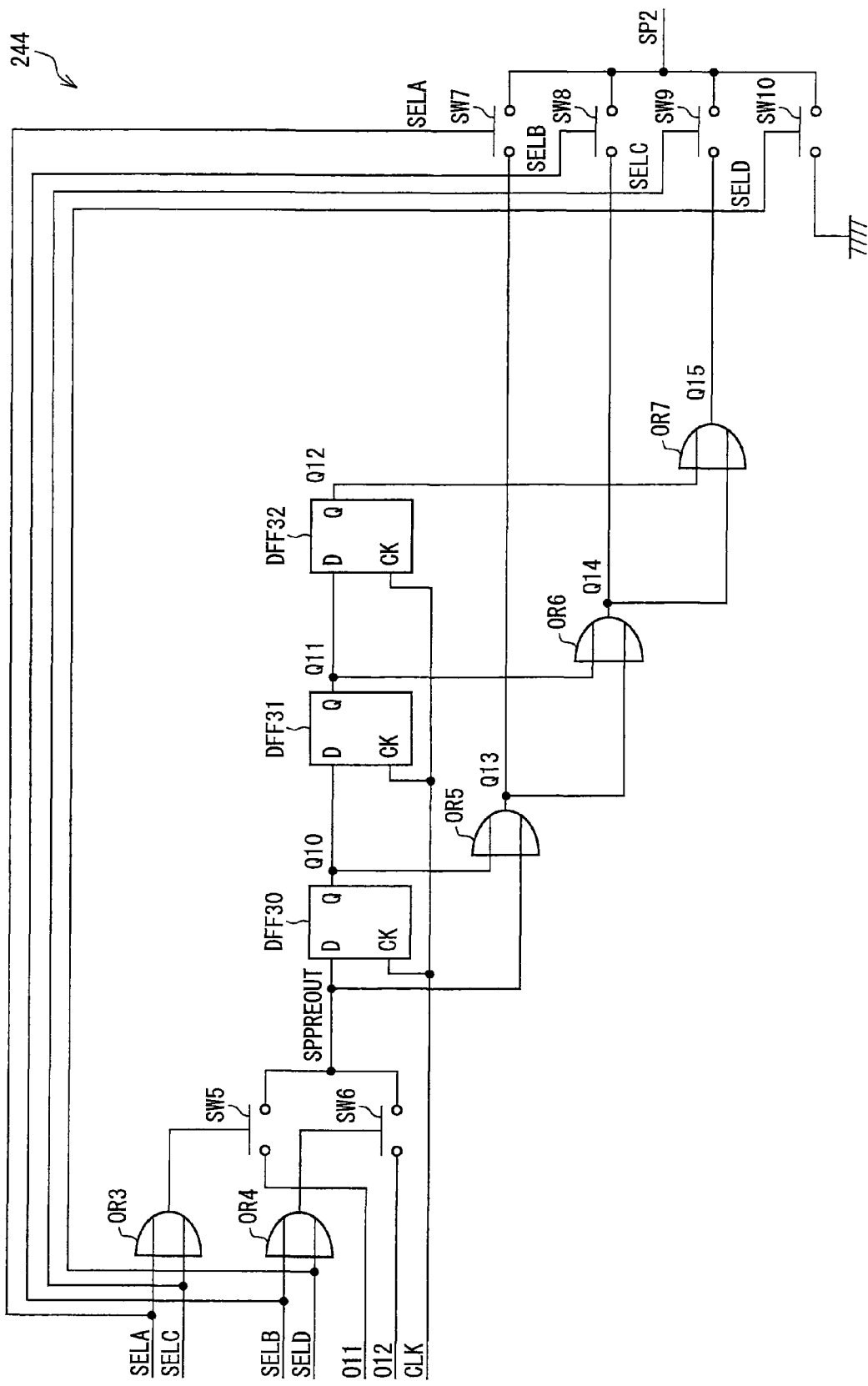
FIG. 32 is a circuit diagram depicting a specific configuration of a start signal generating circuit in the gate driver.
Figure 33:
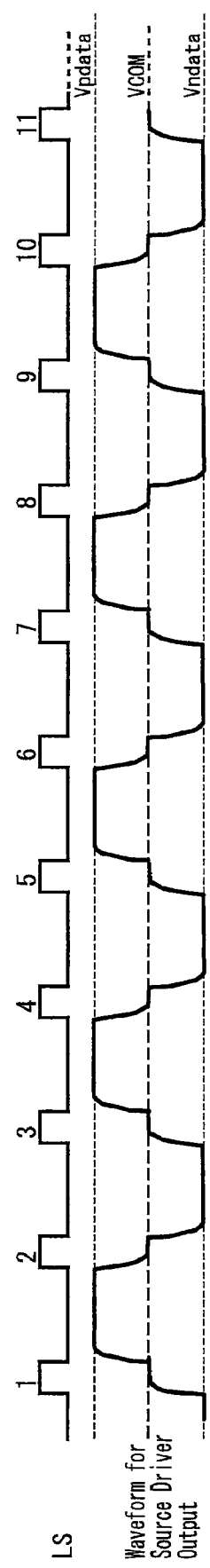
FIG. 33 is a diagram depicting an image data output from a source driver (driving waveform) when a display panel is being driven by a dot inversion driving scheme.
Figure 34:
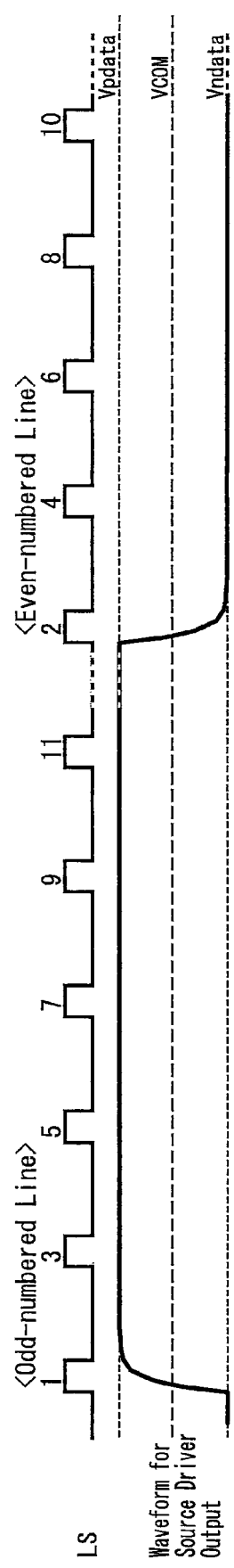
FIG. 34 is a diagram depicting a source driver output waveform (driving waveform) for interlaced driving.
Figure 35:
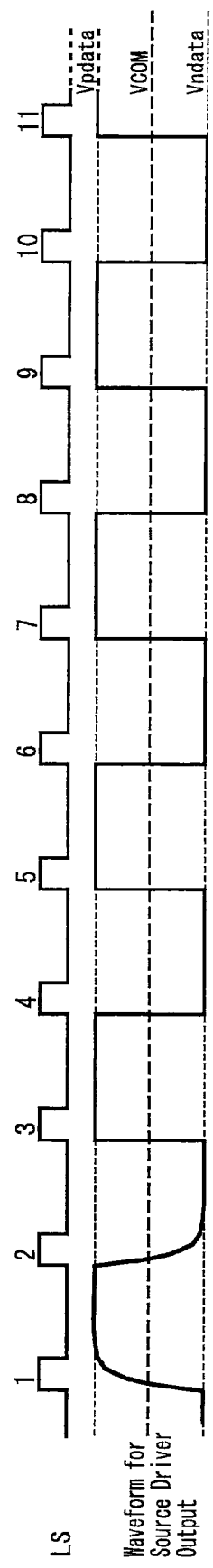
FIG. 35 is a diagram depicting a source driver output waveform (driving waveform) for interlaced driving when scanning is completed for one frame.
Figure 36:
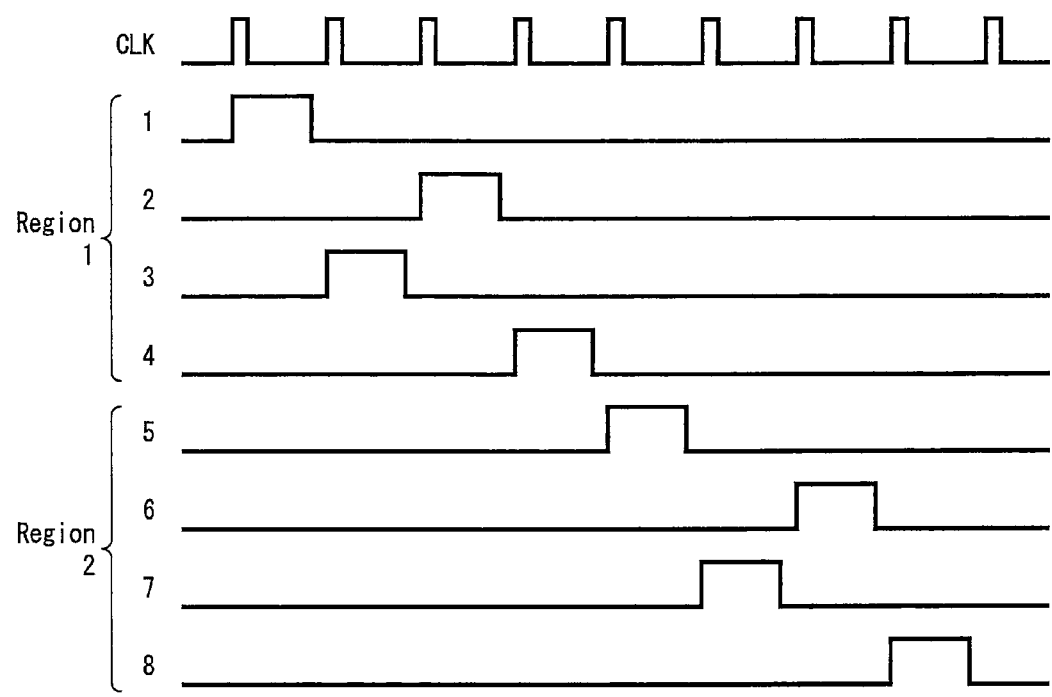
FIG. 36 is a timing chart illustrating conventional interlaced driving.
Figure 37:
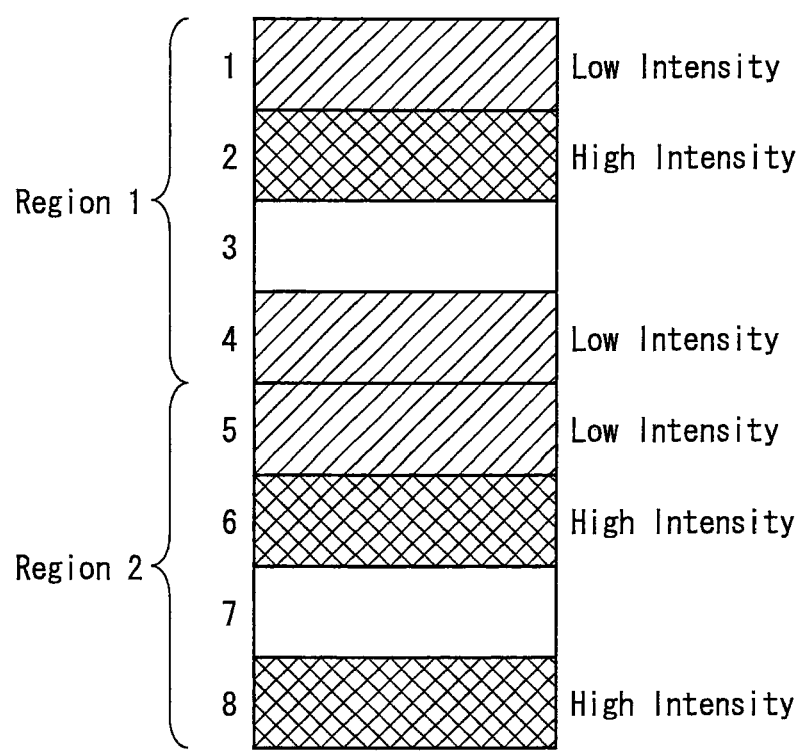
FIG. 37 is a diagram depicting intensities of lines when interlaced driving is carried out as in FIG. 36.

FIG. 32 depicts a specific circuit configuration for the start signal generating circuit 244 shown in FIG. 29. The start signal generating circuit 244 has the same configuration as the start signal generating circuit 44 shown in FIG. 15, except that the sources of SW5 and SW6 are connected respectively to the output terminals O11 and O12 in the start signal generating circuit 44 and conversely to the output terminals O12 and O11 in the start signal generating circuit 244. Accordingly, when the rise count M of the operating clock CLK in a HIGH level period of the start signal SP fed at the terminal SP1 of the gate driver 24 is 1 or 3, the start signal generating circuit 244 receives the signal SELA or the signal SELC. That turns on SW5. A start signal SP with a 2 or 4 clock cycle HIGH width is output simultaneously with the output of the scan signal from the odd-numbered drive terminal O11. When the rise count M is 2, the start signal generating circuit 244 receives the signal SELB. That turns on SW6. A start signal SP with a 3 clock cycle HIGH width is output simultaneously with the output of the scan signal from the even-numbered drive terminal O12. When the rise count M is 4, the start signal generating circuit 244 also receives the signal SELD. That turns on SW6. Since the source of SW10 is however grounded. No start signal SP is therefore output.

The above configuration enables the gate driver 24 shown in FIG. 29 to perform the interlaced driving shown in FIGS. 27 and 28. The following will specifically describe the operation of the gate driver 24 referring to the circuit configuration.

When the rise count M is 1, the gate driver 24a performs the interlaced driving shown in FIG. 27. The rise counter circuit 42 (see FIG. 10) outputs the signal SPIN and the signal SELA to the scan sequence setup circuit 243 (see FIG. 30).

In the scan sequence setup circuit 243, SW30 to 36 are turned on, and the signal SPIN is supplied to SW30. The signal SPODD is consequently supplied to DFF50 in the scan signal output circuit 141 (see FIG. 23). Accordingly, the scan signal is output at the odd-numbered drive terminals O1 to O5. DFF52 outputs the scan signal at the odd-numbered drive terminal O5 and also outputs the signal RE1 to SW31. The signal SD1 is input to DFF53, and the scan signal is output at the odd-numbered drive terminals O7 to O11. DFF55 outputs the scan signal at the odd-numbered drive terminal O11 and also outputs the signal RE2 to SW32. The signal SD2 is input to DFF56, and the scan signal is output at the odd-numbered drive terminals O13 to O17. DFF58 outputs the scan signal at the odd-numbered drive terminal O17 and also outputs the signal SPODOUT to SW33. DFF71 in the delay circuit 245 (see FIG. 31) receives the signal SDdummy1.

3 clock cycles after that, DFF73 outputs the signal Odummy1 to SW34 in the scan sequence setup circuit 243, and DFF59 in the scan signal output circuit 141 receives the signal SPEVEN. Accordingly, the gate driver 24a discontinues the scanning for period "r" to "s" in FIG. 27 and then outputs the scan signal starting with the even-numbered drive terminal O2. DFF61 outputs the scan signal at the even-numbered drive terminal O6 and also outputs the signal RE3 to SW35. The signal SD3 is input to DFF62, and the scan signal is output at the even-numbered drive terminals O8 to O12. DFF64 outputs the scan signal at the even-numbered drive terminal O12 and also outputs the signal RE4 to SW36. The signal SD4 is input to DFF65, and the scan signal is output at the even-numbered drive terminals O14 to O18. DFF67 outputs the scan signal at the even-numbered drive terminal O18 and also outputs the signal SPEVOUT to SW44 which however is OFF. This terminates the operation of the gate driver 24a.

In addition, in the gate driver 24a, the scan signal is output at the odd-numbered drive terminal O11, and a HIGH pulse is input to SW5 in the start signal generating circuit 244 (see FIG. 32). A start signal SP with a 2 clock cycle HIGH width is output at the output terminal SP2 to the succeeding-stage gate driver 24.

In the gate driver 24 that succeeds the gate driver 24a, the rise count for the incoming operating clock CLK in a HIGH level period of the start signal SP is 2. Thus, the gate driver 24b performs the interlaced driving shown in FIG. 27. The rise counter circuit 42 outputs the signal SPIN and the signal SELB to the scan sequence setup circuit 243.

Therefore, in the scan sequence setup circuit 243, SW37 to 47 are turned on, and the signal SPIN is supplied to SW37. The signal SPODD is consequently supplied to DFF50 in the scan signal output circuit 141. Accordingly, the scan signal is output at the odd-numbered drive terminals O1 to O5. DFF52 outputs the scan signal at the odd-numbered drive terminal O5 and also outputs the signal RE1 to SW31. The signal SDdummy1 is supplied to DFF71 in the delay circuit 245.

3 clock cycles after that, the signal Odummy1 is output from DFF73 to SW39 in the scan sequence setup circuit 243, and the signal SDdummy2 is input to DFF74 in the delay circuit 245. 3 clock cycles later, the signal Odummy2 is output from DFF76 to SW40 in the scan sequence setup circuit 243, and the signal SDdummy3 is input to DFF77 in the delay circuit 245. Another 3 clock cycles later, the signal Odummy3 is output from DFF79 to SW41 in the scan sequence setup circuit 243, and the signal SPEVEN is input to DFF59 in the scan sequence setup circuit 243.

Accordingly, the gate driver 24b discontinues the scanning for a total of 9 clock cycles ("s" to "t" in FIG. 27) and again outputs the scan signal starting with the even-numbered drive terminal O2. DFF61 outputs the scan signal at the even-numbered drive terminal O6 and also outputs the signal RE3 to SW42. The signal SD3 is input to DFF62, and the scan signal is output at the even-numbered drive terminals O8 to O12. DFF64 outputs the scan signal at the even-numbered drive terminal O12 and also outputs the signal RE4 to SW43. The signal SD4 is input to DFF65, and the scan signal is output at the even-numbered drive terminals O14 to O18. DFF67 outputs the scan signal at the even-numbered drive terminal O18 and also outputs the signal SPEVOUT to SW44. The signal SDdummy4 is input to DFF80 in the delay circuit 245.

3 clock cycles after that, the signal Odummy4 is output from DFF82 to SW45 in the scan sequence setup circuit 243, and the signal SDdummy5 is input to DFF83 in the delay circuit 245. 3 clock cycles later, the signal Odummy5 is output from DFF85 to SW46 in the scan sequence setup circuit 243, and the signal SD1 is input to DFF53 in the scan sequence setup circuit 243.

Accordingly, the gate driver 24b discontinues the scanning for a total of 6 clock cycles ("u" to "v" in FIG. 27) and again outputs the scan signal starting with the odd-numbered drive terminal O7. DFF55 outputs the scan signal at the odd-numbered drive terminal O11 and also outputs the signal RE2 to SW47. The signal SD2 is input to DFF56, and the scan signal is output at the odd-numbered drive terminals O13 to O17. DFF58 outputs the scan signal at the odd-numbered drive terminal O17 and also outputs the signal SPODOUT to SW33, 55, and 62 which however are all OFF. This terminates the operation of the gate driver 24b.

In addition, in the gate driver 24b, the scan signal is output at the even-numbered drive terminal O12, and a HIGH pulse is input to SW6 in the start signal generating circuit 244. A start signal SP with a 3 clock cycle HIGH width is output at the output terminal SP2 to the succeeding-stage gate driver 24.

In the gate driver 24 that succeeds the gate driver 24b, the rise count for the incoming operating clock CLK in a HIGH level period of the start signal SP is 3. Thus, the gate driver 24c performs the interlaced driving shown in FIG. 28. The rise counter circuit 42 outputs the signal SPIN and the signal SELC to the scan sequence setup circuit 243.

Therefore, in the scan sequence setup circuit 243, SW48 to 58 are turned on, and the signal SPIN is supplied to SW48. The signal SPEVEN is consequently supplied to DFF59 in the scan signal output circuit 141. Accordingly, the scan signal is output at the even-numbered drive terminals O2 to O6. DFF61 outputs the scan signal at the even-numbered drive terminal O6 and also outputs the signal RE3 to SW49. The signal SD3 is input to DFF62, and the scan signal is output at the even-numbered drive terminals O8 to O12. DFF64 outputs the scan signal at the even-numbered drive terminal O12 and also outputs the signal RE4 to SW50. The signal SDdummy1 is input to DFF71 in the delay circuit 245.

3 clock cycles after that, the signal Odummy1 is output from DFF73 to SW51 in the scan sequence setup circuit 243, and the signal SDdummy2 is input to DFF74 in the delay circuit 245. 3 clock cycles later, the signal Odummy2 is output from DFF76 to SW52 in the scan sequence setup circuit 243, and the signal SPODD is input to DFF50 in the scan sequence setup circuit 243.

Accordingly, the gate driver 24c discontinues the scanning for a total of 6 clock cycles ("v" to "w" in FIG. 28) and again outputs the scan signal starting with the odd-numbered drive terminal O1. DFF52 outputs the scan signal at the odd-numbered drive terminal O5 and also outputs the signal RE1 to SW53. The signal SD1 is input to DFF53, and the scan signal is output at the odd-numbered drive terminals O7 to O11. DFF55 outputs the scan signal at the odd-numbered drive terminal O11 and also outputs the signal RE2 to SW54. The signal SD2 is input to DFF56, and the scan signal is output at the odd-numbered drive terminals O13 to O17. DFF58 outputs the scan signal at the odd-numbered drive terminal O17 and also outputs the signal SPODOUT to SW55. The signal SDdummy3 is input to DFF77 in the delay circuit 245.

3 clock cycles after that, the signal Odummy3 is output from DFF79 to SW56 in the scan sequence setup circuit 243, and the signal SDdummy4 is input to DFF80 in the delay circuit 245. 3 clock cycles later, the signal Odummy4 is output from DFF82 to SW57 in the scan sequence setup circuit 243, and the signal SDdummy5 is input to DFF83 in the delay circuit 245. Another 3 clock cycles later, the signal Odummy5 is output from DFF85 to SW58 in the scan sequence setup circuit 243, and the signal SD4 is input to DFF65 in the scan sequence setup circuit 243.

Accordingly, the gate driver 24c discontinues the scanning for a total of 9 clock cycles ("x" to "y" in FIG. 28) and again outputs the scan signal starting with the even-numbered drive terminal O14. DFF67 outputs the scan signal at the even-numbered drive terminal O18 and also outputs the signal SPEVOUT to SW44 which however is OFF. This terminates the operation of the gate driver 24c.

In addition, in the gate driver 24c, the scan signal is output at the odd-numbered drive terminal O11, and a HIGH pulse is input to SW5 in the start signal generating circuit 244. A start signal SP with a 4 clock cycle HIGH width is output at the output terminal SP2 to the succeeding-stage gate driver 24.

In the gate driver 24 that succeeds the gate driver 24c, the rise count for the incoming operating clock CLK in a HIGH level period of the start signal SP is 4. Thus, the gate driver 24d performs the interlaced driving shown in FIG. 28. The rise counter circuit 42 outputs the signal SPIN and the signal SELD to the scan sequence setup circuit 243.

Therefore, in the scan sequence setup circuit 243, SW59 to 65 are turned on. The sources of SW59 to 65 and the driver are all connected to the same components as are the sources of SW30 to 36 and the driver. Therefore, the gate driver 24d performs the same interlaced driving as the gate driver 24a.

In other words, the signal SPIN is supplied to SW59, and the signal SPODD is consequently supplied to DFF50 in the scan signal output circuit 141. The scan signal is thus output at the odd-numbered drive terminals O1 to O5. DFF52 outputs the scan signal at the odd-numbered drive terminal O5 and also outputs the signal RE1 to SW60. The signal SD1 is input to DFF53, and the scan signal is output at the odd-numbered drive terminals O7 to O11. DFF55 outputs the scan signal at the odd-numbered drive terminal O11 and also outputs the signal RE2 to SW61. The signal SD2 is input to DFF56, and the scan signal is output at the odd-numbered drive terminals O13 to O17. DFF58 outputs the scan signal at the odd-numbered drive terminal O17 and also outputs the signal SPODOUT to SW62. The signal SDdummy1 is input to DFF71 in the delay circuit 245.

3 clock cycles after that, the signal Odummy1 is output from DFF73 to SW63 in the scan sequence setup circuit 243, and the signal SPEVEN is input to DFF59 in the scan signal output circuit 141. Accordingly, the gate driver 24d discontinues the scanning for period "y" to "z" in FIG. 28 and again outputs the scan signal starting with the even-numbered drive terminal O2. DFF61 outputs the scan signal at the even-numbered drive terminal O6 and also outputs the signal RE3 to SW64. The signal SD3 is input to DFF62, and the scan signal is output at the even-numbered drive terminals O8 to O12. DFF64 outputs the scan signal at the even-numbered drive terminal O12 and also outputs the signal RE4 to SW65. The signal SD4 is input to DFF65, and the scan signal is output at the even-numbered drive terminals O14 to O18. DFF67 outputs the scan signal at the even-numbered drive terminal O18 and also outputs the signal SPEVOUT to SW44 which however is OFF. This terminates the operation of the gate driver 24d.

The interlaced driving shown in FIGS. 27 and 28 where the number of screen divisions is less than the number of gate drivers 24 is implemented in this manner. Hence, polarity inversions of the data signal is reduced, and the heat generation and power consumption in the source drivers are restricted.

Embodiment 4

The following will describe another embodiment of the present invention in reference to FIGS. 41 to 52. The present embodiment not only decides a scan sequence according to the HIGH level period of the start signal as in embodiments 1 to 3 and also drives all the scan signal lines.

Figure 41:
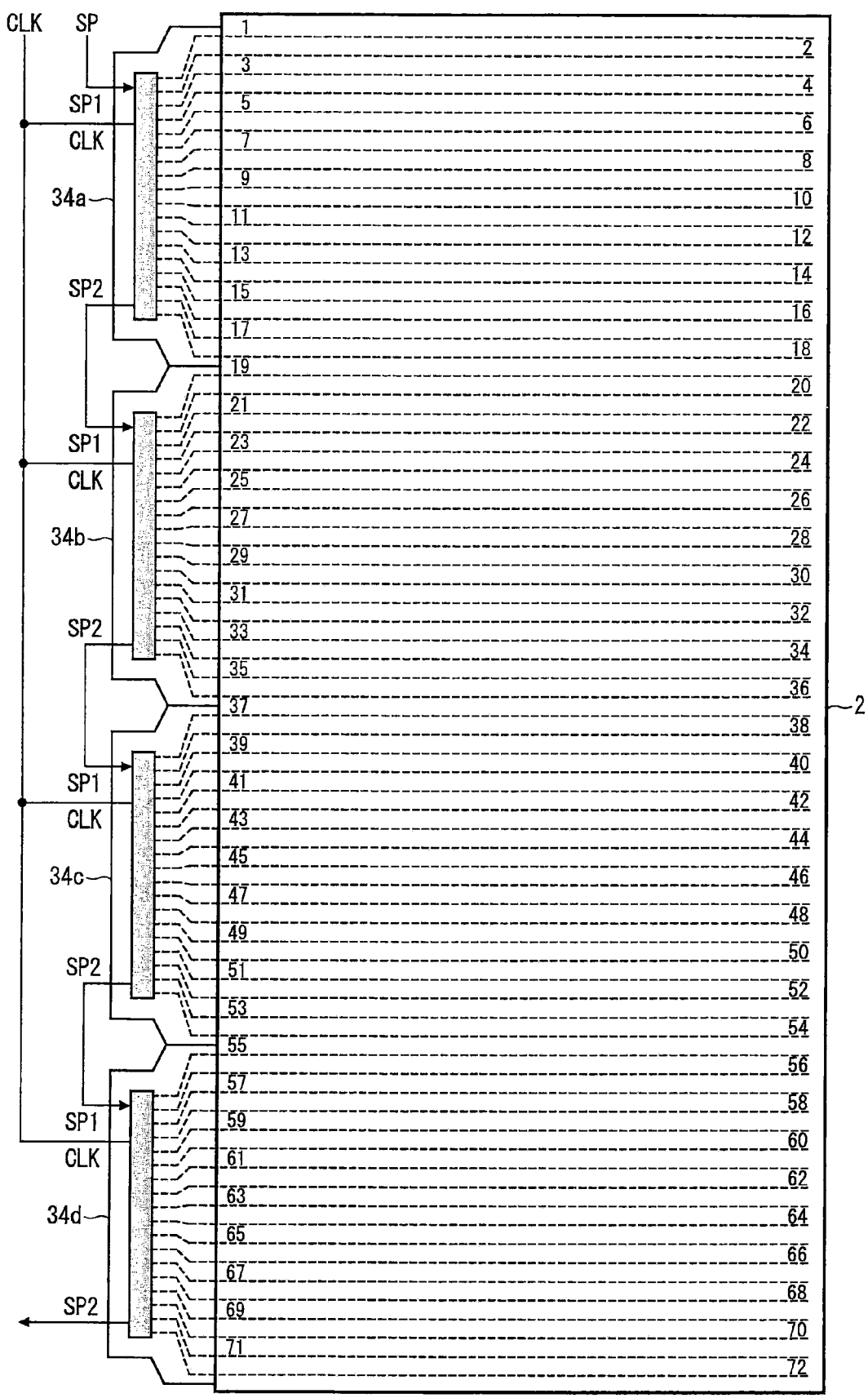
FIG. 41 is a schematic illustration of other gate drivers in accordance with the present invention being mounted to a liquid crystal panel.

FIG. 41 illustrates four gate drivers 34 being mounted to a liquid crystal panel 2. The liquid crystal panel 2 includes 72 scan signal lines 1 to 72 similarly to the liquid crystal panel 101 shown in FIG. 4. In FIG. 41, for convenience, the first- to fourth-stage gate drivers 34 are labelled as the gate drivers 34a, 34b, 34c, and 34d where necessary, and the gate drivers 34a, 34b, 34c, and 34d are cascaded. Similarly the gate drivers 4 of embodiment 1, the gate drivers 34 needs no switching terminal OS to switch between interlaced driving scan sequences. Scan sequences are switched using the HIGH width of the start signal SP fed at the terminal SP1.

The gate drivers 34 are capable of driving all scan signal lines when the power supply is turned off. This function can quickly discharge the pixel capacitances 211 in the liquid crystal panel 2 shown in FIG. 2. The afterimage is erased in a short period of time when the power supply is turned off. Furthermore, the gate drivers 34 have no terminal at which a signal communicating the timing when all the scan signal lines are driven is fed. The gate drivers 34 instead senses the timing by sensing the HIGH width of the start signal SP. Therefore, the gate drivers 34 includes fewer terminals and wires and can still provide good display quality.

Figure 42:
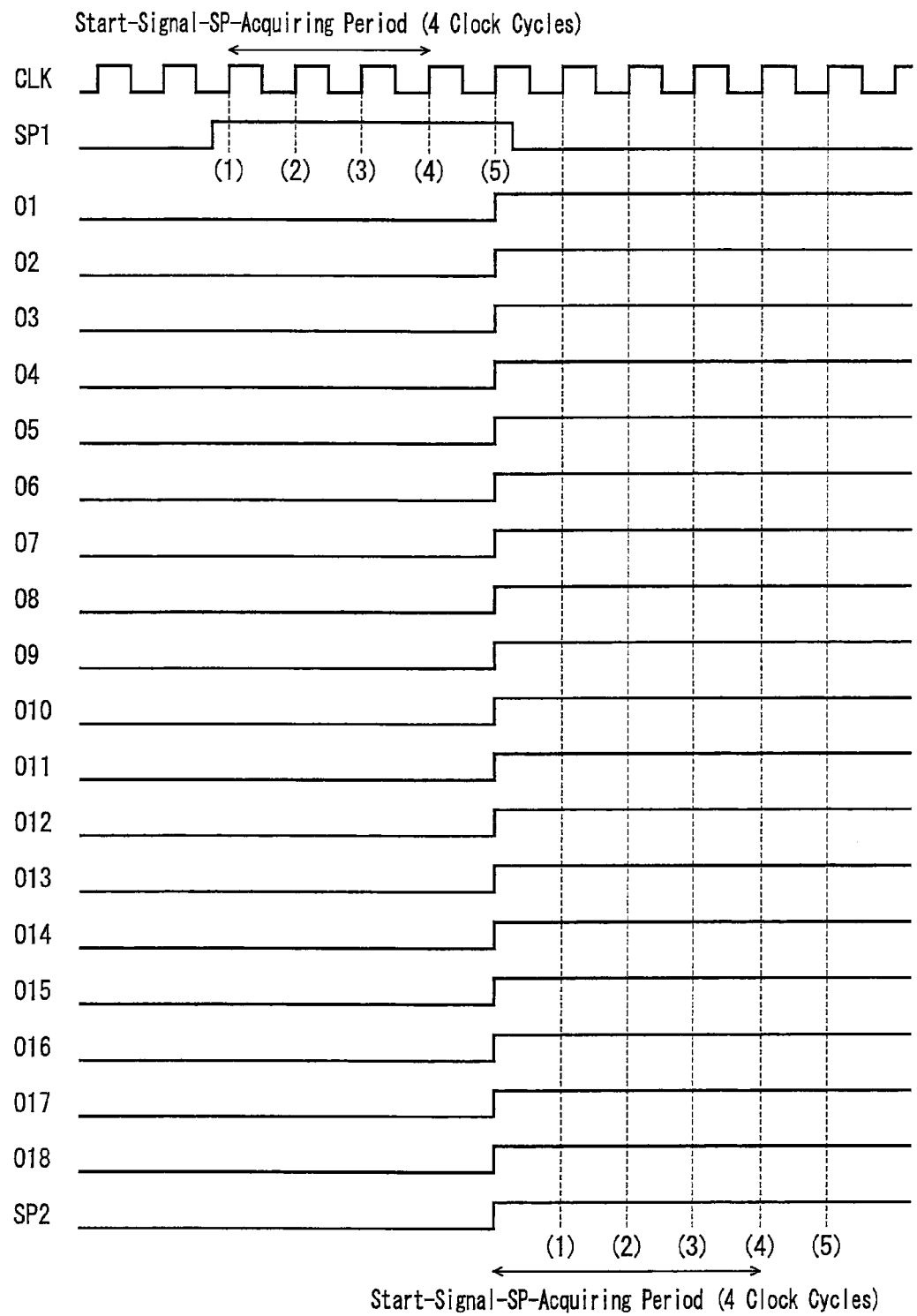
FIG. 42 is a timing chart illustrating interlaced driving by the gate drivers where the operating clock rises 5 times in a HIGH level period of a start signal.

FIG. 42 is a timing chart illustrating the interlaced driving by the gate drivers 34 when the rise count for the operating clock CLK in a HIGH level period of the start signal SP is 5. When a start signal SP in a HIGH level period of which the operating clock CLK rises 5 times is fed at the terminal SP1 of a gate driver 34, the gate driver 34 outputs the scan signal simultaneously at all driving terminals O1 to O18 for a predetermined period of time and also outputs a start signal SP with a 5 clock cycle or longer HIGH width at the terminal SP2 to the succeeding-stage gate driver 34. The gate driver 34 is configured to output the scan signal at all driving terminal O1 to O18 simultaneously for a predetermined period of time even if the rise count for the operating clock CLK in a HIGH level period of the start signal SP is 6 times or more frequently. The succeeding-stage gate driver 34 also drives all scan signal lines connected thereto.

The start signal SP supplied to the gate driver 34 is generated by the controller 7 shown in FIG. 1. The controller 7 can specify the pulse width of the start signal SP according to the specifications of the gate driver 34. In the present embodiment, the controller 7 is configured to generate a start signal SP in a HIGH level period of which the operating clock CLK rises 5 times when the controller 7 has sensed an instruction to turn off the power supply for the display device 1. The controller 7 is also designed to generate a start signal SP in a HIGH level period of which the operating clock CLK rises once in ordinary use. These specifications are a mere example; the pulse width of a start signal may be set to any value that suits the configuration of the gate driver.

Figure 43:
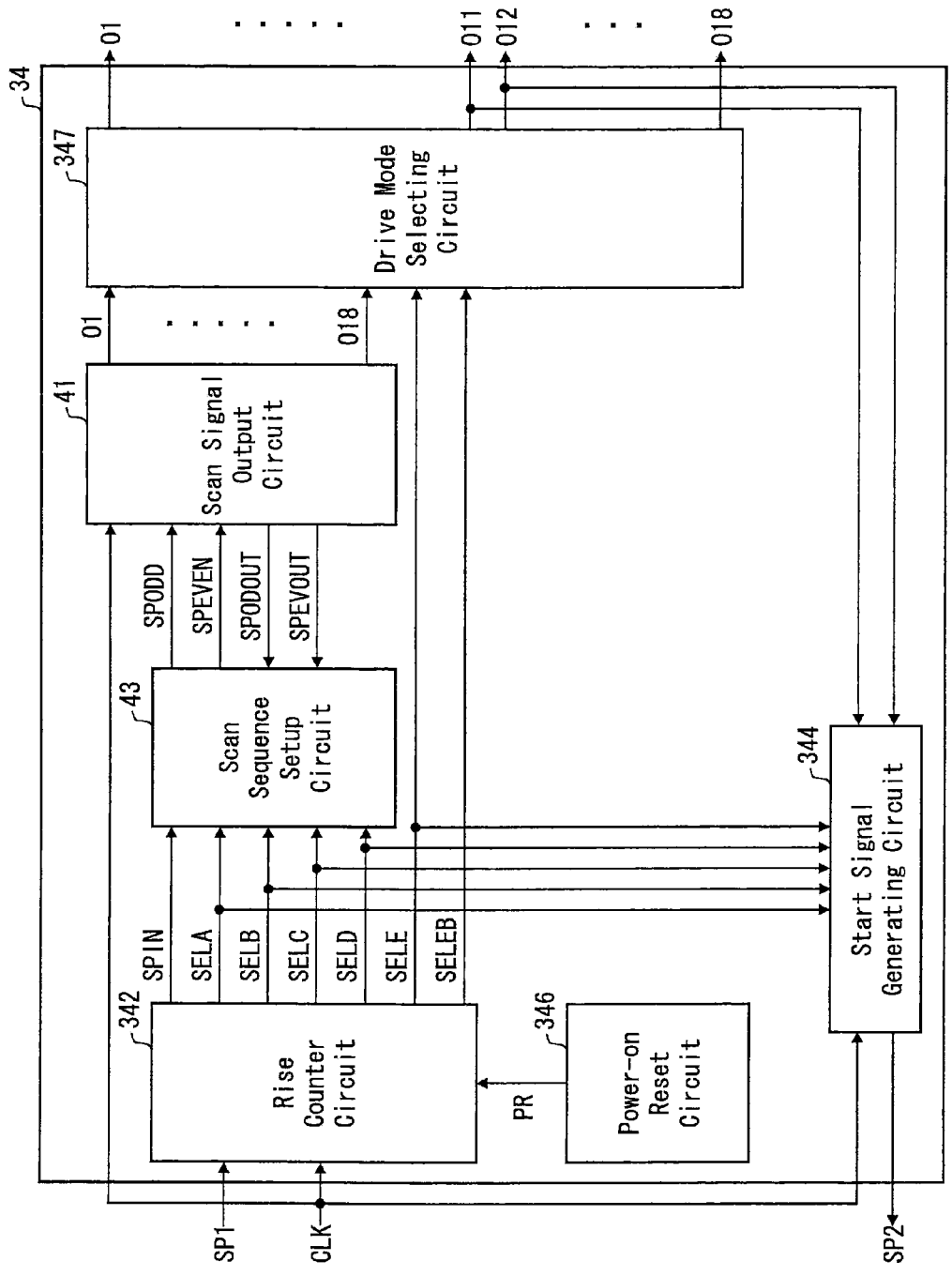
FIG. 43 is a block diagram depicting the configuration of the gate driver.

FIG. 43 is a block diagram depicting the configuration of the gate driver 34 in accordance with the present embodiment. The gate driver 34 is a variant of the gate driver 4 shown in FIG. 9. Specifically, the rise counter circuit 42 and the start signal generating circuit 44 are replaced by a rise counter circuit 342 and a start signal generating circuit 344. There are also provided a power-on reset circuit 346 and a drive mode selecting circuit 347.

The start signal SP and the operating clock CLK fed at the terminal SP1 and the terminal CLK of the gate driver 34 is supplied to the rise counter circuit 342. The start signal generating circuit 344 receives a signal SELE, as well as the signals SELA to SELD from the rise counter circuit 342. The drive mode selecting circuit 347 receives the signal SELE and the signal SELEB from the rise counter circuit 342, as well as the scan signal from the scan signal output circuit 41. The power-on reset circuit 346 senses a startup of the power supply and generates a power-on reset signal PR for output to the rise counter circuit 342.

Accordingly, the gate driver 34 performs the same interlaced driving as the gate driver 4 of embodiment 1 if the gate driver 34 has received a start signal SP in a HIGH level period of which the operating clock CLK rises once to 4 times; if the gate driver 34 has received a start signal SP in a HIGH level period of which the operating clock CLK rises 5 times or more frequently, the gate driver 34 drives all scan signal lines simultaneously.

In the present embodiment, the same interlaced driving as performed by the gate driver 4 of embodiment 1 is termed the first drive mode. The drive mode in which all the scan signal lines are simultaneously driven as shown in FIG. 42 is termed the second drive mode.

Figure 44:
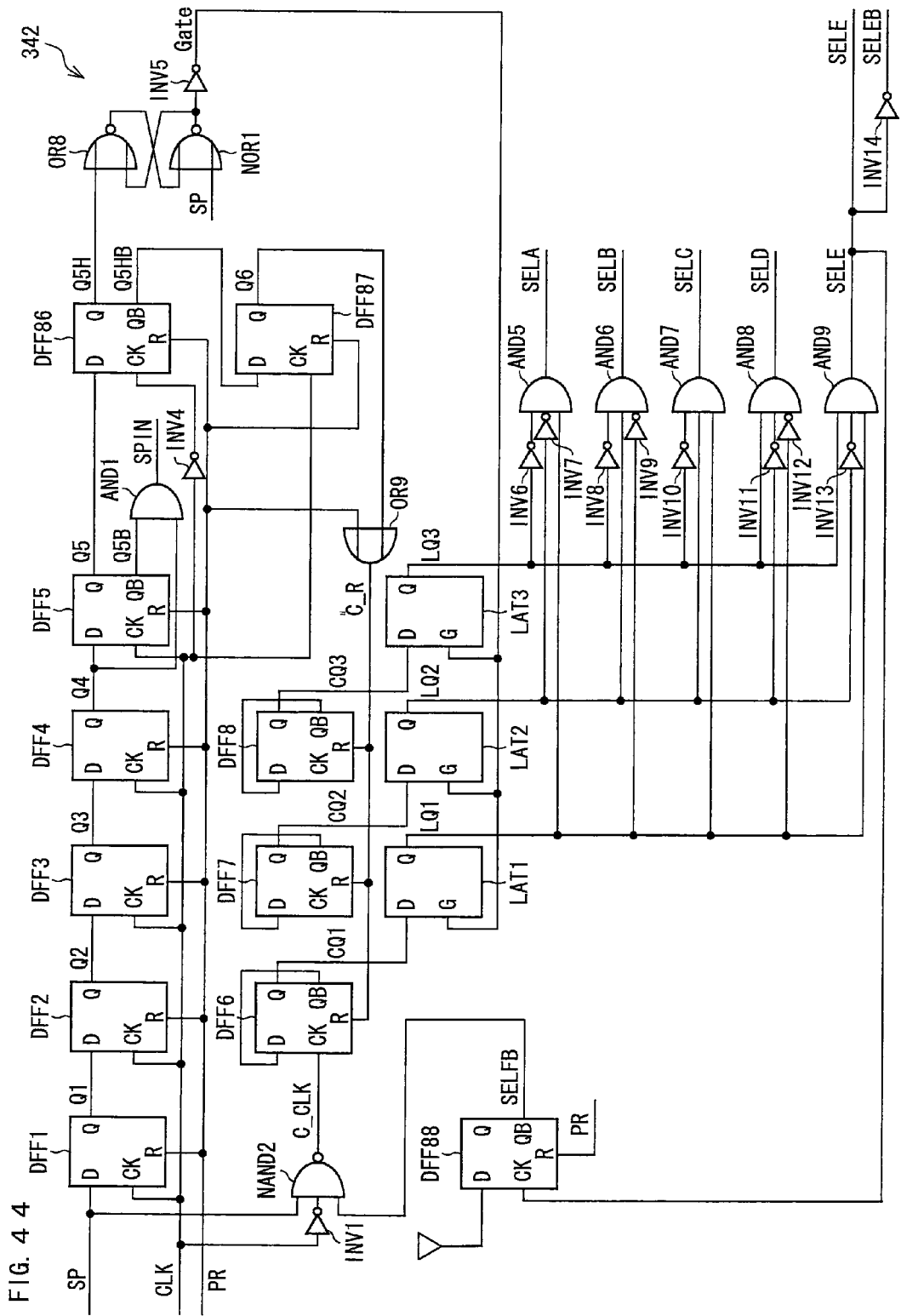
FIG. 44 is a circuit diagram depicting a specific configuration of a rise counter circuit in the gate driver.

FIG. 44 is a circuit diagram depicting a specific configuration for the rise counter circuit 342. The rise counter circuit 342 includes eleven D-type flip-flop circuits (DFF1 to 8, 86 to 88), three latch circuits (LAT1 to 3), nine AND gates (AND1 to 9), a NAND gate (NAND2), an OR gate (OR9), a NOR gate (NOR1), and twelve inverters (INV1, 4 to 14). DFF1 to DFF5 constitute a 5-stage shift register circuit. The data input terminal of first-stage DFF1 receives the start signal SP. The data output terminal Q of fifth-stage DFF5 is connected to the data input terminal D of DFF86 and outputs a signal Q5. The clock input terminals CK of DFF1 to 5 receive the operating clock CLK. The clock input terminal CK of DFF86 receives the operating clock CLK via INV4. The data output terminal Q of DFF4 is connected to the data input terminal D of DFF5 and also to the input terminal of AND1. The inverted data output terminal QB of DFF5 is also connected to the input terminal of AND1. AND1 outputs a signal SPIN to the scan sequence setup circuit 43.

The data output terminal Q of DFF86 is connected either one of the input terminals of OR8 and outputs a signal Q5H. The inverted data output terminal QB of DFF86 is connected to the data input terminal D of DFF87 and outputs a signal Q5HB. The output signal of OR8 is fed at either one of the input terminals of NOR1; the start signal SP is input at the other input terminal of NOR1. The output signal of NOR1 is input to the other input signal of OR8 and also to INV5. The signal Gate from INV5 is input to the gate input terminals G of LAT1 to 3.

The operating clock CLK is input to the clock input terminal CK of DFF87. The data output terminal Q of DFF87 is connected to either one of the input terminals of OR9 and outputs a signal Q6. The power-on reset signal PR is input to the other input terminal of OR9. The output terminal of OR9 is connected to the reset terminals R of DFF6 to 8 and outputs a reset signal C_R.

NAND2 has three input terminals each receiving the start signal SP, an inverted clock signal obtained by inverting the operating clock CLK in INV1, and a signal SELFB from the inverted data output terminal QB of DFF88. The output terminal of NAND2 outputs a counter signal C_CLK.

DFF6 to DFF8 constitute a 3-stage counter circuit. The counter signal C_CLK is input at clock input terminal CK of DFF6. The inverted data output terminal QB and the data input terminal D of DFF6 are connected to each other. The data output terminal Q of DFF6 is connected to the clock input terminal CK of DFF7 and the data input terminal D of LAT1 and outputs a signal CQ1.

The inverted data output terminal QB of DFF7 is connected to the data input terminal D of DFF7 and the clock input terminal CK of DFF8. The data output terminal Q of DFF7 is connected to the data input terminal D of LAT2 and outputs a signal CQ2.

The inverted data output terminal QB and the data input terminal D of DFF8 are connected to each other. The data output terminal Q of DFF7 is connected to the data input terminal D of LAT3 and outputs a signal CQ3.

The data output terminal Q of LAT1 outputs a signal LQ1. The data output terminal Q of LAT1 is connected to the input terminals of AND5, AND7, and AND9 and also connected to the input terminal of AND6 via INV9 and the input terminal of AND8 via INV12.

The data output terminal Q of LAT2 outputs a signal LQ2. The data output terminal Q of LAT2 is connected to the input terminals of AND6 and AND7 and also connected to the input terminal of AND5 via INV7, the input terminal of AND8 via INV11, and the input terminal of AND9 via INV13.

The data output terminal Q of LAT3 outputs a signal LQ3. The data output terminal Q of LAT3 is connected to the input terminals of AND8 and AND9 and also connected to the input terminal of AND5 via INV6, the input terminal of AND6 via INV8, and the input terminal of AND7 via INV10.

AND5 to 9 outputs the signals SELA, SELB, SELC, and SELD, and SELE respectively. The signals SELA, SELB, SELC, and SELD are input to the scan sequence setup circuit 43. The signal SELE is fed at the clock input terminal CK of DFF88 and also to the start signal generating circuit 344 and the drive mode selecting circuit 347 shown in FIG. 43. The signal SELE is inverted by INV14 to produce the signal SELEB which is then input to the drive mode selecting circuit 347.

The data input terminal D of DFF88 is connected to a power supply for the gate driver 34 and receives a HIGH level signal. The power-on reset signal PR is input at reset terminal R of DFF88. As mentioned earlier, the signal SELFB is output at the inverted data output terminal QB of DFF88, and the signal SELFB is input to INV1. The power-on reset signal PR is input also at the reset terminals R of all the other DFF1 to 5, 86, and 87.

Next, specific timings for inter-circuit signals in the rise counter circuit 342 will be described in reference to FIGS. 45 to 50. Cases where the operating clock CLK rises once to 4 times in a HIGH level period of the start signal SP will be first described in reference to FIGS. 45 to 48.

Figure 45:
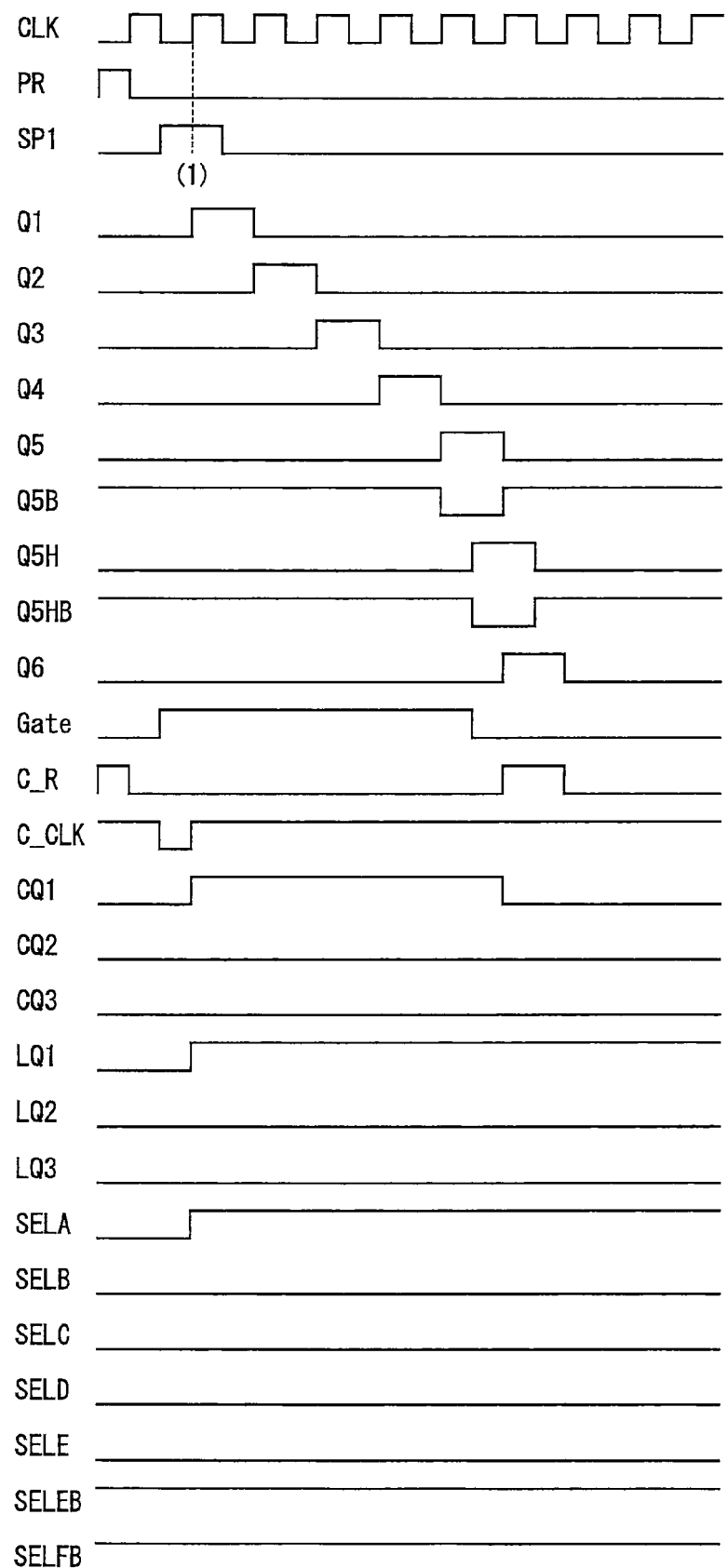
FIG. 45 is a timing chart showing the waveforms of an operating clock, a start signal, etc. in the rise counter circuit in the first-stage gate driver shown in FIG. 41.

FIG. 45 is a timing chart showing the waveforms of signals in the rise counter circuit 342 in the first-stage gate driver 34a shown in FIG. 41. Upon power on, the start signal SP is input at the terminal SP1, turning HIGH the power-on reset signal PR from the power-on reset circuit 346. Accordingly, all DFF1 to 8, 86 to 88 are reset, preventing the counter of DFF6 to 8 from continuously counting starting with the final value obtained upon turning off the power supply in the last use.

Since the operating clock CLK rises once in a HIGH level period of the start signal SP, the counter signal C_CLK from NAND2 rises once. Accordingly, the counter circuit constituted by DFF6 to DFF8 operates once.

The start signal SP is also input to NOR1, turning the signal Gate from INV5 HIGH. The input signal is passed on by LAT1 to 3. Accordingly, the count on the counter of DFF6 to 8 is latched, and the states of SELA to SELE are maintained. Therefore, also among LAT1 to 3, only LAT1 operates, which turns only the signal SELA from AND5 HIGH. Hence, the scan signal output circuit 41 performs the interlaced driving shown in (a) of FIG. 5.

One clock cycle after the start-signal-SP-acquiring period (4 clock cycles), the signal Gate goes LOW, isolating inputs for LAT1 to 3. Half a cycle after that, the reset signal C_R goes HIGH, resetting the counter of DFF6 to 8. Accordingly, when a screen is completely scanned, and a next start signal SP is input, the counter counts starting with the reset value, not continuously with the final value obtained in the last counting.

Figure 46:
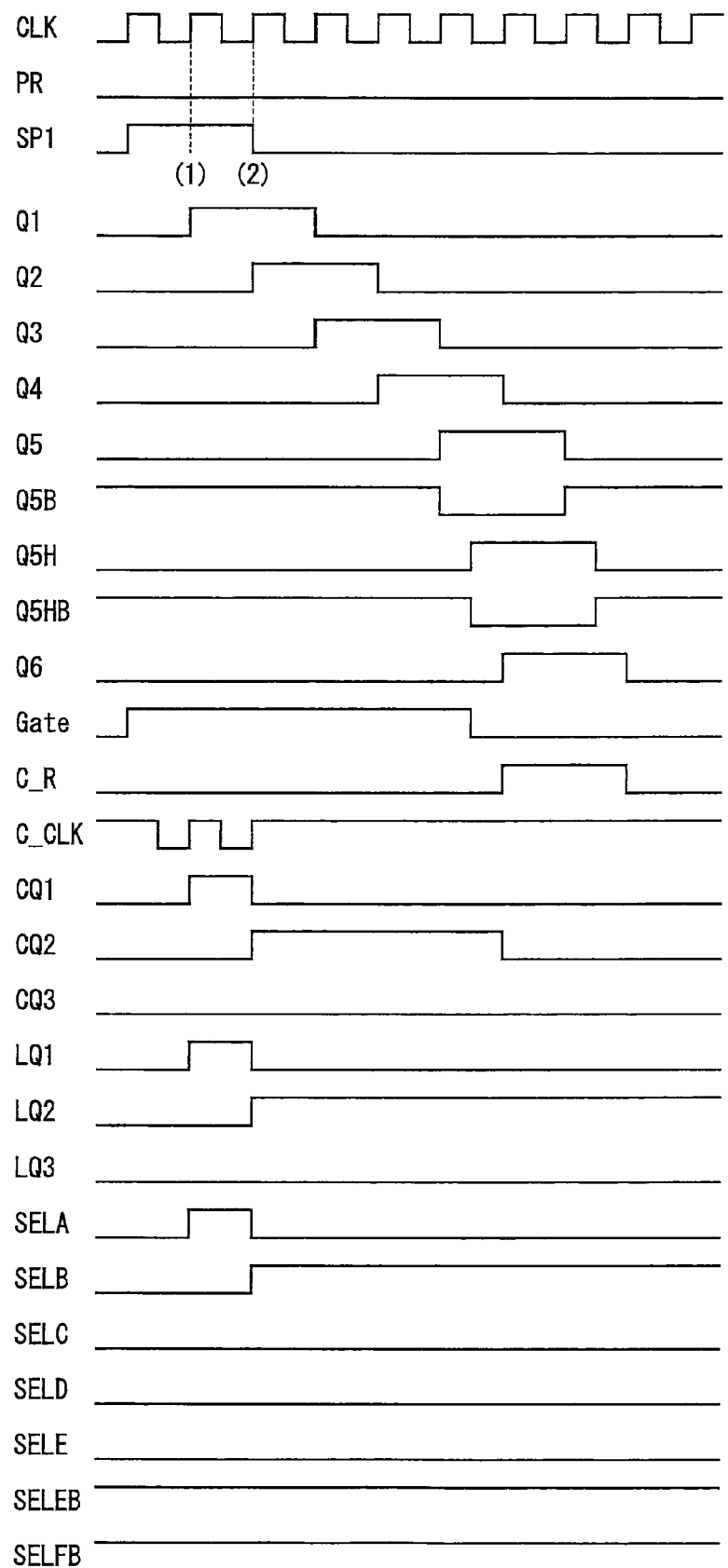
FIG. 46 is a timing chart showing the waveforms of an operating clock, a start signal, etc. in the rise counter circuit in the second-stage gate driver shown in FIG. 41.

FIG. 46 is a timing chart for signals in the rise counter circuit 342 in the second-stage gate driver 34b shown in FIG. 41. Since the operating clock CLK rises twice in a HIGH level period of the start signal SP, the counter signal C_CLK from NAND2 rises twice. Accordingly, the counter circuit constituted by DFF6 to DFF8 operates twice. Therefore, after the start-signal-SP-acquiring period (4 clock cycles), only the signal SELB from AND6 goes HIGH. Hence, the scan signal output circuit 41 performs the interlaced driving shown in (a) of FIG. 6.

Figure 47:
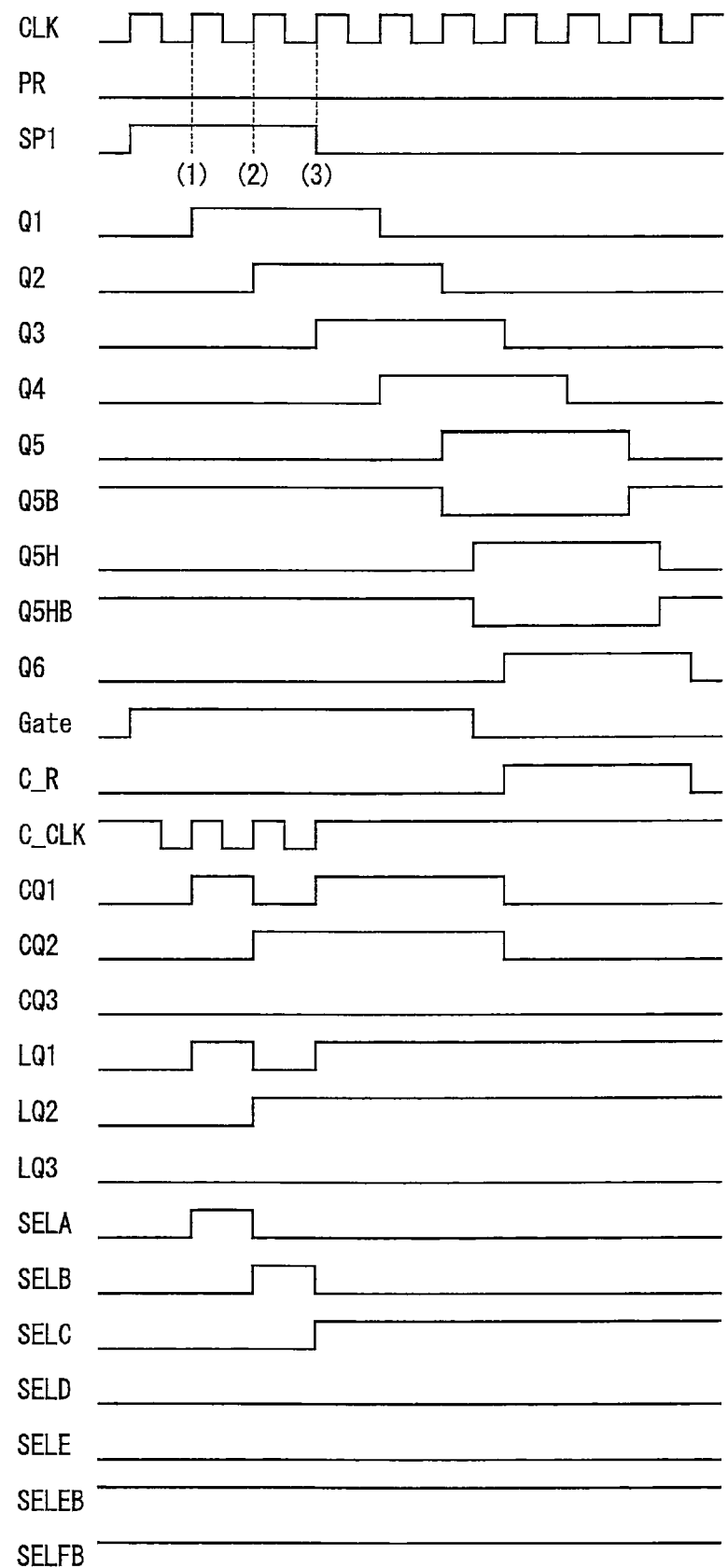
FIG. 47 is a timing chart showing the waveforms of an operating clock, a start signal, etc. in the rise counter circuit in the third-stage gate driver shown in FIG. 41.

FIG. 47 is a timing chart for signals in the rise counter circuit 342 in the third-stage gate driver 34c shown in FIG. 41. Since the operating clock CLK rises 3 times in a HIGH level period of the start signal SP, the counter signal C_CLK from NAND2 rises 3 times. Accordingly, the counter circuit constituted by DFF6 to DFF8 operates 3 times. Therefore, after the start-signal-SP-acquiring period, only the signal SELC from AND7 goes HIGH. Hence, the scan signal output circuit 41 performs the interlaced driving shown in (b) of FIG. 5.

Figure 48:
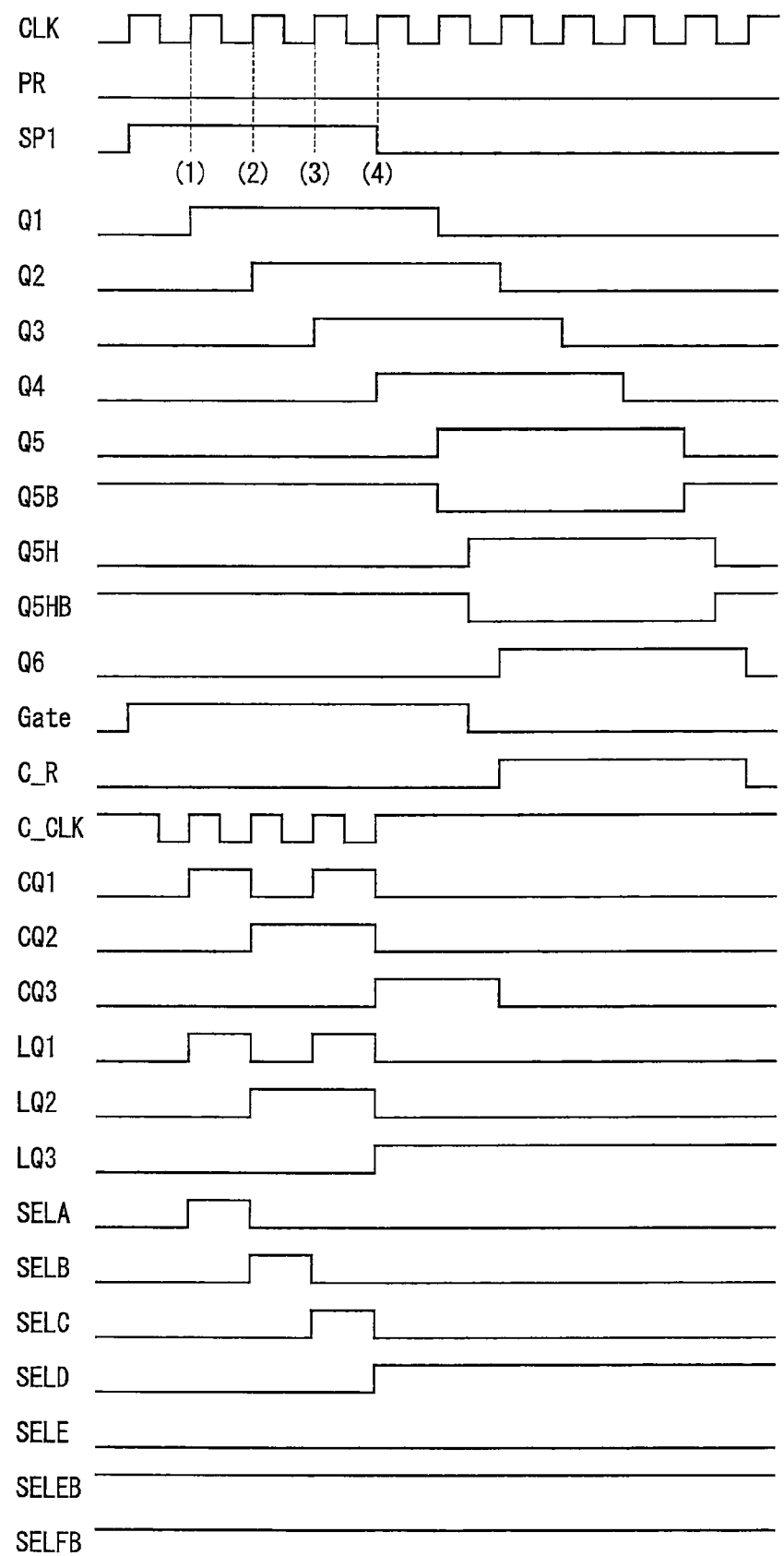
FIG. 48 is a timing chart showing the waveforms of an operating clock, a start signal, etc. in the rise counter circuit in the fourth-stage gate driver shown in FIG. 41.

FIG. 48 is a timing chart for signals in the rise counter circuit 342 in the fourth-stage gate driver 34d shown in FIG. 41. Since the operating clock CLK rises 4 times in a HIGH level period of the start signal SP, the counter signal C_CLK from NAND2 rises 4 times. Accordingly, the counter circuit constituted by DFF6 to DFF8 operates 4 times. Therefore, after the start-signal-SP-acquiring period, only the signal SELD from AND8 goes HIGH. Hence, the scan signal output circuit 41 performs the interlaced driving shown in (b) of FIG. 6.

As described in the foregoing, if the rise count for the operating clock CLK in a HIGH level period of the start signal SP is 1 to 4, the scan signal output circuit 41 performs interlaced driving similar to the interlaced driving described in FIGS. 5 and 6. Next, cases where the operating clock CLK rises 5 times or more frequently in a HIGH level period of the start signal SP will be described in reference to FIGS. 49 and 50.

Figure 49:
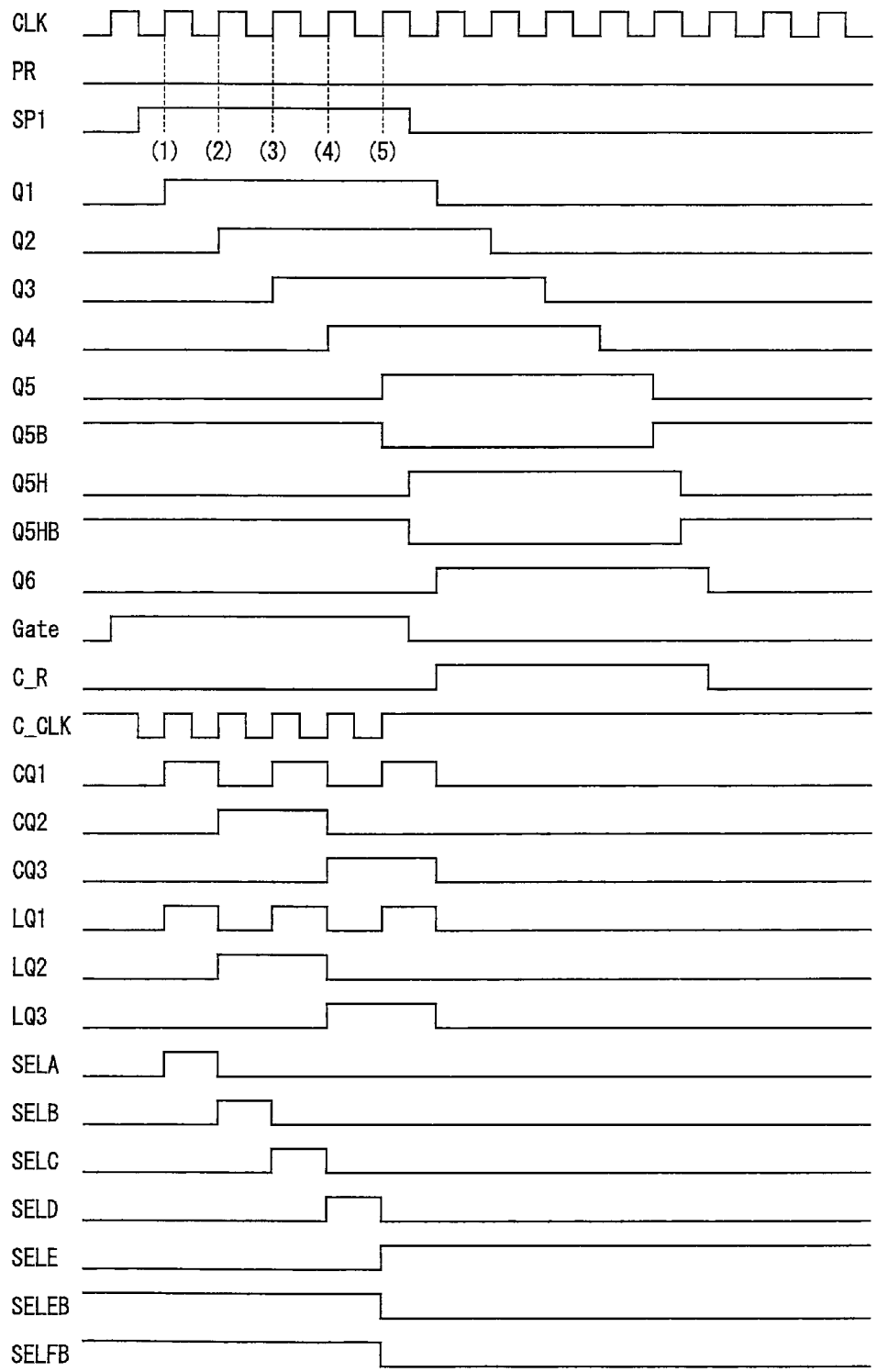
FIG. 49 is a timing chart showing the waveforms of an operating clock, a start signal, etc. in the rise counter circuit if the gate driver is fed with such a start signal that the operating clock CLK rises 5 times in a HIGH level period of the start signal.

FIG. 49 is a timing chart showing the waveforms of signals in the rise counter circuit 342 in a case where a start signal SP in a HIGH level period of which the operating clock CLK rises 5 times is input to the gate driver 34. Since the operating clock CLK rises 5 times in a HIGH level period of the start signal SP, the counter signal C_CLK from NAND2 rises 5 times. Accordingly, the counter circuit constituted by DFF6 to DFF8 operates 5 times. Therefore, after the start signal SP goes HIGH, only the signal SELE from AND9 goes HIGH when the operating clock CLK has risen 5 times. Simultaneously with the signal SELE going HIGH, the signal SELFB from the inverted data output terminal QB of DFF88 goes LOW. Since the counter signal C_CLK remains HIGH, the counter of DFF6 to 8 stops. Accordingly, the signal SELE remains HIGH, and the signal SELEB remains LOW.

Figure 50:
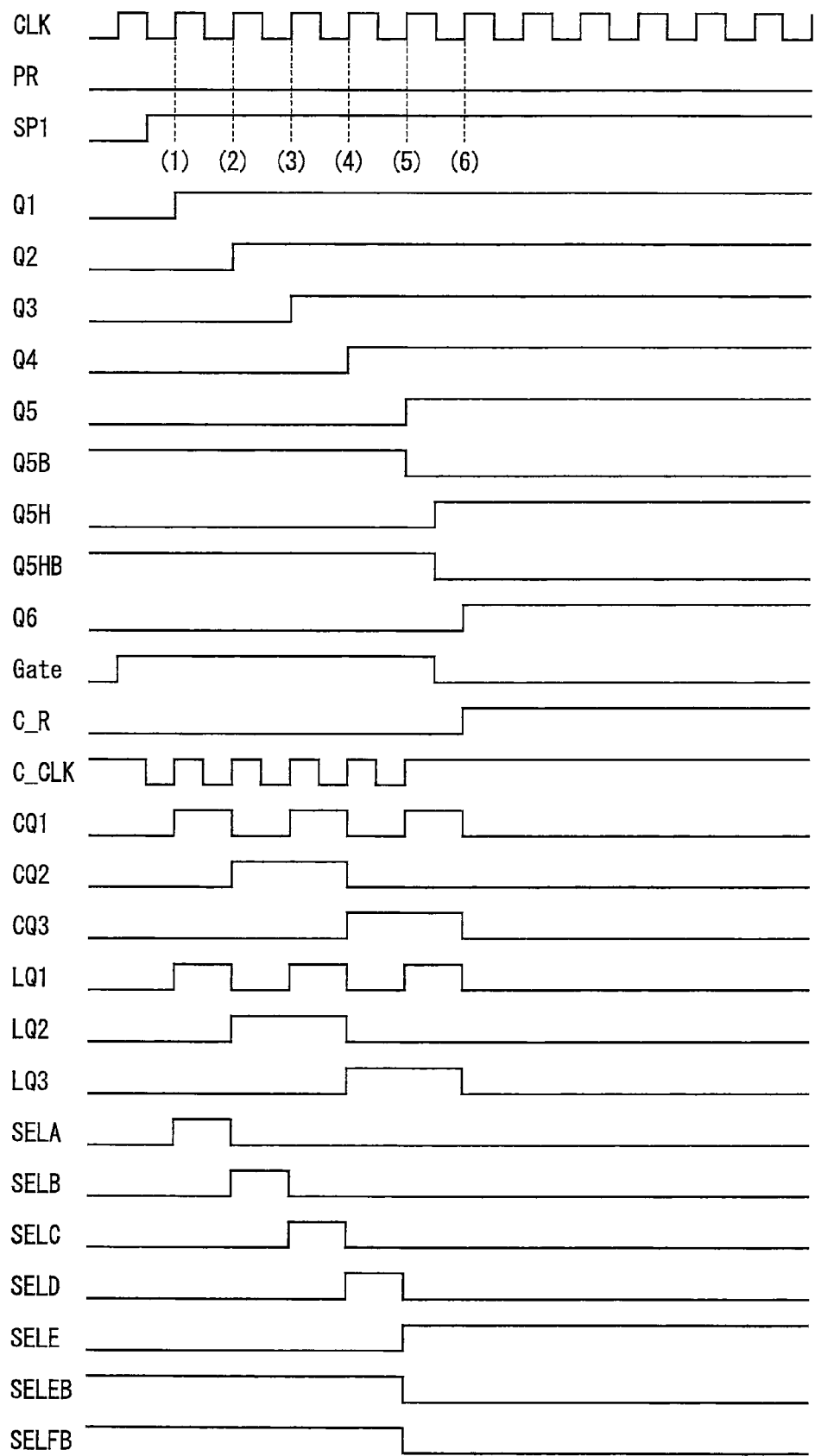
FIG. 50 is a timing chart showing the waveforms of an operating clock, a start signal, etc. in the rise counter circuit if the gate driver is fed with such a start signal that the operating clock CLK rises 6 times or more frequently in a HIGH level period of the start signal.

FIG. 50 is a timing chart showing the waveforms of signals in the rise counter circuit 342 in a case where a start signal SP in a HIGH level period of which the operating clock CLK rises 6 times or more frequently is input to the gate driver 34. Again in this case, similarly to the timing chart shown in FIG. 49, the start signal SP goes HIGH, and then the operating clock CLK rises 5 times. From that time onwards, the signal SELE is HIGH, and the signal SELEB is LOW. The start signal SP is remaining HIGH when it is input to INV1. Since the LOW signal SELFB is also input to INV1, however, the counter signal C_CLK remains HIGH. Therefore, the counter of DFF6 to 8 does not operate. The signal SELE remains selected (unchanged).

The above configuration of the rise counter circuit 342 and the outputting of the signal SELE and the signal SELEB to the drive mode selecting circuit 347 allows the drive mode selecting circuit 347 to select the first drive mode when the operating clock CLK rises once to 4 times in a HIGH level period of the start signal SP and to select the second drive mode when the operating clock CLK rises 5 times or more frequently in a HIGH level period of the start signal SP. Next will be described a specific configuration for the drive mode selecting circuit 347.

Figure 51:
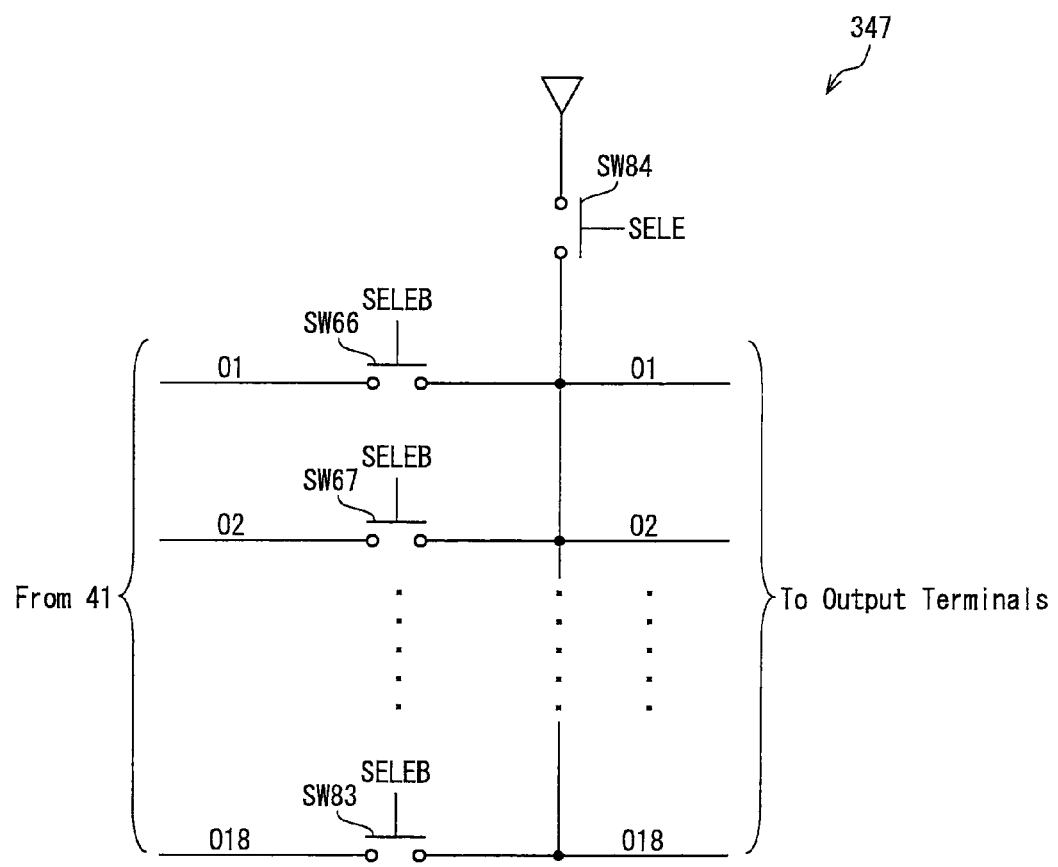
FIG. 51 is a circuit diagram depicting a specific configuration of a drive mode selecting circuit in the gate driver.

FIG. 51 is a circuit diagram depicting a configuration for the drive mode selecting circuit 347. The drive mode selecting circuit 347, provided between the scan signal output circuit 41 and the output terminals of the gate driver 34, includes 19 switches (SW66 to 85). SW66 to 83 are disposed on respective lines connecting the scan signal output circuit 41 to the output terminals O1 to O18. Furthermore, a line connected to the power supply for the gate driver 34 is connected between SW66 to 83 and the output terminals O1 to O18. SW84 is provided between the power supply and the connections. The signal SELEB is input at the gates of SW66 to 83, and the signal SELE is input at the gate of SW84.

If the operating clock CLK rises once to 4 times in a HIGH level period of the start signal SP, the signal SELE remains LOW, and the signal SELEB remains HIGH as illustrated in FIGS. 45 to 48. Accordingly, SW66 to 83 turn on, and SW84 turns off in the drive mode selecting circuit 347 shown in FIG. 51. Therefore, the drive mode selecting circuit 347 outputs the output signal from the scan signal output circuit 41 to the scan signal lines without making any changes to the signal, thereby selecting the first drive mode.

Meanwhile, if the operating clock CLK rises 5 times or more frequently in a HIGH level period of the start signal SP, the start signal SP goes HIGH, and then the operating clock CLK rises 5 times as illustrated in FIGS. 49 and 50. From that time onwards, the signal SELE is HIGH, and the signal SELEB is LOW. Accordingly, SW66 to 83 in the drive mode selecting circuit 347 all turn off, and SW84 turns on. Therefore, the drive mode selecting circuit 347 blocks the output signal of the scan signal output circuit 41 and outputs a signal for driving the all the scan signal lines connected to the gate driver 34, thereby selecting the second drive mode.

When the second drive mode is selected, the power supply for the display device turns off. Therefore, in the drive mode selecting circuit 347, the power supply connected to SW84 also turns off after a predetermined period of time. Therefore, the scan signal lines driven simultaneously also turn off after a predetermined period of time. That prevents wasting electric power.

In place of the drive mode selecting circuit 347, a setting function may be added to the DFF10 to 27 in the shift register constituting the scan signal output circuit 41 shown in FIG. 13, so that when the signal SELE goes HIGH, the outputs of DFF10 to 27 are turned HIGH.

Next, a configuration for generating a start signal to be output to the cascaded succeeding-stage gate driver will be described.

Figure 52:
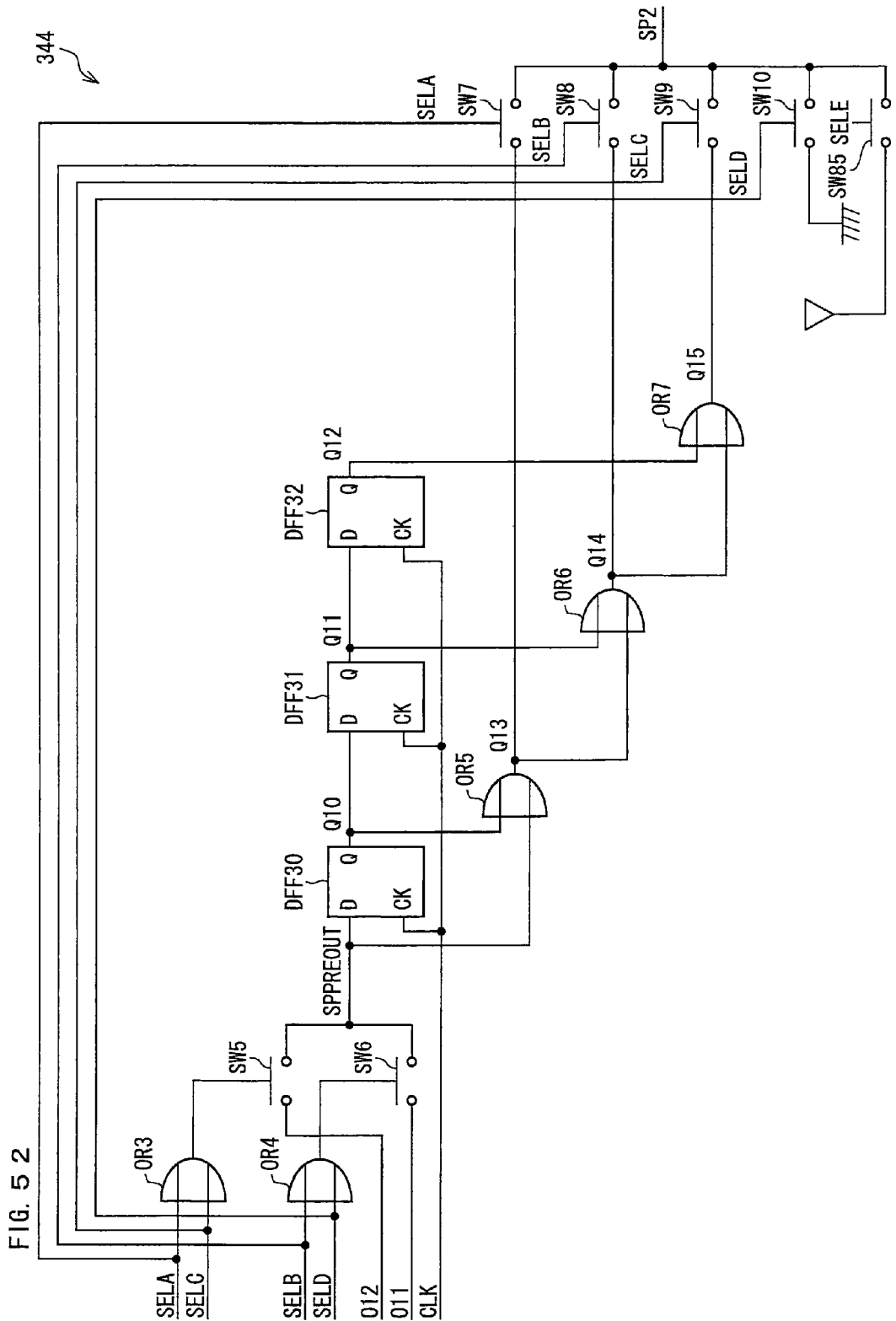
FIG. 52 is a circuit diagram depicting a specific configuration of a start signal generating circuit in the gate driver.

FIG. 52 is a circuit diagram depicting a configuration for the start signal generating circuit 344. The start signal generating circuit 344 is a variation of the start signal generating circuit 44 shown in FIG. 15: there is provided another switch SW85. SW85 is disposed between the output terminal SP2 of the succeeding-stage gate driver 34 and the power supply for the gate driver 34. The signal SELE is input at the gate of SW85.

If the operating clock CLK rises once to 4 times in a HIGH level period of the start signal SP, the signal SELE remains LOW as illustrated in FIGS. 45 to 48. Therefore, in the start signal generating circuit 344, SW85 always turns off, and the start signal SP2 output to the succeeding-stage gate driver 34 is a HIGH pulse with a 2 to 4 clock cycle HIGH width or a LOW pulse, similarly to the gate driver 4 of embodiment 1. Hence, the non-first-stage gate drivers 34b, 34c, and 34d shown in FIG. 41 perform interlaced driving similar to the interlaced driving by the gate drivers 4b, 4c, and 4d described in FIG. 4.

Meanwhile, if the operating clock CLK rises 5 times or more frequently in a HIGH level period of the start signal SP, the start signal SP goes HIGH, and then the operating clock CLK rises 5 times as illustrated in FIGS. 49 and 50. From that time onwards, the signal SELE is HIGH, and the signals SELA, SELB, SELC, and SELD are all LOW. Therefore, the start signal SP2 to the succeeding-stage gate driver 34 is a HIGH pulse with a 5 clock period or longer width as illustrated in FIG. 42. Therefore, when the gate drivers 34 are cascaded, each of the non-first-stage gate drivers also performs the interlaced driving shown in FIG. 50, outputting a signal for driving all the scan signal lines connected to that gate driver.

For example, when four gate drivers 34 are cascaded as illustrated in FIG. 41, all the scan signal lines 1 to 72 are driven in the first-stage gate driver 34a 20 clock cycles after the first rise of the operating clock CLK following the start signal SP going HIGH.

As described in the foregoing, if the drive mode selecting circuit has selected the second drive mode, the gate driver 34 in accordance with the present embodiment can quickly removed the electric charge remaining in the liquid crystal pixels by driving all the scan signal lines. Furthermore, the gate driver 34 needs no terminal or wiring by means of which a signal communicating the timing when all the scan signal lines are driven is fed. The afterimage produced when the power supply is turned off can be erased quickly and at low cost.

In the present embodiment, the first drive mode in which a start signal SP in a HIGH level period of which the operating clock CLK rises once to 4 times is fed to the gate drivers 34 is designed to implement interlaced driving similar to the interlaced driving by the gate drivers 4 of embodiment 1. The embodiment is by no means limited to this example. The first drive mode may be designed to implement interlaced driving similar to the interlaced driving by the gate drivers 14, 24 of embodiments 2, 3 and alternatively to, for example, implement interlaced driving similar to conventional interlaced driving where adjacent scan signal lines are sequentially driven.

SUMMARY OF EMBODIMENTS

The present invention is not limited to the description of the embodiments above, but may be altered by a skilled person within the scope of the claims. An embodiment based on a proper combination of technical means disclosed in different embodiments is encompassed in the technical scope of the present invention.

For example, in each embodiment, the rise counter circuit senses the rise count for the operating clock in a HIGH level period of the incoming start signal SP. This is not the only possibility; alternatively, the fall count for the operating clock in a HIGH level period of the start signal SP may be sensed. A further alternative is to sense either the rise count or the fall count for the operating clock in a LOW level period of the start signal SP. In either case, the scan sequence setup circuit may decide a scan sequence for the scan signal output circuit according to the rise count or falls sensed in embodiments 1 to 3, whilst in embodiment 4, the drive mode selecting circuit may select either the first drive mode or the second drive mode. In addition, the gate drivers start scanning as the start signal changes from LOW to HIGH. Conversely, the gate drivers may start scanning as the start signal changes from HIGH to LOW.

All the inventions set forth in the claims share an identical special technological feature of deciding how to drive scan signal lines according to the rise count (or falls) of the operating clock in a HIGH level period of the start signal. Therefore, the present application meets the unity of invention requirement.

INDUSTRIAL APPLICABILITY

The gate driver in accordance with the present invention is suited for application in liquid crystal panels and like displays.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

The invention claimed is:

1. A scan signal line driver circuit driving scan signal lines of a display screen according to an externally supplied start signal and an externally supplied clock signal, said scan signal line driver circuit comprising:
    a clock pulse counter circuit for sensing, as a first count, either a rise count or a fall count for the clock signal in a HIGH level period of the externally supplied start signal; and
    a drive mode selecting circuit configured to select a first drive mode in which the scan signal lines are driven in a predetermined sequence if the first count is within a first number of clock cycles and a second drive mode in which the scan signal lines are all simultaneously driven if the first count is not within the first number of clock cycles.

2. The scan signal line driver circuit as set forth in claim 1, wherein:
    said scan signal line driver circuit is cascaded to another scan signal line driver circuit and further comprises a start signal generating circuit for generating a start signal to be supplied to a next scan signal line driver circuit according to the first count; and
    when the drive mode selecting circuit selects the second drive mode, a second count which is either the rise count or the fall count for the clock signal in a HIGH level period of the start signal generated by the start signal generating circuit is a count according to which the drive mode selecting circuit selects the second drive mode.

3. The scan signal line driver circuit as set forth in claim 1, further comprising a power-on reset circuit for sensing a startup of a power supply and generating a power-on reset signal,
wherein:
    the clock pulse counter circuit includes a counter for counting either the rise count or the fall count for the clock signal; and
    when the power supply is turned on, the counter is reset in response to the power-on reset signal.

4. A display device, comprising the scan signal line driver circuit as set forth in claim 1.

5. A method of driving a display device including a scan signal line driver circuit, said method comprising:
    the rise counting step of sensing, as a first count, either a rise count or a fall count for a clock signal supplied to the scan signal line driver circuit in a HIGH level period of a start signal supplied to the scan signal line driver circuit; and
    the drive mode selecting step of selecting, first drive mode in which scan signal lines of a display screen are driven in a predetermined sequence if the first count is within a first number of clock cycles and a second drive mode in which the scan signal lines are all simultaneously driven if the first count is not within the first number of clock cycles.

6. The method as set forth in claim 5, wherein:
the scan signal line driver circuit is cascaded to another scan signal line driver circuit;
said method further comprises the start signal generating step of generating a start signal to be supplied to a next scan signal line driver circuit according to the first count; and
when the drive mode selecting step selects the second drive mode, a second count which is either the rise count or the fall count for the clock signal in a HIGH level period of the start signal generated in the start signal generating step is a count according to which the drive mode selecting step selects the second drive mode.

* * * * *